US012757446B2

(12) United States Patent
Watakabe et al.

(10) Patent No.: US 12,757,446 B2
(45) Date of Patent: Oct. 6, 2026

(54) SEMICONDUCTOR DEVICE

(71) Applicants: Japan Display Inc., Tokyo (JP); IDEMITSU KOSAN CO., LTD., Tokyo (JP)

(72) Inventors: Hajime Watakabe, Tokyo (JP); Masashi Tsubuku, Tokyo (JP); Toshinari Sasaki, Tokyo (JP); Takaya Tamaru, Tokyo (JP)

(73) Assignees: JAPAN DISPLAY INC., Tokyo (JP); IDEMITSU KOSAN CO., LTD., Tokyo (JP)

(*) Notice: Subject to any disclaimer, the term of this patent is extended or adjusted under 35 U.S.C. 154(b) by 426 days.

(21) Appl. No.: 18/346,280

(22) Filed: Jul. 3, 2023

(65) Prior Publication Data

US 2024/0021695 A1 Jan. 18, 2024

(30) Foreign Application Priority Data

Jul. 14, 2022 (JP) ................................ 2022-113518

(51) Int. Cl.
*H01L 29/49* (2006.01)
*H01L 29/40* (2006.01)
(Continued)

(52) U.S. Cl.
CPC ..... *H10D 30/6739* (2025.01); *H10D 30/6755* (2025.01); *H10D 64/01* (2025.01); *H10D 99/00* (2025.01); *H10P 30/202* (2026.01)

(58) Field of Classification Search
CPC .... H10D 30/6739; H10D 30/67; H10D 30/40; H10D 30/60; H10D 30/601;
(Continued)

(56) References Cited

U.S. PATENT DOCUMENTS 9,496,408 B2 * 11/2016 Yamazaki .......... H10D 30/6755
9,728,651 B2 * 8/2017 Yamazaki ......... H01L 21/02565
(Continued)

FOREIGN PATENT DOCUMENTS

JP 2014-099601 A 5/2014
JP 2016-184771 A 10/2016
(Continued)

OTHER PUBLICATIONS

English translation of Korean Office Action issued Jun. 26, 2024, in corresponding Korean Patent Application No. 10-2023-0084029, 7pp.

(Continued)

*Primary Examiner* — Nikolay K Yushin
(74) *Attorney, Agent, or Firm* — XSENSUS LLP

(57) ABSTRACT

A semiconductor device includes a oxide semiconductor layer provided on an insulating surface and having a channel area, a source area and a drain area sandwiching the channel area, a gate electrode opposite the channel area, and a gate insulating layer provided between the oxide semiconductor layer and the gate electrode, wherein the gate electrode is an oxide conductive layer having the same composition as the oxide semiconductor layer, and the oxide conductive layer includes the same impurity element as the source area and the drain area.

8 Claims, 47 Drawing Sheets

(51) Int. Cl.

| | |
|---|---|
| ***H01L 29/66*** | (2006.01) |
| ***H01L 29/786*** | (2006.01) |
| ***H10D 30/67*** | (2025.01) |
| ***H10D 64/01*** | (2025.01) |
| ***H10D 99/00*** | (2025.01) |
| *H10P 30/20* | (2026.01) |

(58) Field of Classification Search

CPC ........... H10D 30/6757; H10D 30/6708; H10D 30/6715; H10D 64/01; H10D 64/513; H10D 64/518; H10D 64/685; H10D 64/66; H10D 99/00; H10D 62/151; H10D 62/13; H10D 62/80; H10D 62/405; H10D 62/40; H10D 86/0221; H10D 86/01; H10D 86/201; H10D 86/423; H01L 21/425; H01L 21/28026; H01L 21/28176; H01L 21/28; H10K 59/1213; H10K 59/123; H10K 59/38; H10K 59/353

See application file for complete search history.

(56) References Cited

U.S. PATENT DOCUMENTS

| | | | | |
|---|---|---|---|---|
| 11,581,427 | B2 * | 2/2023 | Koezuka | H01L 21/383 |
| 2012/0064664 | A1 | 3/2012 | Yamazaki et al. | |
| 2014/0034946 | A1 | 2/2014 | Yamazaki et al. | |
| 2014/0077205 | A1 | 3/2014 | Yamazaki et al. | |
| 2014/0113405 | A1 | 4/2014 | Tsubuku et al. | |
| 2015/0084043 | A1 | 3/2015 | Ishihara et al. | |
| 2016/0293767 | A1 * | 10/2016 | Yamazaki | H10D 30/6755 |
| 2017/0236844 | A1 | 8/2017 | Yamazaki et al. | |
| 2021/0020782 | A1 | 1/2021 | Shima et al. | |
| 2021/0126115 | A1 | 4/2021 | Koezuka et al. | |

FOREIGN PATENT DOCUMENTS

| | | | |
|---|---|---|---|
| JP | 2018-006730 | A | 1/2018 |
| JP | 2021-108405 | A | 7/2021 |
| JP | 2021-141338 | A | 9/2021 |
| JP | 2021-153196 | A | 9/2021 |
| KR | 10-2021-0010333 | A | 1/2021 |
| KR | 10-2021-0027366 | A | 3/2021 |
| WO | 2020003055 | A1 | 1/2020 |

OTHER PUBLICATIONS

English machine translation of Office Action dated Apr. 28, 2026 issued in JP Appl. No. 2022-113518, 4pp.

* cited by examiner

SEMICONDUCTOR DEVICE

CROSS-REFERENCE TO RELATED APPLICATION

This application claims the benefit of priority to Japanese Patent Application No. 2022-113518, filed on Jul. 14, 2022, the entire contents of which are incorporated herein by reference.

FIELD

An embodiment of the present invention relates to a semiconductor device and a manufacturing method of the semiconductor device. In particular, an embodiment of the present invention relates to a semiconductor device in which an oxide semiconductor is used as a channel and a manufacturing method of the semiconductor device.

BACKGROUND

In recent years, instead of amorphous silicon, low-temperature polysilicon, and single-crystal silicon, a semiconductor device in which an oxide semiconductor is used as a channel has been developed (for example, Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). The semiconductor device in which an oxide semiconductor is used as a channel can be formed in a simple structure and low-temperature process, similar to a semiconductor device in which amorphous silicon is used as a channel. The semiconductor device in which an oxide semiconductor is used as a channel is known to have higher mobility than the semiconductor device in which amorphous silicon is used as a channel.

SUMMARY

A semiconductor device according to an embodiment of the present invention includes an oxide semiconductor layer provided on an insulating surface and having a channel area, a source area and a drain area sandwiching the channel area, a gate electrode opposite the channel area, and a gate insulating layer provided between the oxide semiconductor layer and the gate electrode, wherein the gate electrode is an oxide conductive layer having the same composition as the oxide semiconductor layer, and the oxide conductive layer includes the same impurity element as the source area and the drain area.

DESCRIPTION OF EMBODIMENTS

Figure 1:
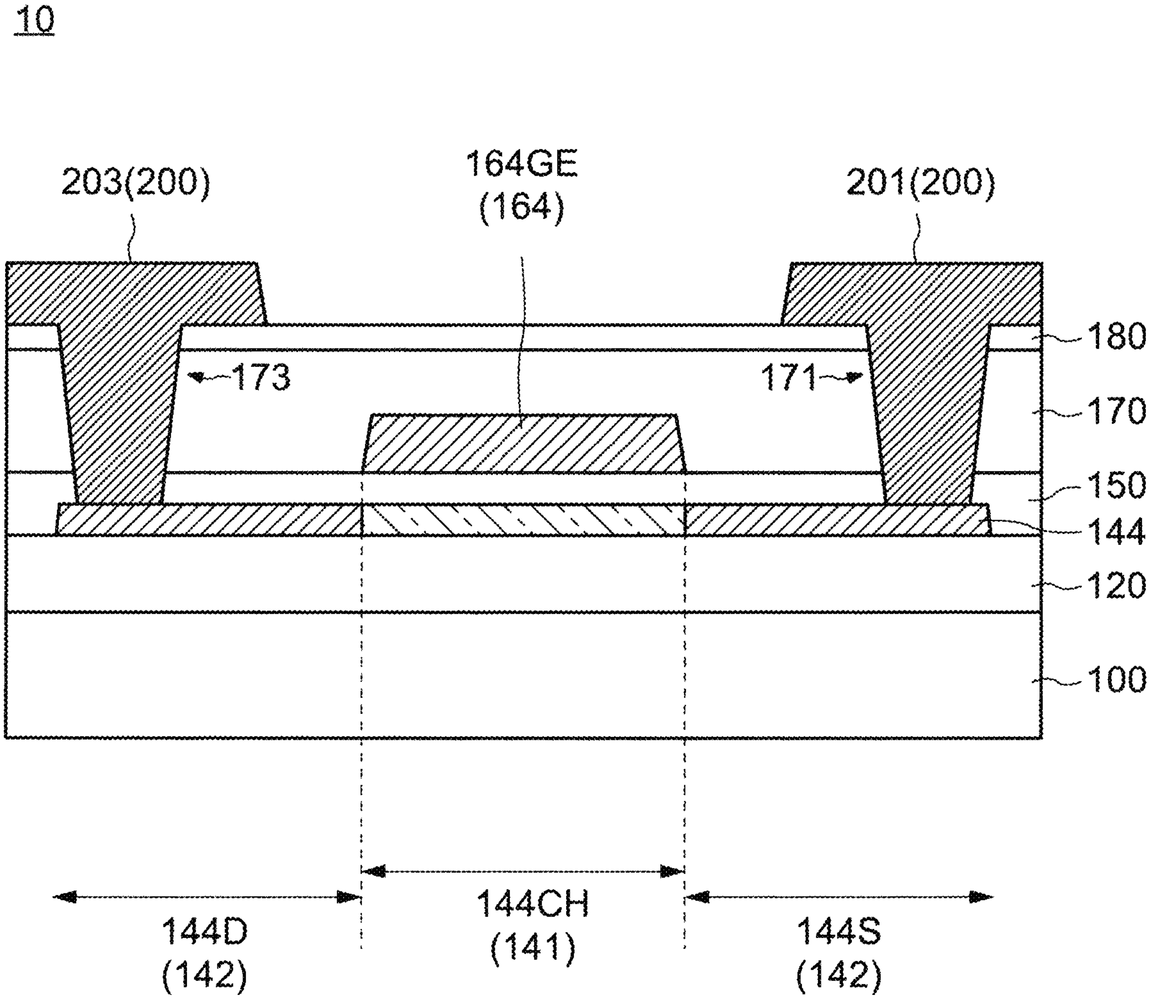
FIG. 1 is a cross-sectional view showing an outline of a semiconductor device according to an embodiment of the present invention.

Hereinafter, embodiments of the present invention will be described with reference to the drawings. The following invention is merely an example. A configuration that can be easily conceived of by a person skilled in the art by appropriately changing the configuration of the embodiment while keeping the gist of the invention is naturally included in the scope of the present invention. For clarity of explanation, the drawings may be schematically represented with respect to widths, thicknesses, shapes, and the like of each portion as compared with actual embodiments. However, the illustrated shapes are merely examples, and do not limit the interpretation of the present invention. In the present specification and the drawings, the same reference signs are given to the same components as those described previously with respect to the above-described drawings, and detailed description thereof may be omitted as appropriate.

"Semiconductor device" refers to any device that can function by utilizing semiconductor properties. A transistor and a semiconductor circuit are one form of a semiconductor device. For example, the semiconductor device shown below may be an integrated circuit (Integrated Circuit: IC) such as a display device or a micro-processing unit (Micro-Processing Unit: MPU), or a transistor used in a memory circuit.

"Display device" refers to a structure that displays an image using an electro-optic layer. For example, the term display device may refer to a display panel including the electro-optic layer, or may refer to a structure with other optical members (for example, a polarized member, a backlight, a touch panel, and the like) attached to a display cell. "Electro-optic layer" may include a liquid crystal layer, an electroluminescent (EL) layer, an electrochromic (EC) layer, and an electrophoretic layer, unless there is a technical inconsistency. Therefore, although embodiments will be described by exemplifying a liquid display device including a liquid crystal layer and an organic EL display device including an organic EL layer as the display device, the configuration in the present embodiment can be applied to a display device including the other electro-optic layers described above.

In each embodiment of the present invention, a direction from a substrate toward an oxide semiconductor layer is referred to as on or above. Conversely, a direction from the oxide semiconductor layer to the substrate is referred to as lower or below. In this way, for convenience of explanation, although the phrase "on" or "under" is used to describe, for example, the upper and lower relationship between the substrate and the oxide semiconductor layer may be arranged differently from the drawings. In the following explanation, for example, the expression "oxide semiconductor layer on substrate" merely describes the upper and lower relationship between the substrate and the oxide semiconductor layer as described above, and another member may be arranged between the substrate and the oxide semiconductor layer. The "upper" or "lower" means a stacking order in a structure in which a plurality of layers is stacked, and may be a positional relationship in which the transistor and a pixel electrode do not overlap each other in a plan view when expressed as a pixel electrode above a transistor. On the other hand, when expressed as a pixel electrode vertically above a transistor, it means a positional relationship in which the transistor and the pixel electrode overlap each other in a plan view.

In the present specification, expressions "a includes A, B, or C," "a includes any of A, B, and C," "a includes one selected from a group consisting of A, B, and C," and the like do not exclude the case where a includes a plurality of combinations of A to C unless otherwise indicated. Furthermore, these expressions do not exclude the case where a includes other elements.

In addition, the following embodiments can be combined with each other as long as there is no technical inconsistency.

Since an oxide semiconductor has light transmittance, if it can be used as a wiring material, it is very advantageous to improve the transmittance of an array substrate (a substrate in which a plurality of semiconductor devices are arranged in an array). However, in the conventional oxide semiconductor, it is difficult to sufficiently reduce resistance, and it is difficult to use as the wiring material.

An object of an embodiment of the present invention is to provide a semiconductor device using an oxide semiconductor as a wiring material.

First Embodiment

A semiconductor device 10 according to an embodiment of the present invention will be described with reference to FIG. 1 to FIG. 13.

Configuration of Semiconductor Device 10

Figure 2:
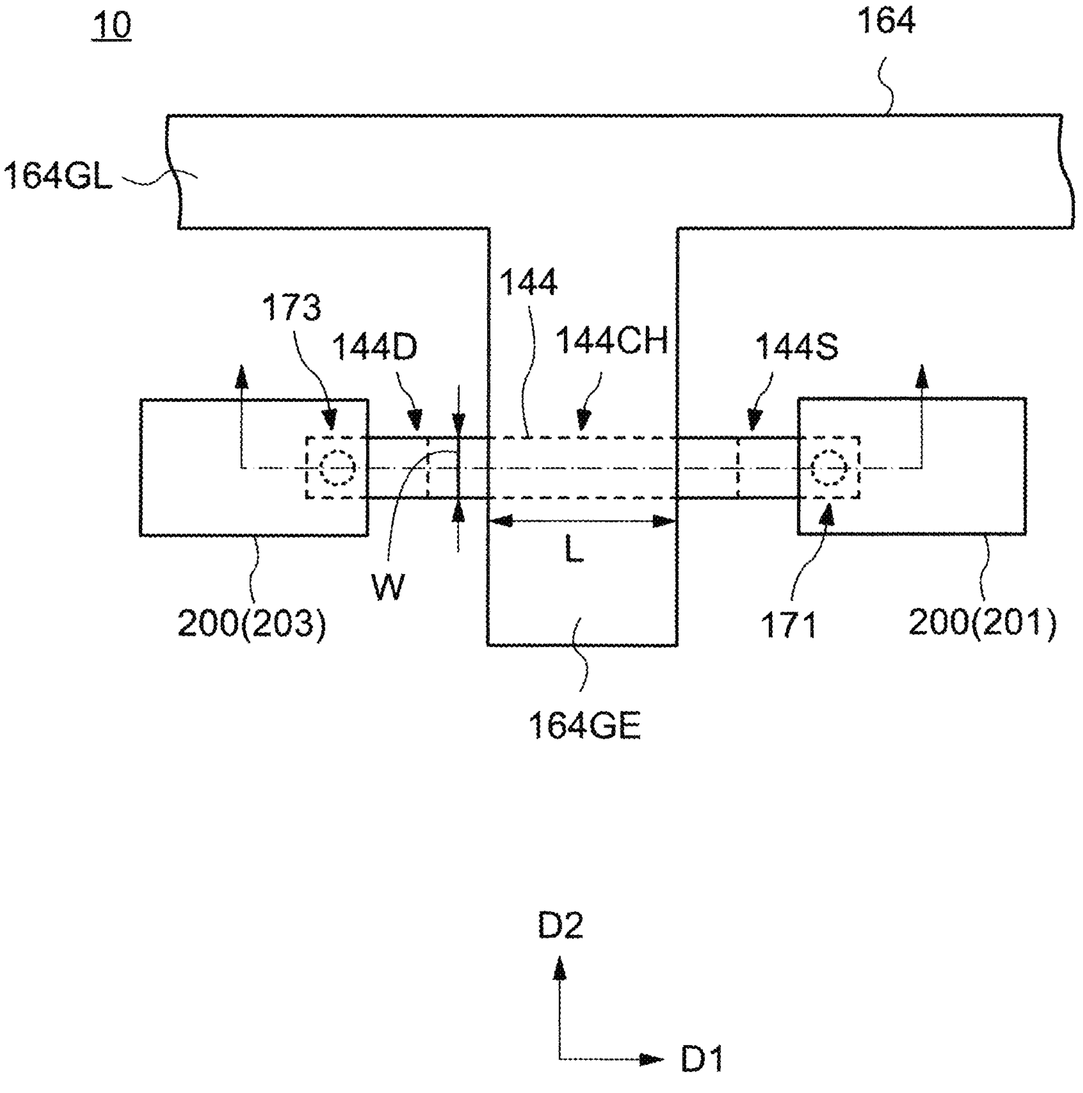
FIG. 2 is a plan view showing an outline of a semiconductor device according to an embodiment of the present invention.

The configuration of the semiconductor device 10 according to an embodiment of the present invention will be described with reference to FIG. 1 and FIG. 2. FIG. 1 is a cross-sectional view schematically showing the semiconductor device 10 according to an embodiment of the present invention. FIG. 2 is a plan view showing an outline of a semiconductor device according to an embodiment of the present invention. In addition, a cross section taken along a dashed-dotted line shown in FIG. 2 corresponds to a cross-sectional view shown in FIG. 1.

As shown in FIG. 1, the semiconductor device 10 is arranged above a substrate 100. The semiconductor device 10 includes a base film 120, an oxide semiconductor layer 144, a gate insulating layer 150, a gate electrode 164GE, insulating layers 170 and 180, a source electrode 201, and a drain electrode 203. When the source electrode 201 and the drain electrode 203 are not particularly distinguished from each other, they may be collectively referred to as a source electrode and a drain electrode 200. In addition, the oxide semiconductor layer 144, the gate insulating layer 150, and the gate electrode 164GE may be referred to as a transistor.

The base film 120 is arranged on the substrate 100. The oxide semiconductor layer 144 is arranged on the base film 120. The oxide semiconductor layer 144 is in contact with the base film 120. Among the main surfaces of the oxide semiconductor layer 144, a surface in contact with the base film 120 is referred to as a lower surface. The base film 120 functions as a barrier film that shields impurities that diffuse from the substrate 100 toward the oxide semiconductor layer 144.

The oxide semiconductor layer 144 has light transmittance. The oxide semiconductor layer 144 is divided into a source area 144S, a drain area 144D, and a channel area 144CH. The channel area 144CH is an area of the oxide semiconductor layer 144 vertically below the gate electrode 164GE. The source area 144S is an area of the oxide semiconductor layer 144 that does not overlap the gate electrode 164GE and that is closer to the source electrode 201 than the channel area 144CH. The drain area 144D is an area of the oxide semiconductor layer 144 that does not overlap the gate electrode 164GE and that is closer to the drain electrode 203 than the channel area 144CH.

The gate electrode 164GE faces the oxide semiconductor layer 144. The gate insulating layer 150 is arranged between the oxide semiconductor layer 144 and the gate electrode 164GE. The gate insulating layer 150 is in contact with the oxide semiconductor layer 144. A surface of the main surface of the oxide semiconductor layer 144, which is in contact with the gate insulating layer 150, is referred to as an upper surface. A surface between the upper and lower surfaces is referred to as a side surface. The insulating layers 170 and 180 are arranged on the gate insulating layer 150 and the gate electrode 164GE. Openings 171 and 173 that reach the oxide semiconductor layer 144 are arranged in the insulating layers 170 and 180. The source electrode 201 is arranged inside the opening 171. The source electrode 201 is in contact with the oxide semiconductor layer 144 at the bottom of the opening 171. The drain electrode 203 is arranged inside the opening 173. The drain electrode 203 is in contact with the oxide semiconductor layer 144 at the bottom of the opening 173.

In the semiconductor device 10 according to an embodiment of the present invention, a surface of the main surface of the gate electrode 164GE with light transmittance, which is in contact with the gate insulating layer 150, is referred to as a lower surface. A surface between the upper and lower surfaces is referred to as a side surface. The gate electrode 164GE is composed of an oxide conductive layer 164 in which an oxide semiconductor layer having the same composition as the oxide semiconductor layer 144 is reduced in resistance. In addition, the same composition includes the case where the same element is present and the proportion of the composition is different.

The oxide semiconductor layer 144 and the gate electrode 164GE have a polycrystalline structure containing a plurality of crystal grains. As will be described later, using a Poly-OS (Poly-crystalline Oxide Semiconductor) technique makes it possible to form the oxide semiconductor layer 144 and the gate electrode 164GE having a polycrystalline structure. Although the configurations of the oxide semiconductor layer 144 and the gate electrode 164GE will be described below, the oxide semiconductor having a polycrystalline structure may be referred to as the Poly-OS.

As will be described in detail later, the oxide semiconductor layer 144 and the gate electrode 164GE include two or more metals including indium, and the proportion of indium in the two or more metals is 50% or more. A gallium (Ga) element, a zinc (Zn) element, an aluminum (Al) element, a hafnium (Hf) element, an yttrium (Y) element, a zirconium (Zr) element, and a lanthanoid are used as a metal element other than the indium element. However, it is sufficient that the oxide semiconductor layer 144 contain the Poly-OS, and may contain metal elements other than the above. The oxide conductive layer constituting the gate electrode 164GE is preferably formed using an oxide semiconductor target having the same composition as the oxide semiconductor layer 144. As a result, the manufacturing cost of the semiconductor device can be reduced.

In addition, the source area 144S, the drain area 144D, and the gate electrode 164GE contain the same impurity element. Further, the source area 144S and the drain area 144D in the oxide semiconductor layer 144 have a lower resistivity as compared with the channel area 144CH due to the addition of the impurity element. That is, the source area 144S and the drain area 144D have physical properties as a conductor.

The concentrations of the impurity element contained in the gate electrode 164GE, the source area 144S, and the drain area 144D are preferably $1\times10^{18}$ $cm^{-3}$ or more and $1\times10^{21}$ $cm^{-3}$ or less when measured by SIMS spectrometry (secondary ion-mass spectrometry). In this case, the impurity element means argon (Ar), phosphorus (P), or boron (B). In addition, in the case where the concentrations of the impurity element contained in the gate electrode 164GE, the source area 144S, and the drain area 144D are $1\times10^{18}$ $cm^{-3}$ or more and $1\times10^{21}$ $cm^{-3}$ or less, it is presumed that the impurity element was intentionally added by an ion-implantation method or a doping method. However, the gate electrode 164GE, the source area 144S, and the drain area 144D may contain an impurity element other than argon (Ar), phosphorus (P), or boron (B) at a concentration of less than $1\times10^{18}$ $cm^{-3}$. In addition, including the impurity element in the channel area 144CH affects the physical properties of the semiconductor device 10. Therefore, the concentration of the impurity element contained in the channel area 144CH is preferably less than $1\times10^{18}$ $cm^{-3}$, and more preferably $1\times10^{16}$ $cm^{-3}$ or less.

The gate electrode 164GE has a function as a top-gate of the semiconductor device 10. The gate insulating layer 150 has a function as a gate insulating layer for the top-gate, and has a function of releasing oxygen by a heat treatment in a manufacturing process. The insulating layers 170 and 180 have a function of insulating the gate electrode 164GE from the source electrode and the drain electrode 200 and reducing the parasitic capacitance therebetween. An operation of the semiconductor device 10 is controlled mainly by a voltage supplied to the gate electrode 164GE.

As shown in FIG. 2, an area of the oxide conductive layer 164 that extends in a first direction D1 functions as a gate wiring. In addition, an area of the oxide conductive layer 164 that overlaps the oxide semiconductor layer 144 functions as the gate electrode 164GE. In this case, the first direction D1 is a direction connecting the source electrode 201 and the drain electrode 203, and indicating a channel length L of the semiconductor device 10. Specifically, a length of an area (the channel area 144CH) where the oxide semiconductor layer 144 and the gate electrode 164GE overlap in the first direction D1 is the channel length L, and a width of the channel area 144CH in a second direction D2 is a channel width W.

Crystalline Structure of Oxide Semiconductor Layer

The oxide semiconductor layer 144 contains the Poly-OS. A particle diameter of the crystal grain contained in the Poly-OS observed from the upper surface of the oxide semiconductor layer 144 (or a thickness direction of the oxide semiconductor layer 144) is 0.1 μm or more, preferably 0.3 μm or more, and more preferably 0.5 μm or more. For example, the particle diameter of the crystal grain can be obtained using a cross-sectional SEM observation, a cross-sectional TEM observation, or an electron back scattered diffraction (Electron Back Scattered Diffraction: EBSD) method.

In the Poly-OS, the plurality of crystal grains may have one type of crystal structure, or may have a plurality of types of crystal structures. The crystal structure of the Poly-OS can be identified using an electron diffraction method, an XRD method, or the like. That is, the crystal structure of the oxide semiconductor layer 144 and the oxide conductive layer 164 can be identified using the electron diffraction method, the XRD method, or the like.

The crystal structure of the oxide semiconductor layer 144 is preferably cubic. The cubic has a high symmetry crystal structure, and even when an oxygen defect is generated in the oxide semiconductor layer 144, structure relaxation is unlikely to occur and the crystal structure is stable. As described above, increasing the proportion of indium elements makes it possible to control the crystal structure of each of the plurality of crystal grains, and the oxide semiconductor layer 144 having a cubic structure can be formed.

The oxide semiconductor layer 144 includes a first area 141 corresponding to the channel area 144CH and a second area 142 corresponding to the source area 144S and the drain area 144D. In the oxide semiconductor layer 144, the first area 141 has a first crystal structure and the second area 142 has a second crystal structure. Although the second area 142 has a higher electrical conductivity than the first area 141, the second crystal structure is identical to the first crystal structure. In this case, the two crystal structures are the same means that the crystal systems are the same. For example, in the case where the crystal structure of the oxide semiconductor layer 144 is cubic, the crystal structure of the first area 141 and the crystal structure of the second area 142 are both cubic and identical. For example, the first crystal structure and the second crystal structure can be identified by using an ultrafine electron beam diffraction method and the like.

In addition, in a predetermined crystal orientation, a plane interval (d-value) of the first crystal structure and a plane interval (d-value) of the second crystal structure are substantially the same. In this case, two plane intervals (d values) are substantially the same means that one plane interval (d value) is 0.95 times or more and 1.05 times or less of the other plane interval (d value). Alternatively, it means the case where two diffraction patterns are almost identical in the ultrafine electron beam diffraction method.

There may be no grain boundaries between the first area 141 and the second area 142. In addition, the first area 141 and the second area 142 may be included in one crystal grain. In other words, the change from the first area 141 to the second area 142 may be a contiguous crystal structural change.

Configuration of Second Area 142

Figure 46A:
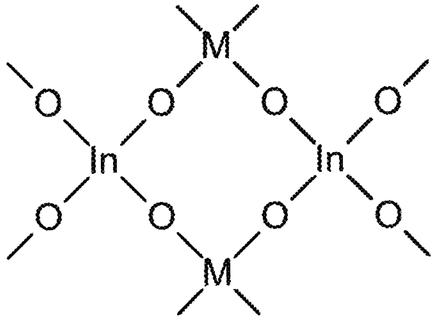
FIG. 46A is a schematic diagram illustrating a bonding state of a Poly-OS included in a source area and a drain area in an oxide semiconductor layer of a semiconductor device according to an embodiment of the present invention.
Figure 46B:
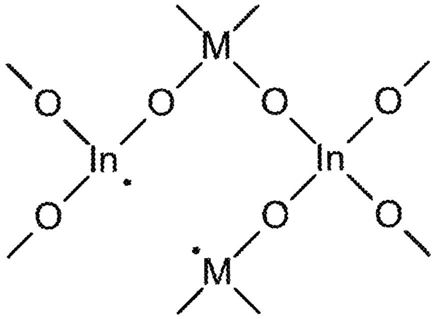
FIG. 46B is a schematic diagram illustrating a bonding state of a Poly-OS included in a source area and a drain area in an oxide semiconductor layer of a semiconductor device according to an embodiment of the present invention.
Figure 46C:
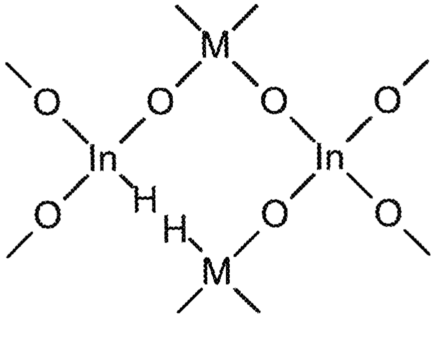
FIG. 46C is a schematic diagram illustrating a bonding state of a Poly-OS included in a source area and a drain area in an oxide semiconductor layer of a semiconductor device according to an embodiment of the present invention.

FIG. 46A to FIG. 46C is a schematic diagram illustrating a bonding state of Poly-OS included in a source area and a drain area in the oxide semiconductor layer 144 of the semiconductor device 10 according to an embodiment of the present invention. FIG. 46A to FIG. 46C show the Poly-OS containing indium atoms (In atoms) and metal atoms (M atoms) different from the In atoms.

In the Poly-OS shown in FIG. 46A, each of the In atom and the M atom is bonded to an oxygen atom (O atom). In the crystal structure of the Poly-OS shown in FIG. 46A, in the second area 142, the bond between the In atom or the M atom and the O atom is broken in order to make the electrical conductivity greater than the first area 141, and an oxygen defect in which the O atom is removed is generated (see FIG. 46B). Since the Poly-OS contains crystal grains with a large crystal particle diameter, long-range order is easily maintained. Therefore, even if the oxygen defect is generated, structural relaxation hardly occurs, and the positions of the In atoms and the M atoms hardly change. In the state shown in FIG. 46B, in the presence of hydrogen, a dangling bond of the In atom and a dangling bond of the M atom in the oxygen defect are bonded to a hydrogen atom (H atom) and stabilized (see FIG. 46C). Since the H atom in the oxygen defect functions as a donor, the carrier concentration in the second area 142 increases.

In addition, as shown in FIG. 46C, in the Poly-OS, even if the H atom is bonded in the oxygen defect, the positions of the In atoms and the M atoms hardly change. Therefore, the second crystal structure of the second area 142 does not change from the crystal structure of the Poly-OS with no oxygen defect. That is, the second crystal structure of the second area 142 is identical to the first crystal structure of the first area 141.

Figure 47:
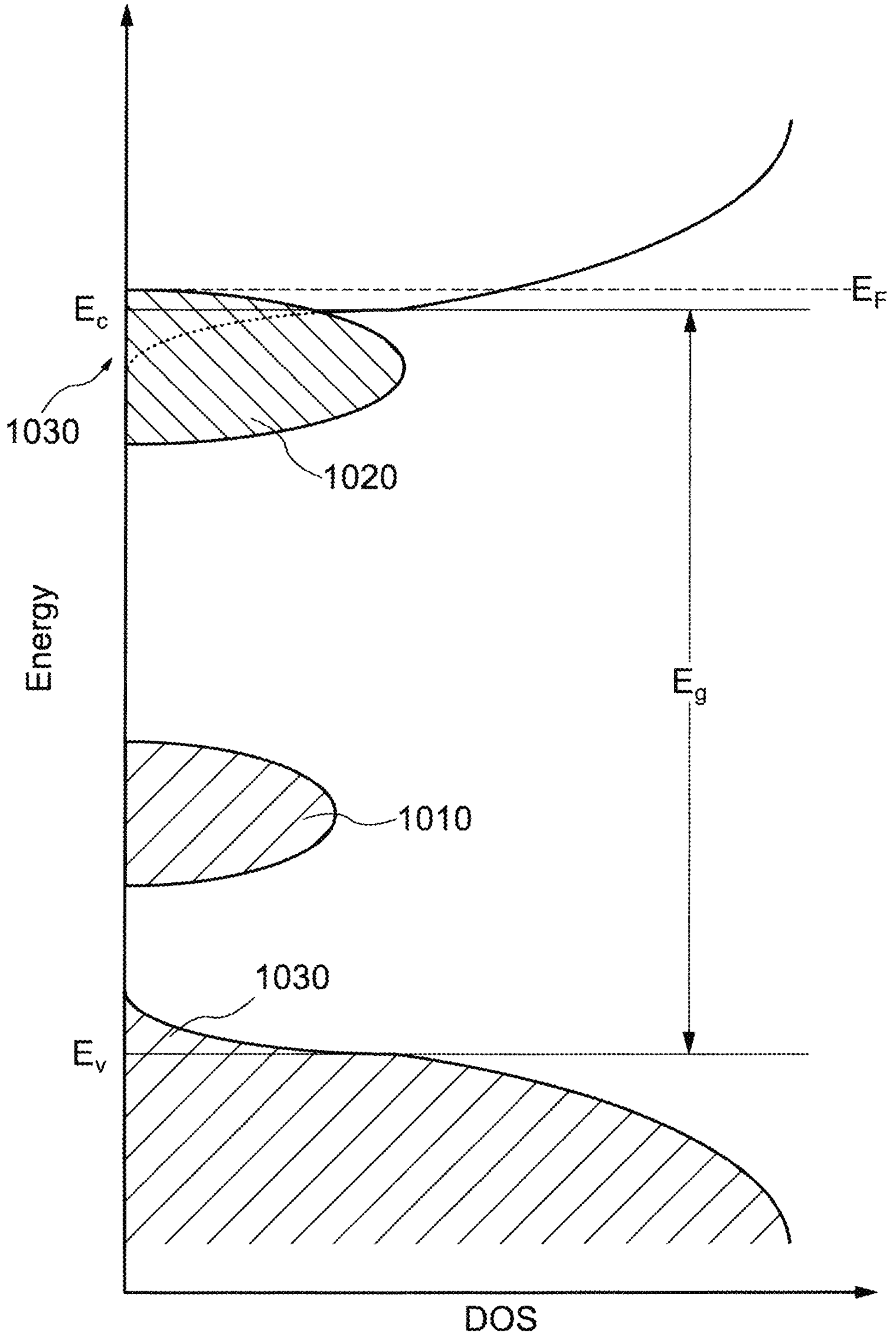
FIG. 47 is a band diagram illustrating a band structure of a source area and a drain area in an oxide semiconductor layer of a semiconductor device according to an embodiment of the present invention.

FIG. 47 is a band diagram illustrating a band structure of the second area 142 of the oxide semiconductor layer 144 of the semiconductor device 10 according to an embodiment of the present invention.

As shown in FIG. 47, the Poly-OS of the second area 142 includes a first energy level 1010 and a second energy level 1020 in a bandgap $E_g$. In addition, a tail level 1030 is included in each of the vicinity of an energy level $E_v$ at an upper end of a valence band and in the vicinity of an energy level $E_c$ at a lower end of a conduction band. The first energy level 1010 is a deep trapped level present in the bandgap E g and is attributed to the oxygen defect. The second energy level 1020 is a donor level present in the vicinity of the lower end of the conduction band and is attributed to hydrogen atoms bonded in the oxygen defect. The tail level 1030 is attributed to a disturbance of long-range order.

Although the Poly-OS in the second area 142 contains the oxygen defect, it has a crystal structure and long-range order is maintained. In addition, in the Poly-OS in the second area 142, the hydrogen atoms can be bonded in the oxygen defect without causing a structural disturbance. Therefore, it is possible to increase the DOS of the second energy level 1020 while suppressing a density of state (Density of State: DOS) of the tail level 1030. Therefore, the DOS of the second energy level 1020 is larger than the DOS of the tail level 1030 in the vicinity of the lower end of the conduction band, and the DOS of the second energy level 1020 can extend beyond the energy level $E_c$ at a lower end of the conduction band. That is, the Fermi level $E_F$ exceeds the energy level $E_c$ at the lower end of the conduction band, and the Poly-OS in the second area 142 has metal properties.

As described above, the Poly-OS in the second area 142 has metal properties, unlike the conventional oxide semiconductor. Therefore, the second area 142 can be made sufficiently low in resistance by generating the oxygen defect. A sheet resistance of the second area 142 is 1000 Ω/sq. or less, preferably 500 Ω/sq. or less, and more preferably 250 Ω/sq.

As described above, the gate electrode 164GE is composed of the oxide conductive layer 164 having the same composition as the oxide semiconductor layer 144. In addition, the oxide conductive layer 164 contains the same impurity element as in the source area 144S and the drain area 144D. Therefore, the oxide conductive layer 164 has the second crystal structure similar to the second area 142. In addition, the oxide conductive layer 164 can have metal properties similar to the second area 142. Therefore, the oxide conductive layer 164 can be made sufficiently low in resistance by generating the oxygen defect. A sheet resistance of the oxide conductive layer 164 is 1000 Ω/sq. or less, preferably 500 Ω/sq. or less, and more preferably 250 Ω/sq.

Therefore, in the semiconductor device 10 according to an embodiment of the present invention, the gate electrode 164GE and the gate wiring may be formed by the oxide conductive layer 164. Forming the gate electrode 164GE and the gate wiring by the oxide conductive layer 164 with light transmittance makes it possible to improve the light transmittance of the semiconductor device 10. In addition, applying the semiconductor device 10 to a display device makes it possible to improve the light transmittance of the display device. For example, the semiconductor device 10 can be applied to a transparent display in which the background can be visually recognized.

In the present embodiment, a light-shielding layer may be arranged between the substrate 100 and the oxide semiconductor layer 144. Since the light-shielding layer is arranged in an area overlapping the channel area 144CH, it is possible to suppress variation in the properties of the semiconductor device 10 when the channel area 144CH is irradiated with light.

In the present embodiment, although a configuration in which a top-gate transistor in which a gate electrode is arranged on an oxide semiconductor layer is used as the semiconductor device 10 is exemplified, the configuration is not limited to this configuration. For example, a bottom-gate transistor in which the gate electrode is arranged only below the oxide semiconductor layer or a dual-gate transistor in which the gate electrode is arranged above and below the oxide semiconductor layer may be used as the semiconductor device 10. The above configuration is merely an embodiment, and the present invention is not limited to the above configuration.

Manufacturing Method of Semiconductor Device 10

Figure 3:
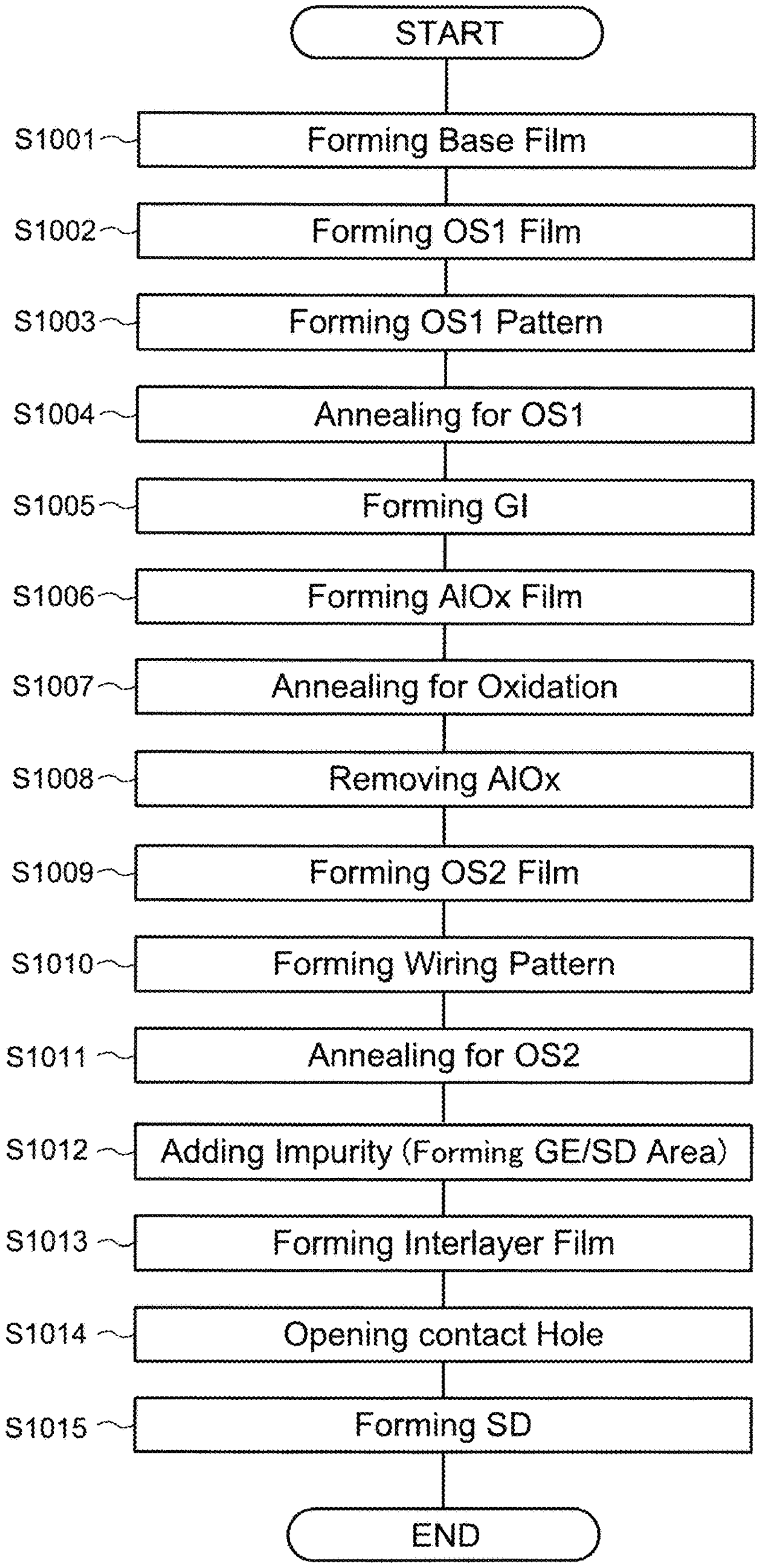
FIG. 3 is a sequence diagram showing a manufacturing method of a semiconductor device according to an embodiment of the present invention.

With reference to FIG. 3 to FIG. 13, a manufacturing method of a semiconductor device according to an embodiment of the present invention will be described. FIG. 3 is a sequence diagram showing a manufacturing method of a semiconductor device according to an embodiment of the present invention. FIG. 4 to FIG. 13 are cross-sectional views showing a manufacturing method of a semiconductor device according to an embodiment of the present invention.

Figure 4:
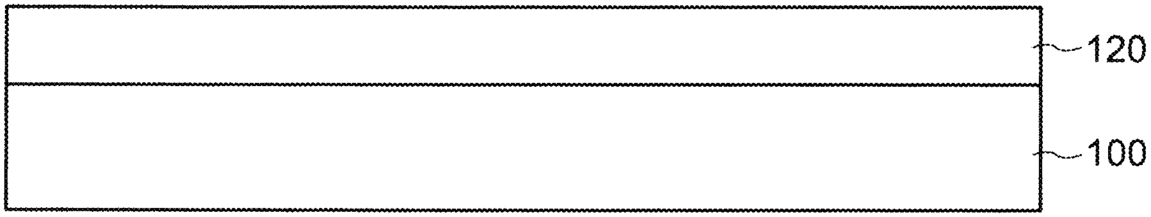
FIG. 4 is a cross-sectional view showing a manufacturing method of a semiconductor device according to an embodiment of the present invention.

As shown in FIG. 3 and FIG. 4, the base film 120 is formed on the substrate 100 ("Forming Base Film" of step S1001 shown in FIG. 3).

A rigid substrate with light transmittance such as a glass substrate, a quartz substrate, a sapphire substrate, or the like is used as the substrate 100. When the substrate 100 needs to be flexible, a polyimide substrate, an acryl substrate, a siloxane substrate, a fluororesin substrate, or a substrate containing resin is used as the substrate 100. In the case where the substrate containing resin is used as the substrate 100, an impurity element may be introduced into the resin in order to improve the heat resistance of the substrate 100.

The base film 120 is formed by a CVD (Chemical Vapor Deposition) method or a sputtering method. A general insulating material is used as the base film 120. For example, an inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) is used as the base film 120.

The above $SiO_xN_y$ and $AlO_xN_y$ are silicon compounds and aluminum compounds containing nitrogen (N) in a ratio (x>y) smaller than oxygen (O). $SiN_xO_y$ and $AlN_xO_y$ are silicon compounds and aluminum compounds containing oxygen in a ratio (x>y) smaller than nitrogen.

The base film 120 is formed of a single-layer structure or a stacked structure. In the case where the base film 120 has the stacked structure, it is preferable that an insulating material containing nitrogen and an insulating material containing oxygen are formed in this order from the substrate 100. For example, impurities that diffuse from the substrate 100 toward the oxide semiconductor layer 144 can be blocked by using a nitrogen-containing insulating material. In addition, oxygen can be released by a heat treatment by using an insulating material containing oxygen. For example, the temperature of the heat treatment in which the insulating material containing oxygen releases oxygen is 600° C. or less, 500° C. or less, 450° C. or less, or 400° C. or less. That is, for example, the insulating material containing oxygen releases oxygen at the heat treatment temperature performed in the manufacturing process of the semiconductor device 10 when a glass substrate is used as the substrate 100. In the present embodiment, for example, silicon nitride is formed as an insulating material containing nitrogen. For example, silicon oxide is formed as the insulating material containing oxygen.

Figure 5:
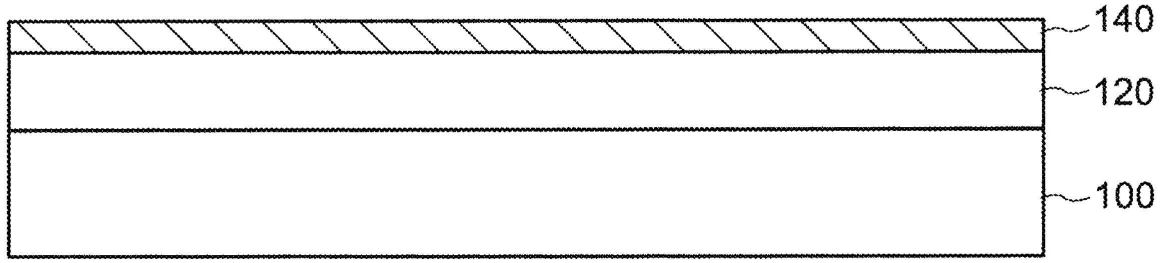
FIG. 5 is a cross-sectional view showing a manufacturing method of a semiconductor device according to an embodiment of the present invention.

As shown in FIG. 3 and FIG. 5, an oxide semiconductor layer 140 is formed on the base film 120 ("Forming OS1 Film" in step S1002 shown in FIG. 3). This process may be referred to as forming the oxide semiconductor layer 140 on the substrate 100.

The oxide semiconductor layer 140 is deposited by a sputtering method or an atomic layer deposition (ALD: Atomic Layer Deposition) method. For example, a thickness of the oxide semiconductor layer 140 is 10 nm or more and 100 nm or less, 15 nm or more and 70 nm or less, or 20 nm or more and 40 nm or less.

A metal oxide having semiconductor properties can be used as the oxide semiconductor layer 140. For example, an oxide semiconductor containing two or more metals including indium (In) is used as the oxide semiconductor layer 140. The proportion of indium in the two or more metals is 50% or more. Gallium (Ga), zinc (Zn), aluminum (Al), hafnium (Hf), yttrium (Y), zirconia (Zr), and a lanthanoid are used as the oxide semiconductor layer 140 in addition to indium. Elements other than those described above may be used as the oxide semiconductor layer 140. In the present embodiment, a metal oxide containing indium (In) and gallium (Ga) is used as the oxide semiconductor layer 140.

In the case where the oxide semiconductor layer 140 is crystallized by OS annealing described later, the oxide semiconductor layer 140 after the film formation and before the OS annealing is preferably amorphous (the oxide semiconductor has few crystal components). In other words, in a film-forming method of the oxide semiconductor layer 140, the conditions immediately after the oxide semiconductor layer 140 is formed are preferred to be such that the oxide semiconductor layer 140 not crystallized as much as possible. For example, in the case where the oxide semiconductor layer 140 is formed by the sputtering method, the oxide semiconductor layer 140 is formed while controlling the temperature of objects to be film-formed (the substrate 100 and the structure formed thereon).

When the film formation is performed on the object to be film-formed by the sputtering method, ions generated in the plasma and atoms recoiled by a sputtering target collide with the object to be film-formed, so that the temperature of the object to be film-formed rises with the film-forming process. When the temperature of the object to be film-formed during the film-forming process rises, microcrystals are contained in the oxide semiconductor layer 140 immediately after the film-forming process, and crystallization due to subsequent OS annealing is inhibited. For example, in order to control the temperature of the object to be film-formed as described above, film formation can be performed while cooling the object to be film-formed. For example, the object to be film-formed can be cooled from a surface opposite to a film-forming surface so that the temperature of the film-forming surface of the object to be film-formed (hereinafter, referred to as "film-forming temperature") is 100° C. or less, 70° C. or less, 50° C. or less, or 30° C. or less. As described above, forming the oxide semiconductor layer 140 while cooling the object to be film-formed makes it possible to form the oxide semiconductor layer 140 with few crystal components immediately after the film formation.

Figure 6:
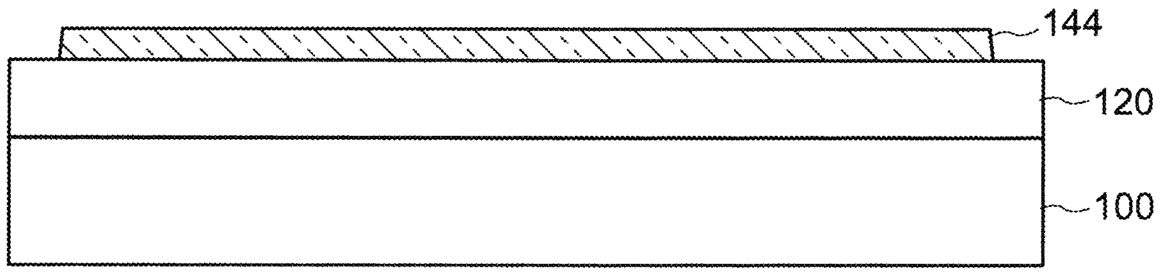
FIG. 6 is a cross-sectional view showing a manufacturing method of a semiconductor device according to an embodiment of the present invention.

As shown in FIG. 3 and FIG. 6, a pattern of the oxide semiconductor layer 140 is formed ("Forming OS1 Pattern" in step S1003 shown in FIG. 3). Although not shown, a resist mask is formed on the oxide semiconductor layer 140, and the oxide semiconductor layer 140 is etched using the resist mask. Wet etching may be used, or dry etching may be used as the etching of the oxide semiconductor layer 140. In the wet etching, the etching can be performed using an acidic etchant. For example, oxalic acid or hydrofluoric acid can be used as the etchant.

A pattern is preferably formed on the oxide semiconductor layer 140 before the OS annealing. If the oxide semiconductor layer 140 is crystallized by the OS annealing, it tends to be difficult to etch. In addition, even if the oxide semiconductor layer 140 is damaged by etching, the damage can be repaired by the OS annealing, which is preferable.

After the pattern formation of the oxide semiconductor layer 140, a heat treatment (OS annealing) is performed on the oxide semiconductor layer 140 ("Annealing for OS1" in step S1004 shown in FIG. 3). In the OS annealing, the oxide semiconductor layer 140 is held at a predetermined reaching temperature for a predetermined time. The predetermined reaching temperature is 300° C. or more and 500° C. or less, preferably 350° C. or more and 450° C. or less. In addition, the holding time at the reaching temperature is 15 minutes or more and 120 minutes or less, preferably 30 minutes or more and 60 minutes or less. Performing OS annealing crystallizes the oxide semiconductor layer 140, and the oxide semiconductor layer 144 having a polycrystalline structure is formed.

Figure 7:
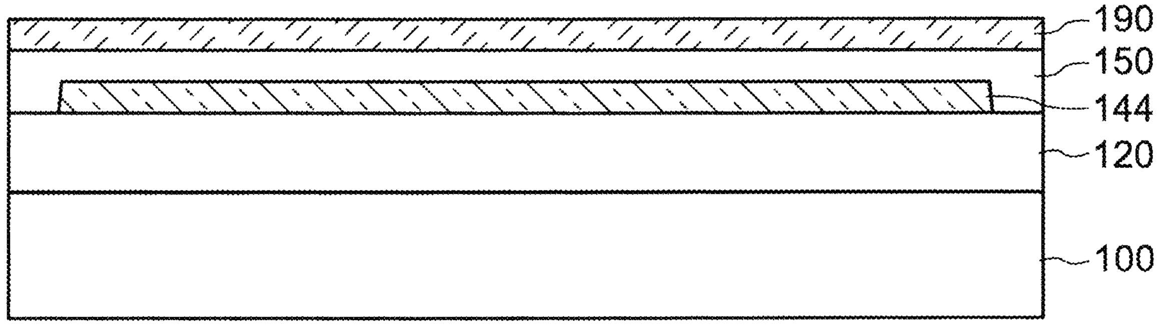
FIG. 7 is a cross-sectional view showing a manufacturing method of a semiconductor device according to an embodiment of the present invention.

As shown in FIG. 3 and FIG. 7, the gate insulating layer 150 is formed on the oxide semiconductor layer 144 ("Forming GI" in step S1005 shown in FIG. 3).

The explanation of the base film 120 may be referred to with regards to the film-forming methods and insulating materials of the gate insulating layer 150. For example, the thickness of the gate insulating layer 150 is 50 nm or more and 150 nm or less.

It is preferable to use an insulating material containing oxygen as the gate insulating layer 150. It is preferable to use a less defective insulating layer as the gate insulating layer 150. For example, in the case where the composition ratio of oxygen in the gate insulating layer 150 is compared with the composition ratio of oxygen in an insulating layer having a composition similar to that of the gate insulating layer 150 (hereinafter referred to as "another insulating layer"), the composition ratio of oxygen in the gate insulating layer 150 is closer to the stoichiometric ratio with respect to the insulating layer than the composition ratio of oxygen in the other insulating layer. For example, in the case where silicon oxide ($SiO_x$) is used for each of the gate insulating layer 150 and the insulating layer 180, the composition ratio of oxygen in the silicon oxide used as the gate insulating layer 150 is closer to the stoichiometric ratio of silicon oxide compared with the composition ratio of oxygen in the silicon oxide used as the insulating layer 180. For example, a layer in which no defects are observed when evaluated by an electron spin resonance method (ESR) may be used as the gate insulating layer 150.

In order to form a less defective insulating layer as the gate insulating layer 150, the gate insulating layer 150 may be deposited at a deposition temperature of 350° C. or higher. In addition, after the gate insulating layer 150 is deposited, a process of implanting oxygen into part of the gate insulating layer 150 may be performed. In the present embodiment, silicon oxide is formed at a deposition temperature of 350° C. or higher in order to form a less defective insulating layer as the gate insulating layer 150.

As shown in FIG. 3 and FIG. 7, a metal oxide layer 190 containing aluminum as a main component is formed on the gate insulating layer 150 ("Forming AlOx Film" in step S1006 shown in FIG. 3).

The metal oxide layer 190 is formed by the sputtering method. Oxygen is implanted into the gate insulating layer 150 by the deposition of the metal oxide layer 190. For example, an inorganic insulating layer such as aluminum oxide ($AlO_x$), aluminum oxynitride ($Al_xN_y$), aluminum nitride oxide ($AlN_xO_y$), and aluminum nitride ($AlN_x$) are used as the metal oxide layer containing aluminum as the main component. The "metal oxide layer containing aluminum as a main component" means that the proportion of aluminum contained in the metal oxide layer 190 is 1% or more of the total amount of the metal oxide layer 190. The proportion of aluminum contained in the metal oxide layer 190 may be 5% or more and 70% or less, 10% or more and 60% or less, or 30% or more and 50% or less of the entire metal oxide layer 190. The ratios may be mass ratios or weight ratios.

For example, the thickness of the metal oxide layer 190 is 5 nm or more and 100 nm or less, 5 nm or more and 50 nm or less, 5 nm or more and 30 nm or less, or 7 nm or more and 15 nm or less. In the present embodiment, aluminum oxide is used as the metal oxide layer 190. Aluminum oxide has a high barrier property against gas. In the present embodiment, the aluminum oxide used as the metal oxide layer 190 suppresses the oxygen implanted into the gate insulating layer 150 from diffusing outward when the metal oxide layer 190 is formed.

For example, in the case where the metal oxide layer 190 is formed by the sputtering method, a process gas used in sputtering remains in the film of the metal oxide layer 190. For example, in the case where Ar is used as the process gas for sputtering, Ar may remain in the film of the metal oxide layer 190. The remaining Ar can be detected by a SIMS (Secondary Ion Mass Spectrometry) analysis on the metal oxide layer 190.

A heat treatment (Annealing for Oxidation) for supplying oxygen to the oxide semiconductor layer 144 is performed while the gate insulating layer 150 is formed on the oxide semiconductor layer 144 and the metal oxide layer 190 is formed on the gate insulating layer 150 ("Annealing for Oxidation" in step S1007 shown in FIG. 3).

In the process from the deposition of the oxide semiconductor layer 144 to the deposition of the gate insulating layer 150 on the oxide semiconductor layer 144, a large number of oxygen defects occurs on the upper surface and the side surface of the oxide semiconductor layer 144. Oxygen emitted from the base film 120 is supplied to the upper surface and the side surface of the oxide semiconductor layer 144 by the above-described annealing for oxidation, and the oxygen defect is repaired.

In the above-described annealing for oxidation, the oxygen implanted into the gate insulating layer 150 is blocked by the metal oxide layer 190, and thus is suppressed from being released into the atmosphere. Therefore, the oxygen is efficiently supplied to the oxide semiconductor layer 144 by the annealing for oxidation, and the oxygen defect is repaired.

Figure 8:
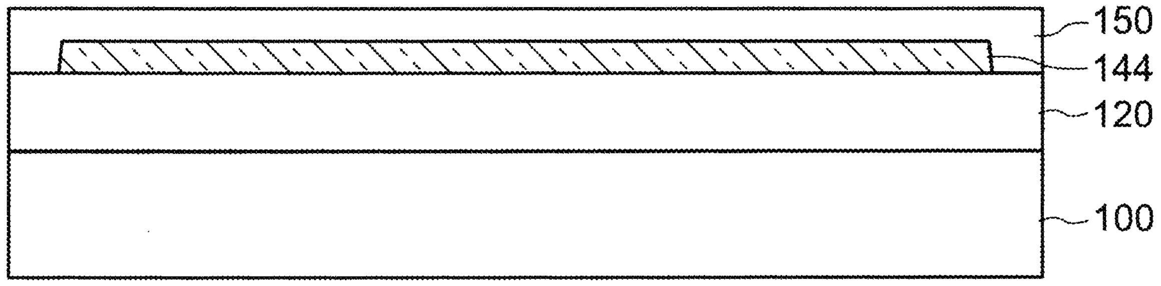
FIG. 8 is a cross-sectional view showing a manufacturing method of a semiconductor device according to an embodiment of the present invention.

As shown in FIG. 3 and FIG. 8, the metal oxide layer 190 is etched (removed) after the annealing for oxidation ("Removing AlOx" in step S1008 shown in FIG. 3). Wet etching may be used, or dry etching may be used as the etching of the metal oxide layer 190. For example, dilute hydrofluoric acid (DHF) is used as the wet etching. The metal oxide layer 190 formed on the entire surface is removed by the etching. In other words, the metal oxide layer 190 is removed without using a mask. In other words, at least in a plan view, all of the metal oxide layer 190 in an area that overlaps the oxide semiconductor layer 144, which is formed in one pattern, is removed by the etching.

Figure 9:
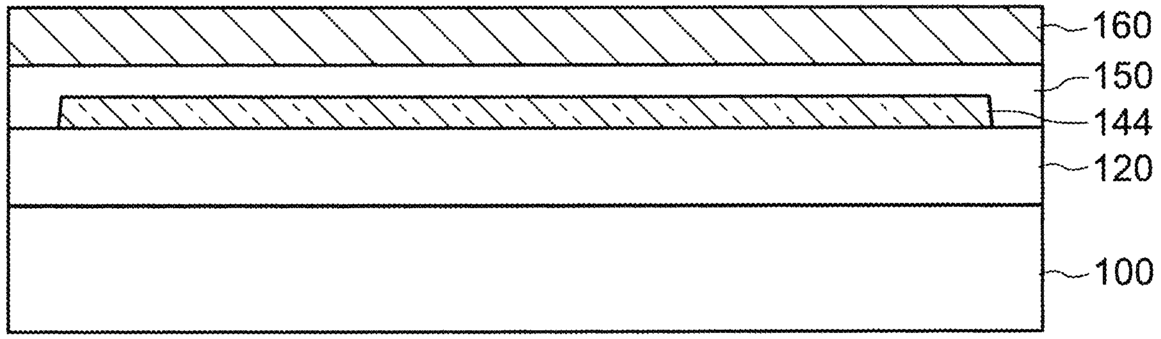
FIG. 9 is a cross-sectional view showing a manufacturing method of a semiconductor device according to an embodiment of the present invention.

Next, as shown in FIG. 3 and FIG. 9, an oxide semiconductor layer 160 is formed on the gate insulating layer 150 ("Forming OS2 Film" in step S1009 shown in FIG. 3). The oxide semiconductor layer 160 is used to form the oxide conductive layer 164 (see FIG. 2) forming the gate electrode 164GE and gate wiring.

A metal oxide having semiconductor properties can be used as the oxide semiconductor layer 160 as described in the oxide semiconductor layer 140. For example, a metal oxide containing two or more metals including indium (In) is used as the oxide semiconductor layer 160. In addition, the proportion of indium in the two or more metals is 50% or more. The proportion of indium in the entire oxide semiconductor layer 160 is 50% or more. Gallium (Ga), zinc (Zn), aluminum (Al), hafnium (Hf), yttrium (Y), zirconia (Zr), and a lanthanoid are used as the oxide semiconductor layer 160 in addition to indium. Elements other than those described above may be used as the oxide semiconductor layer 160.

In the present embodiment, a metal oxide containing indium (In) and gallium (Ga) is used as the oxide semiconductor layer 160. The oxide semiconductor layer 160 preferably has the same composition as the oxide semiconductor layer 140. Since the oxide semiconductor layer 160 has the same composition as the oxide semiconductor layer 140, the same sputtering target can be used, and thus the manufacturing cost can be suppressed. Similar to the oxide semiconductor layer 140, the oxide semiconductor layer 160 after deposition is preferably amorphous.

The explanation of the film-forming method of the oxide semiconductor layer 140 may be referred to with regards to the film-forming method of the oxide semiconductor layer 160 and the-film forming conditions.

Figure 10:
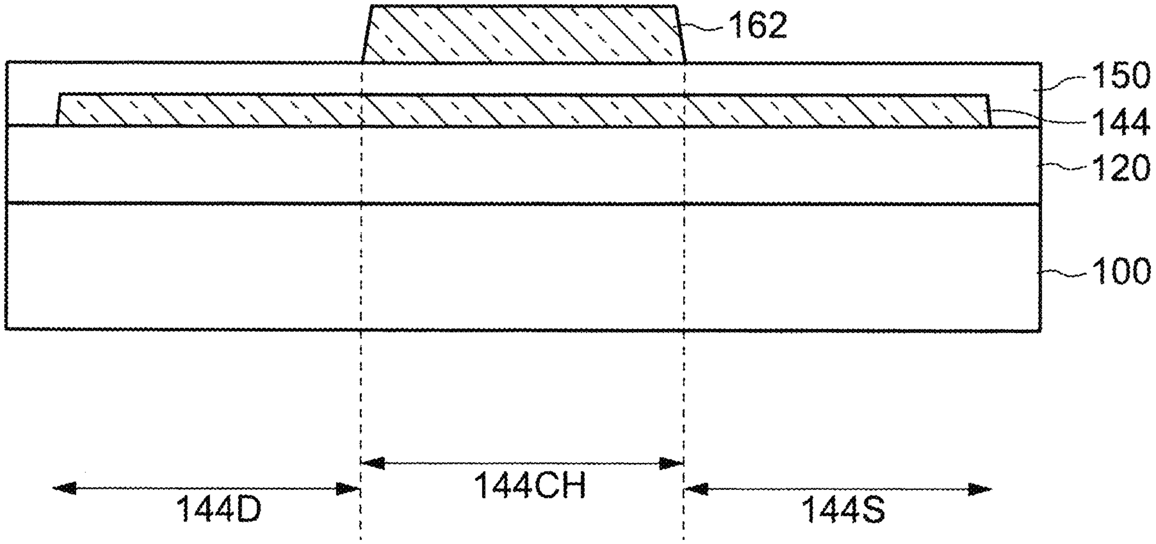
FIG. 10 is a cross-sectional view showing a manufacturing method of a semiconductor device according to an embodiment of the present invention.

Next, as shown in FIG. 3 and FIG. 10, a wiring pattern of the oxide semiconductor layer 160 is formed ("Forming Wiring Pattern" in step S1010 shown in FIG. 3). Although not shown, a resist mask is formed on the oxide semiconductor layer 160, and the oxide semiconductor layer 160 is etched using the resist mask. The explanation of the method of etching the oxide semiconductor layer 140 may be referred to with regards to the method of etching the oxide semiconductor layer 160. As a result, the wiring pattern of the oxide semiconductor layer 160 is formed.

Next, a heat treatment (OS annealing) is performed on the oxide semiconductor layer 160 after the formation of the wiring pattern of the oxide semiconductor layer 160 ("Annealing for OS2" in step S1011 shown in FIG. 3). In the OS annealing, the oxide semiconductor layer 160 is held at a predetermined reaching temperature for a predetermined time. The predetermined reaching temperature is 300° C. or more and 500° C. or less, preferably 350° C. or more and 450° C. or less. In addition, the holding time at the reaching temperature is 15 minutes or more and 120 minutes or less, preferably 30 minutes or more and 60 minutes or less. Performing OS annealing crystallizes the oxide semiconductor layer 160, and an oxide semiconductor layer 162 having a polycrystalline structure is formed.

Figure 11:
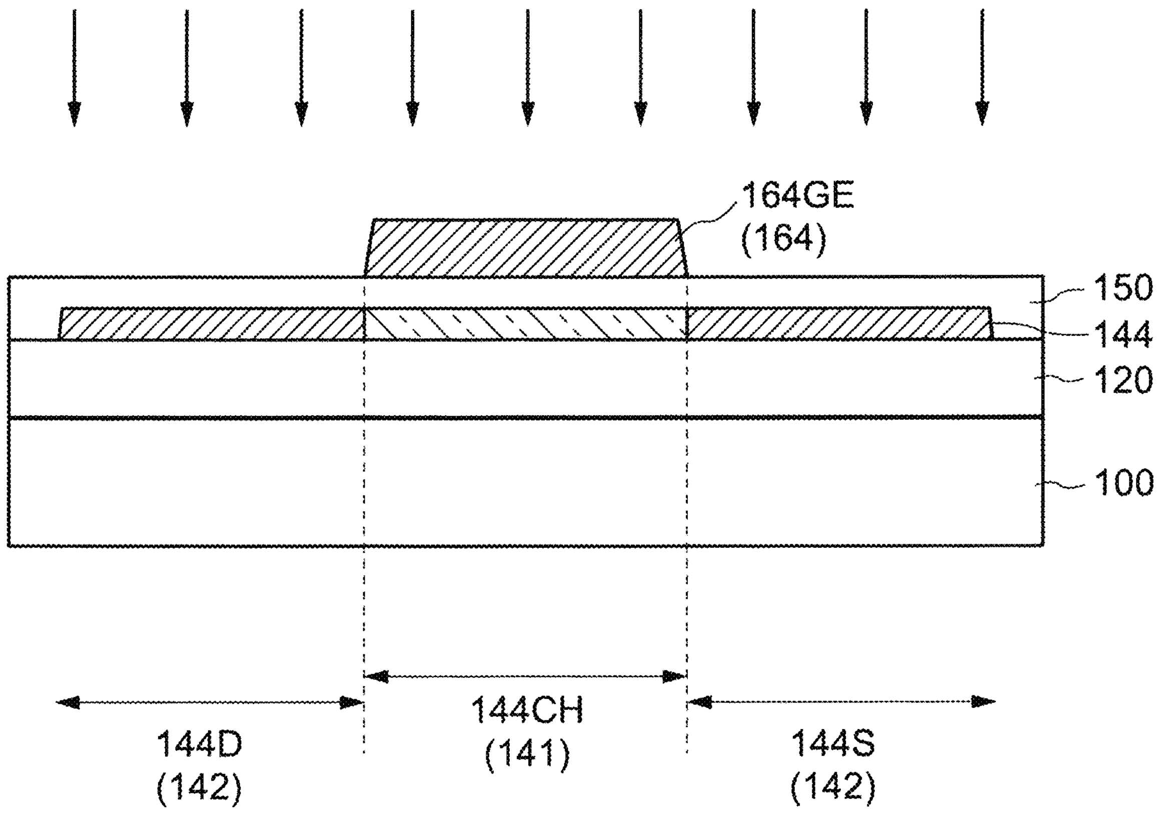
FIG. 11 is a cross-sectional view showing a manufacturing method of a semiconductor device according to an embodiment of the present invention.

Next, as shown in FIG. 3 and FIG. 11, an impurity is added to the oxide semiconductor layer 162, and an impurity is added to the oxide semiconductor layer 144 using the oxide semiconductor layer 162 as a mask ("Adding Impurity (Forming GE/SD Area)" in step S1012 shown in FIG. 3). In the present embodiment, although the case where the impurity is added by ion implantation is described, it may be performed by an ion doping method.

Specifically, an impurity element is added to the oxide semiconductor layer 162 while being exposed by ion implantation, and an impurity element is added to the source area 144S and the drain area 144D through the gate insulating layer 150. Therefore, the same impurity element is added to the oxide semiconductor layer 162 and the source area 144S and the drain area 144D.

For example, argon (Ar), phosphorus (P), or boron (B) may be used as the impurity element. In addition, in the case where boron (B) is added by the ion-implantation method, the acceleration energy may be set to 20 keV or more and 40 keV or less, and the implantation amount of boron (B) may be set to $1\times10^{14}$ $cm^{-2}$ or more and $1\times10^{16}$ $cm^{-2}$ or less.

In step S1102, when impurities are added to the oxide semiconductor layer 144 and the oxide semiconductor layer 162, it needs to be controlled so that the impurity element is not added to the channel area 144CH below the oxide semiconductor layer 162, and the impurity element is added to the source area 144S and the drain area 144D.

If the thickness of the gate electrode 164GE is large, the acceleration energy needs to be set to such an extent that the impurity element sufficiently reaches the lower surface of the gate electrode 164GE. Specifically, in the vicinity of the lower surface of the gate electrode 164GE, the concentration of the impurity element is preferably about $1\times10^{18}$ $cm^{-3}$ or more and $1\times10^{21}$ $cm^{-3}$ or less. On the other hand, in the oxide semiconductor layer 144, the acceleration energy needs to be set to such an extent that the impurity element remains above the lower surface of the gate insulating layer 150 so that the impurity element does not reach an area that later becomes the channel area 144CH. Specifically, in the vicinity of the upper surface of the oxide semiconductor layer 144 in contact with the gate insulating layer 150, the impurity element concentration is preferably less than about $1\times10^{18}$ $cm^{-3}$.

In other words, it is preferable to optimize the acceleration energy when the impurity element is added according to the thickness of the gate electrode 164GE and the thickness of the gate insulating layer 150. In the case where the thickness of the gate insulating layer 150 decreases with the miniaturization of the transistor, a distance between the lower surface of the gate electrode 164GE and the oxide semiconductor layer 144 is shortened, so that a more detailed setting is required.

In addition, in the case where the impurity element does not sufficiently reach the lower surface of the gate electrode 164GE, an area that is not sufficiently conductive is interposed between the gate electrode 164GE and the gate insulating layer 150, which is not preferable in view of the structure of the transistor. Therefore, it is preferable that the impurity element is implanted so as to reach the middle of the gate insulating layer 150 beyond the lower surface of the gate electrode 164GE.

According to the above, an impurity element may be added to the oxide conductive layer 164, the source area 144S, and the drain area 144D at a concentration of $1\times10^{18}$ $cm^{-3}$ or more and $1\times10^{21}$ $cm^{-3}$ or less. As a result, the resistivity of the oxide conductive layer 164, the source area 144S, and the drain area 144D can be reduced to function as conductors. Therefore, the wiring pattern of the oxide conductive layer 164 can function as a gate wiring. In this case, an area of the gate wiring overlapping the channel area 144CH of the oxide semiconductor layer 144 functions as the gate electrode 164GE. In addition, even if the impurity element is added to the channel area 144CH through the oxide conductive layer 164 and the gate insulating layer 150 by ion-implantation, it can be less than $1\times10^{18}$ $cm^{-3}$. As a result, it is possible to suppress degradation of the electrical properties of the semiconductor device 10. In addition, impurity elements are added to the source area 144S and the drain area 144D via a gate insulating layer. Therefore, the concentration of the impurity element contained in the source area 144S and the drain area 144D may be lower than the concentration of the impurity element contained in the oxide conductive layer 164 (the gate electrode 164GE).

Figure 12:
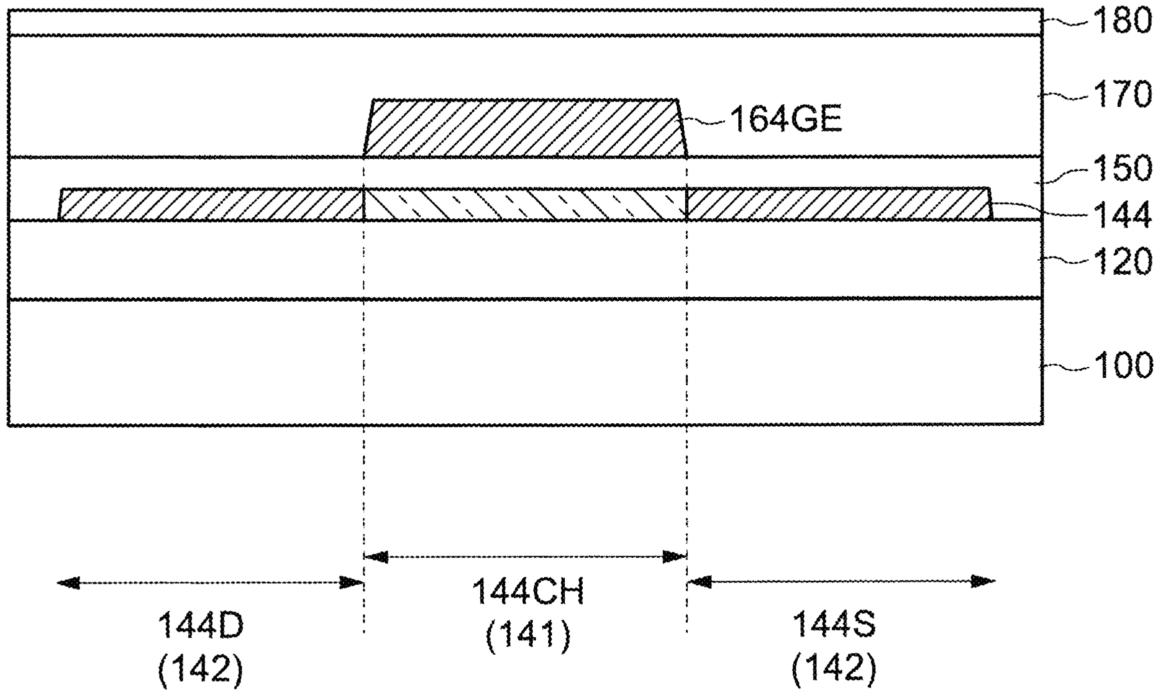
FIG. 12 is a cross-sectional view showing a manufacturing method of a semiconductor device according to an embodiment of the present invention.

As shown in FIG. 3 and FIG. 12, the insulating layers 170 and 180 are formed as interlayer films on the gate insulating layer 150 and the gate electrode 164GE ("Forming Interlayer Film" in step S1013 shown in FIG. 3).

The explanation of the base film 120 may be referred to with regards to the film-forming method and insulating materials of the insulating layers 170 and 180. A thickness of the insulating layer 170 is 50 nm or more and 500 nm or less. A thickness of the insulating layer 180 is 50 nm or more and 500 nm or less. In the present embodiment, for example, silicon nitride is formed as the insulating layer 170, and silicon oxide is formed as the insulating layer 180.

Figure 13:
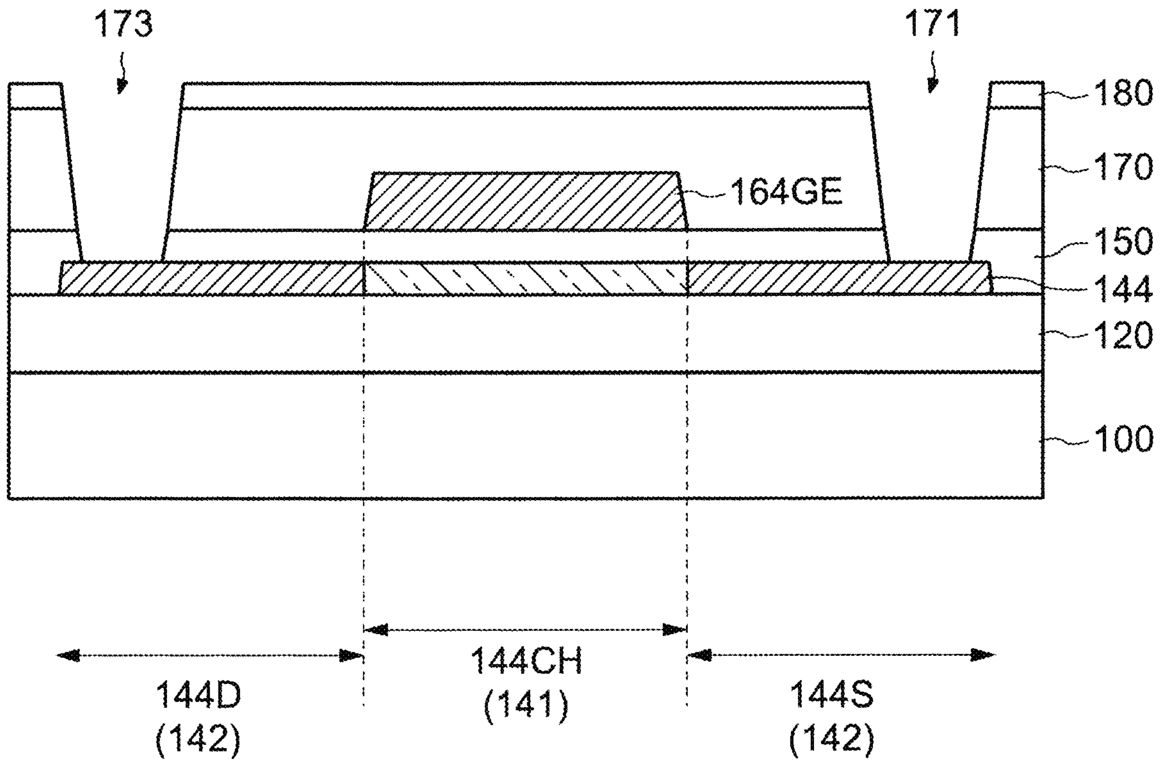
FIG. 13 is a cross-sectional view showing a manufacturing method of a semiconductor device according to an embodiment of the present invention.

As shown in FIG. 3 and FIG. 13, the openings 171 and 173 are formed in the gate insulating layer 150 and the insulating layers 170 and 180 ("Opening Contact Hole" in step S1014 shown in FIG. 3). The oxide semiconductor layer 144 of the source area 144S is exposed by the opening 171. The oxide semiconductor layer 144 of the drain area 144D is exposed by the opening 173.

Next, the semiconductor device 10 shown in FIG. 1 can be formed by forming the source electrode and the drain electrode 200 on the oxide semiconductor layer 144 and on the insulating layer 180 exposed by the openings 171 and 173 ("Forming SD" in step S1015 shown in FIG. 3).

For example, the source electrode and the drain electrode 200 is formed by the sputtering method. A general metal material is used as the source electrode and the drain electrode 200. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys or compounds thereof are used as the source electrode and the drain electrode 200.

The above-described material may be used in a single layer or in a stacked layer as the source electrode and the drain electrode 200.

In the semiconductor device 10 manufactured by the above-described manufacturing method, it is possible to obtain electrical properties having a mobility of 30 $cm^2/Vs$ or more, 35 $cm^2/Vs$ or more, or 40 $cm^2/Vs$ or more in a range where the channel length L of the channel area 144CH is 2 μm or more and 4 μm or less and a channel width of the channel area 144CH is 2 μm or more and 25 μm or less. The mobility in the present embodiment means a field-effect mobility in a saturated area of the semiconductor device 10, and it means the maximum value of the field-effect mobility in an area where a potential difference (Vd) between the source electrode and the drain electrode is greater than a value (Vg−Vth) obtained by subtracting a threshold voltage (Vth) of the semiconductor device 10 from a voltage (Vg) supplied to the gate electrode.

Since the oxide semiconductor has light transmittance, if it can be used as a wiring material, it is very advantageous in improving the transmittance of an array substrate (substrate in which a plurality of semiconductor devices is arranged in an array). However, in the conventional oxide semiconductor, it is difficult to sufficiently reduce resistance, and it is difficult to use as the wiring material.

In the manufacturing method of the semiconductor device according to an embodiment of the present invention, the oxide conductive layer 164 functioning as the gate wiring and the gate electrode is formed using the oxide semiconductor layer 162 having the same composition as the oxide semiconductor layer 144. The oxide semiconductor layer 144 and the oxide semiconductor layer 162 have the same crystal structure. In addition, the impurity element is added using the oxide semiconductor layer 162 as a mask, so that the impurity element can be added to the oxide semiconductor layer 162, the source area 144S, and the drain area 144D. As a result, oxygen defects can be generated in the oxide semiconductor layer 162, the source area 144S, and the drain area 144D, so that resistance can be sufficiently reduced.

Therefore, in the semiconductor device 10 manufactured by the above-described manufacturing method, the oxide conductive layer 164 with light transmittance can be used as the gate wiring and the gate electrode 164GE. As a result, the light transmittance of the semiconductor device 10 can be improved. Applying this type of semiconductor device 10 to a display device makes it possible to manufacture a display device with high light transmittance.

Second Embodiment

In the second embodiment, the semiconductor device 10 having a configuration different from that of the semiconductor device 10 according to the first embodiment will be described.

Configuration of Semiconductor Device 10

The configuration of the semiconductor device 10 according to the present embodiment is similar to that of the semiconductor device 10 of the first embodiment, but is different from that of the semiconductor device 10 of the first embodiment in that a metal oxide layer 130 is arranged between the base film 120 and the oxide semiconductor layer 144. In the following description, the same configuration as in the first embodiment will be omitted, and differences from the first embodiment will be mainly described.

Figure 14:
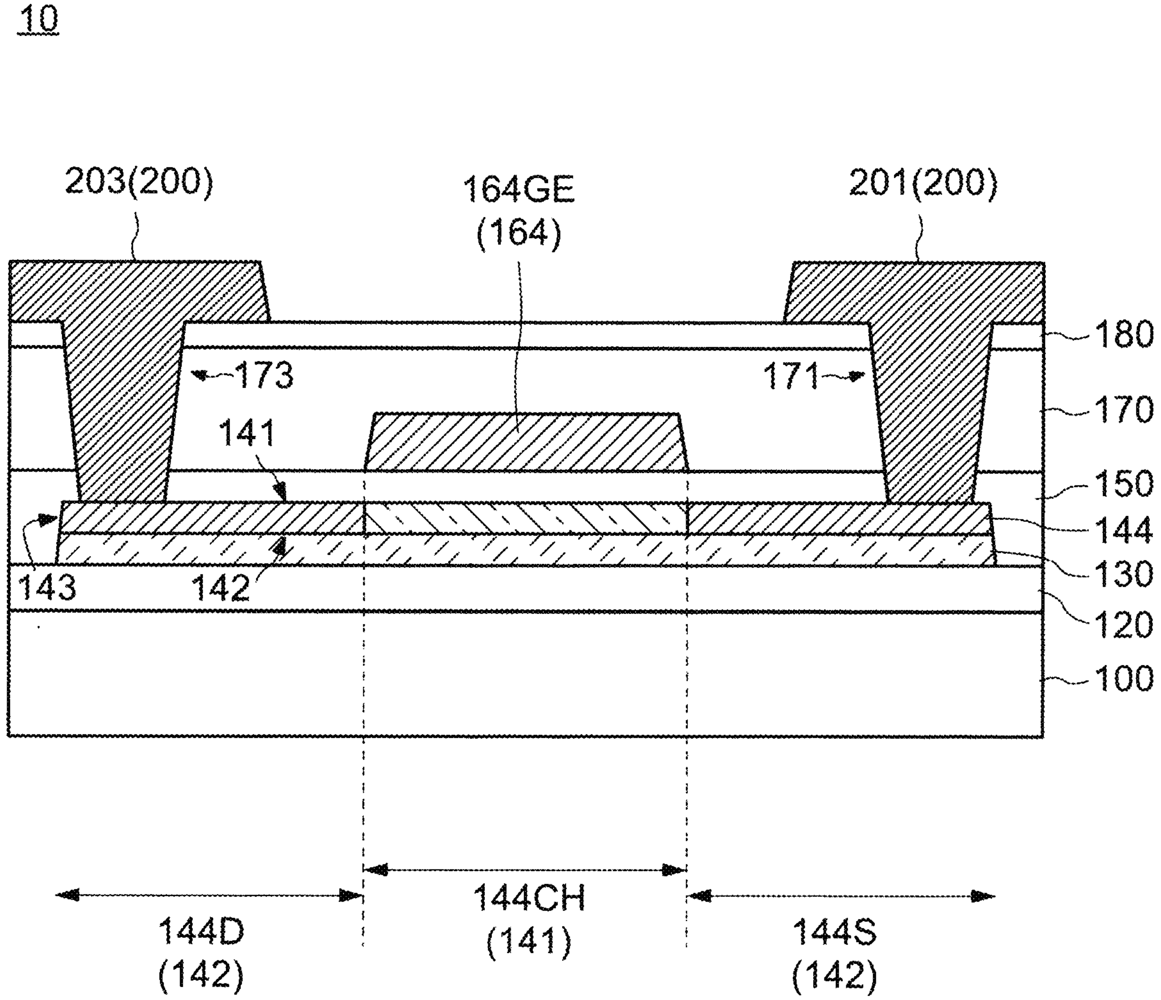
FIG. 14 is a cross-sectional view showing an outline of a semiconductor device according to an embodiment of the present invention.

FIG. 14 is a cross-sectional view schematically showing the semiconductor device 10 according to an embodiment of the present invention. As shown in FIG. 14, the semiconductor device 10 includes the base film 120, the metal oxide layer 130, the oxide semiconductor layer 144, the gate insulating layer 150, the gate electrode 164GE, the insulating layers 170 and 180, the source electrode 201, and the drain electrode 203.

The metal oxide layer 130 is arranged on the base film 120. The metal oxide layer 130 is in contact with the base film 120. The oxide semiconductor layer 144 is arranged on the metal oxide layer 130. The oxide semiconductor layer 144 is in contact with the metal oxide layer 130. A surface of the main surface of the oxide semiconductor layer 144 that is in contact with the metal oxide layer 130 is referred to as a lower surface. An end portion of the metal oxide layer 130 substantially matches an end portion of the oxide semiconductor layer 144.

The metal oxide layer 130 is a layer containing a metal oxide containing aluminum as a main component, similar to the metal oxide layer 190, and has a function as a gas barrier film for shielding a gas such as oxygen or hydrogen. A material similar to that of the metal oxide layer 190 is used as the metal oxide layer 130. The material of the metal oxide layer 130 may be the same as or different from the material of the metal oxide layer 190.

Since the planar configuration of the semiconductor device 10 is the same as that of FIG. 2, the illustration is omitted, and the planar pattern of the metal oxide layer 130 is substantially the same as the planar pattern of the oxide semiconductor layer 144 in a plan view. Referring to FIG. 14, the lower surface of the oxide semiconductor layer 144 is covered with the metal oxide layer 130. In particular, in the present embodiment, all of the lower surface of the oxide semiconductor layer 144 is covered with the metal oxide layer 130.

Since the proportion of indium in the oxide semiconductor layer 144 is 50% or more, the semiconductor device 10 with high mobility can be realized. On the other hand, in this type of oxide semiconductor layer 144, oxygen contained in the oxide semiconductor layer 144 is easily reduced, and oxygen defects are easily formed in the oxide semiconductor layer 144.

In the semiconductor device 10, in the heat treatment step of the manufacturing process, hydrogen is released from the layer arranged closer to the substrate 100 than the oxide semiconductor layer 144 (for example, the base film 120) and the hydrogen reaches the oxide semiconductor layer 144, so that oxygen defects are generated in the oxide semiconductor layer 144. The generation of oxygen defects is more significant as the pattern size of the oxide semiconductor layer 144 increases. In order to suppress the generation of such oxygen defects, it is required to suppress hydrogen from reaching the lower surface of the oxide semiconductor layer 144.

In addition, the upper surface of the oxide semiconductor layer 144 is affected by a process after the oxide semiconductor layer 144 is formed (for example, a patterning process or an etching process). On the other hand, the lower surface of the oxide semiconductor layer 144 (the surface of the oxide semiconductor layer 144 on the substrate 100 side) is not affected as described above.

Therefore, the oxygen defects formed on the upper surface of the oxide semiconductor layer 144 are more than the oxygen defects formed on the lower surface of the oxide semiconductor layer 144. That is, the oxygen defects in the oxide semiconductor layer 144 are not uniformly present in the thickness direction of the oxide semiconductor layer 144, but are non-uniformly distributed in the thickness direction of the oxide semiconductor layer 144. Specifically, the number of oxygen defects in the oxide semiconductor layer 144 is fewer toward the lower surface side of the oxide semiconductor layer 144 and more toward the upper surface side of the oxide semiconductor layer 144.

In the case where the oxygen-supplying process is uniformly performed on the oxide semiconductor layer 144 having the oxygen defect distribution as described above, when oxygen is supplied in an amount required to repair the oxygen defect formed on the upper surface side of the oxide semiconductor layer 144, oxygen is excessively supplied to the lower surface side of the oxide semiconductor layer 144. As a result, on the lower surface side, a defect level different from the oxygen defect is formed due to the excess oxygen, and phenomena such as characteristic fluctuations in reliability tests or a decrease in the field-effect mobility occur. Therefore, in order to suppress such phenomena, it is necessary to supply oxygen to the upper surface side of the oxide semiconductor layer 144 while suppressing oxygen supply to the lower surface side of the oxide semiconductor layer 144.

In the conventional configuration and manufacturing method, there is a trade-off between the initial characteristics and the reliability test, in which the characteristic fluctuations due to the reliability tests occur even when the initial characteristics of the semiconductor device are improved by the oxygen-supplying process to the oxide semiconductor layer. However, with the configuration and manufacturing method according to the present embodiment, good initial characteristics and reliability tests of the semiconductor device 10 can be obtained.

Manufacturing Method of Semiconductor Device 10

Figure 15:
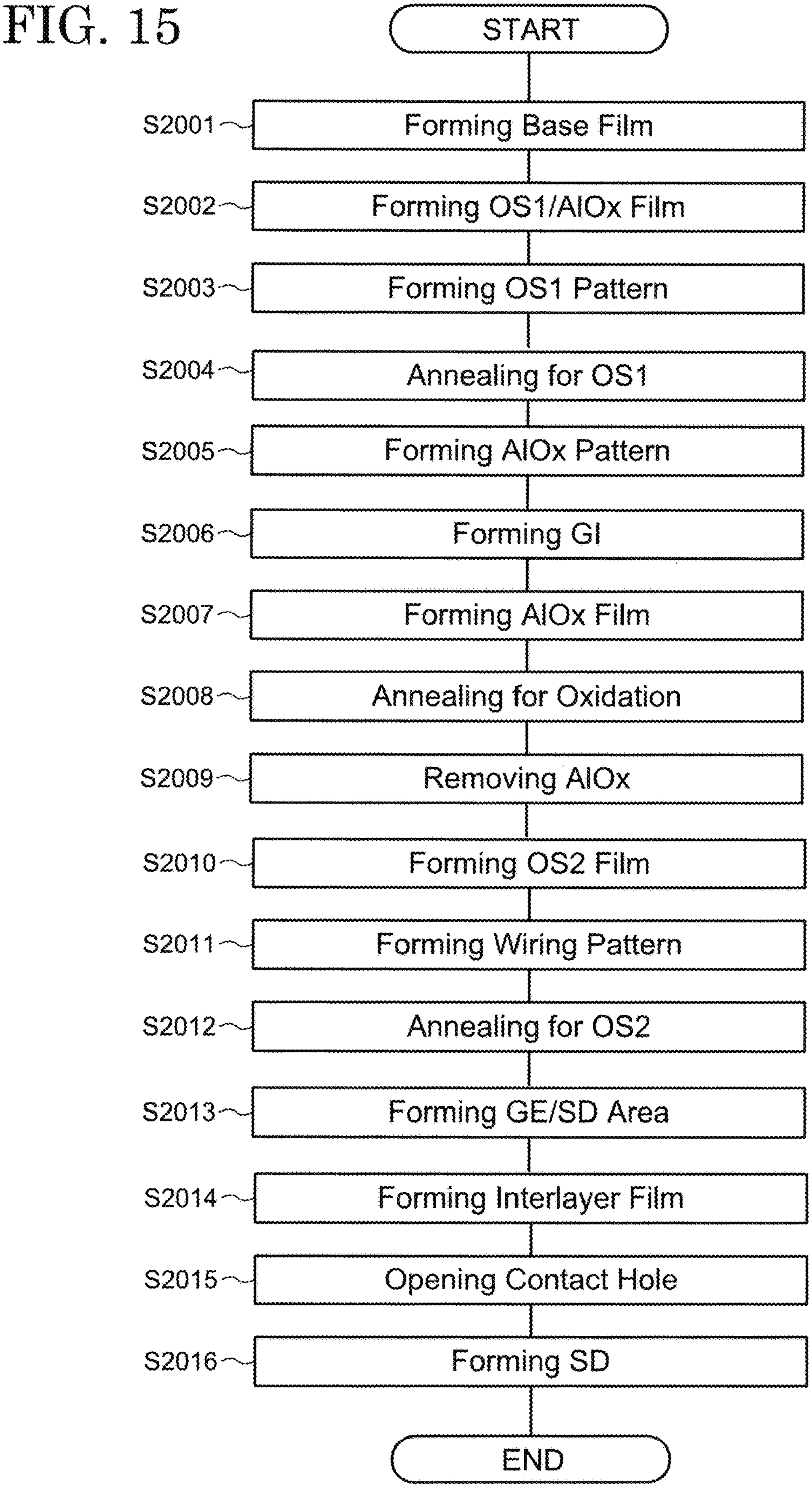
FIG. 15 is a sequence diagram showing a manufacturing method of a semiconductor device according to an embodiment of the present invention.
Figure 16:
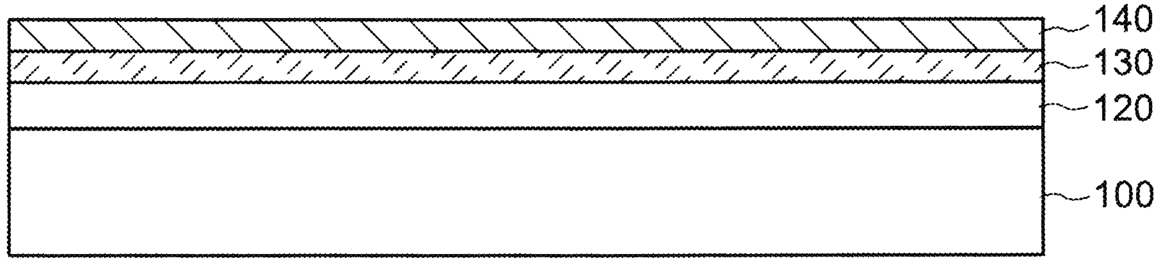
FIG. 16 is a cross-sectional view showing a manufacturing method of a semiconductor device according to an embodiment of the present invention.
Figure 17:
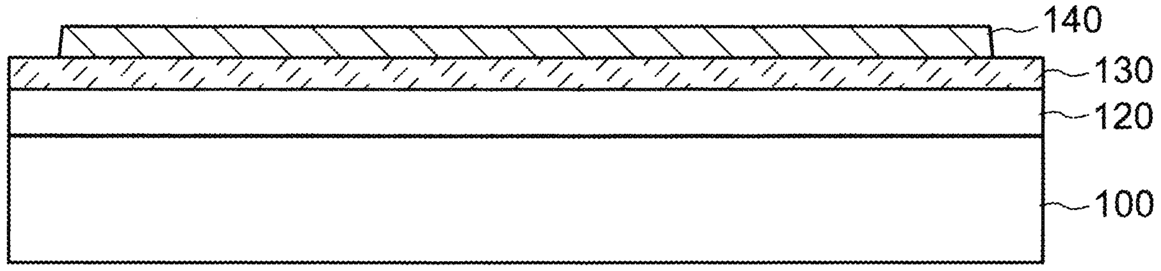
FIG. 17 is a cross-sectional view showing a manufacturing method of a semiconductor device according to an embodiment of the present invention.
Figure 18:
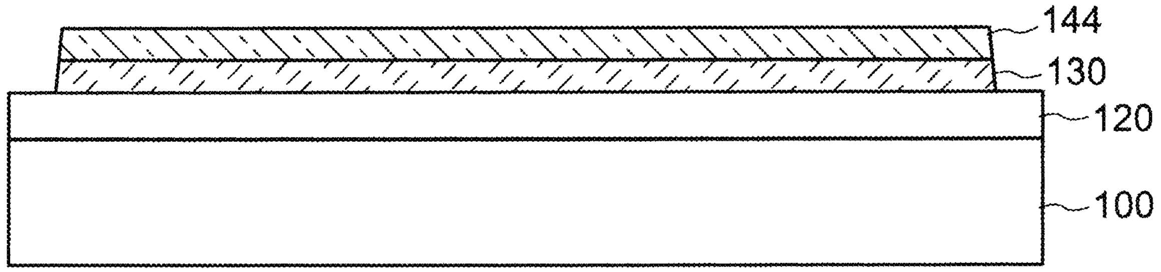
FIG. 18 is a cross-sectional view showing a manufacturing method of a semiconductor device according to an embodiment of the present invention.

A method of manufacturing the semiconductor device 10 according to an embodiment of the present invention will be described with reference to FIG. 15 to FIG. 18. FIG. 15 is a sequence diagram showing a manufacturing method of the semiconductor device 10 according to an embodiment of the present invention. FIG. 16 to FIG. 18 are cross-sectional views showing a manufacturing method of the semiconductor device 10 according to an embodiment of the present invention.

As shown in FIG. 15, the base film 120 is formed on the substrate 100 ("Forming Base Film" of step S2001 shown in FIG. The explanation of the step S1001 shown in FIG. 3 and FIG. 4 may be referred to with regards to Step S2001. In the present embodiment, silicon nitride and silicon oxide are used as the base film 120. In addition, silicon oxide is preferred because it releases oxygen by a heat treatment.

As shown in FIG. 15 and FIG. 16, the metal oxide layer 130 and the oxide semiconductor layer 140 are formed on the base film 120 ("Forming OS/AlOx Film" in step S2002 shown in FIG. 15). The metal oxide layer 130 and the oxide semiconductor layer 140 are deposited by a sputtering method or an atomic layer deposition (ALD: Atomic Layer Deposition) method.

The explanation of the material of the metal oxide layer 190 may be referred to with regards to the material of the metal oxide layer 130. For example, the thickness of the metal oxide layer 130 is 1 nm or more and 100 nm or less, 1 nm or more and 50 nm or less, 1 nm or more and 30 nm or less, or 1 nm or more and 10 nm or less. In the present embodiment, aluminum oxide is used as the metal oxide layer 130. Aluminum oxide has a high barrier property against gas. In the present embodiment, the aluminum oxide used as the metal oxide layer 130 blocks hydrogen and oxygen released from the base film 120 and suppresses the released hydrogen and oxygen from reaching the oxide semiconductor layer 140.

For example, the thickness of the oxide semiconductor layer 140 is 10 nm or more and 100 nm or less, 15 nm or more and 70 nm or less, or 20 nm or more and 40 nm or less. In the present embodiment, an oxide containing indium (In) and gallium (Ga) is used as the oxide semiconductor layer 140. The oxide semiconductor layer 140 before OS annealing, which will be described later, is amorphous.

In the case where the oxide semiconductor layer 140 is crystallized by OS annealing described later, the oxide semiconductor layer 140 after the film formation and before the OS annealing is preferably amorphous (the oxide semiconductor has few crystal components). The explanation of step S1002 shown in FIG. 3 may be referred to with regards to the deposition method in which the oxide semiconductor layer 140 after the deposition is amorphous.

As shown in FIG. 15 and FIG. 17, a pattern of the oxide semiconductor layer 140 is formed ("Forming OS1 Pattern" in step S2003 of FIG. 15). Although not shown, a resist mask is formed on the oxide semiconductor layer 140, and the oxide semiconductor layer 140 is etched using the resist mask. Wet etching may be used, or dry etching may be used as the etching of the oxide semiconductor layer 140. The etching can be performed using an acidic etchant as the wet etching. For example, oxalic acid or hydrofluoric acid can be used as the etchant.

Next, after the pattern of the oxide semiconductor layer 140 is formed, a heat treatment (OS annealing) is performed on the oxide semiconductor layer 140 ("Annealing for OS1" in step S2004 of FIG. 15). In the present embodiment, the oxide semiconductor layer 140 is crystallized by the OS annealing. In addition, the crystallized oxide semiconductor layer is referred to as the oxide semiconductor layer 144.

As shown in FIG. 15 and FIG. 18, a pattern of the metal oxide layer 130 is formed ("AlOx pattern formation" in step S2005 of FIG. 15). The metal oxide layer 130 is etched using the crystallized oxide semiconductor layer 144 as a mask. Wet etching may be used, or dry etching may be used as the etching of the metal oxide layer 130. For example, dilute hydrofluoric acid (DHF) is used for the wet etching. The crystallized oxide semiconductor layer 144 has etching resistance to dilute hydrofluoric acid as compared with the oxide semiconductor layer 140, which is amorphous. Therefore, the metal oxide layer 130 can be etched using the oxide semiconductor layer 144 as a mask. As a result, the photolithography step can be omitted.

The steps shown in step S2006 to step S2016 shown in FIG. 15 are the same as step S1005 to step S1015 shown in FIG. 3, and therefore, the following explanation is omitted. The semiconductor device 10 shown in FIG. 14 can be formed by passing through the step S2006 to step S2016.

In the semiconductor device 10 manufactured by the above-described manufacturing method, it is possible to obtain electrical properties having a mobility of 30 $cm^2/Vs$ or more, 35 $cm^2/Vs$ or more, or 40 $cm^2/Vs$ or more in a range where the channel length L of the channel area 144CH is 2 μm or more and 4 μm or less and the channel width of the channel area 144CH is 2 μm or more and 25 μm or less. The mobility in the present embodiment means a field-effect mobility in a saturated area of the semiconductor device 10, and it means the maximum value of the field-effect mobility in an area where a potential difference (Vd) between the source electrode and the drain electrode is greater than a value (Vg−Vth) obtained by subtracting a threshold voltage (Vth) of the semiconductor device 10 from a voltage (Vg) supplied to the gate electrode.

In the semiconductor device 10 manufactured by the above-described manufacturing method, the oxide semiconductor layer 162 with light transmittance can be used as the gate wiring and the gate electrode 164GE. As a result, the light transmittance of the semiconductor device 10 can be improved. Applying the semiconductor device 10 to the display device makes it possible to improve the light transmittance of the display device.

First Modification

In the present modification, a semiconductor device manufactured by a method other than that of the second embodiment will be described. The configuration of the semiconductor device of the present modification is the same as that of the semiconductor device 10 described in the second embodiment. The present modification will be described by focusing on differences from the second embodiment.

Figure 19:
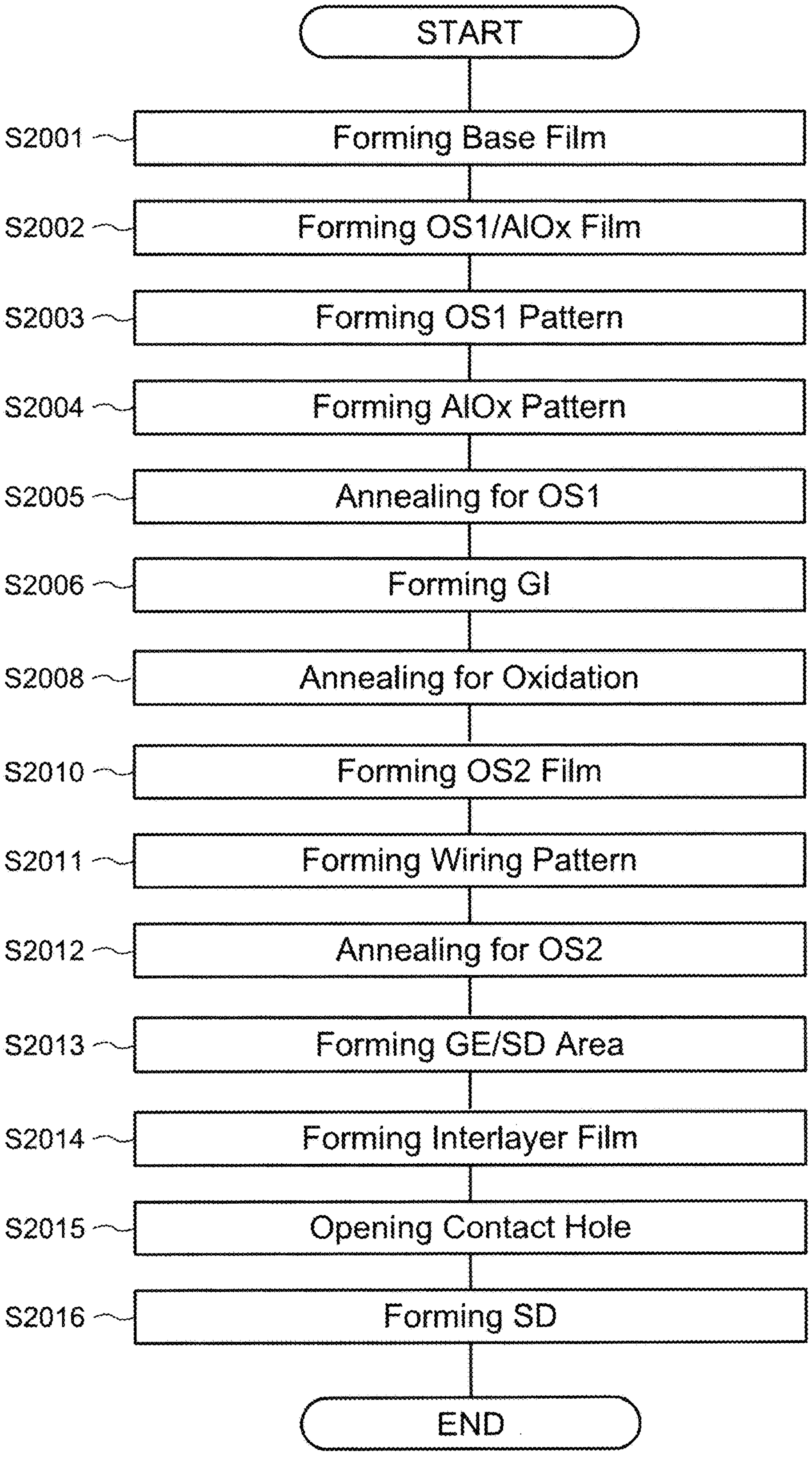
FIG. 19 is a sequence diagram showing a manufacturing method of a semiconductor device according to an embodiment of the present invention.

FIG. 19 is a sequence diagram showing a manufacturing method of a semiconductor device according to an embodiment of the present invention. As shown in FIG. 19, in the present modification, two steps, step S2007 (Forming AlOx Film) and step S2009 (Removing AlOx) shown in FIG. 15 are omitted. That is, in the present embodiment, after the gate insulating layer 150 is formed, annealing for oxidation is performed as it is. Oxygen released from the gate insulating layer 150 is supplied to the oxide semiconductor layer 140 by the annealing for oxidation, and the oxygen defect contained in the oxide semiconductor layer 140 is repaired. Since the role of the metal oxide layer 130 in this case is the same as that of the first embodiment, the description thereof will be omitted.

In the semiconductor device 10 manufactured by the manufacturing method of the present modification, it is possible to obtain electrical properties having a mobility of 30 $cm^2/Vs$ or more, 35 $cm^2/Vs$ or more, or 40 $cm^2/Vs$ or more in a range where the channel length L of the channel area 144CH is 2 μm or more and 4 μm or less and the channel width of the channel area 144CH is 2 μm or more and 25 μm or less. The definition of the field-effect mobility in the present embodiment is the same as that in the first embodiment.

Second Modification

In the present modification, a semiconductor device manufactured by a method other than that of the first embodiment will be described. The configuration of the semiconductor device of the present modification is the same as that of the semiconductor device 10 described in the first embodiment. The present modification will be described by focusing on differences from the first embodiment.

Figure 20:
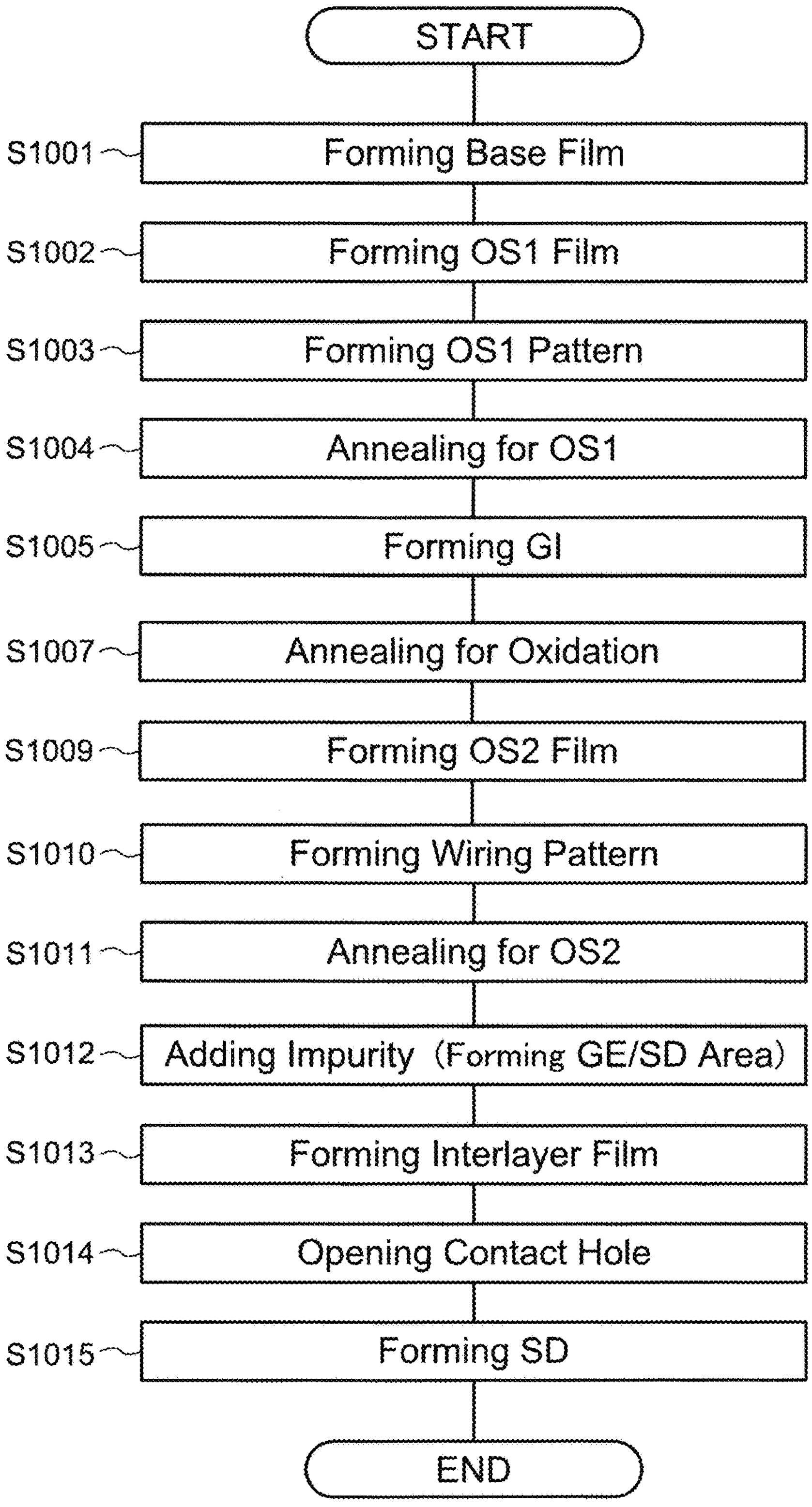
FIG. 20 is a sequence diagram showing a manufacturing method of a semiconductor device according to an embodiment of the present invention.

FIG. 20 is a sequence diagram showing a manufacturing method of a semiconductor device according to an embodiment of the present invention. As shown in FIG. 20, in the present modification, two steps, step S1006 (Forming AlOx Film) and step S1008 (Removing AlOx) shown in FIG. 3 are omitted. That is, in the present embodiment, after the gate insulating layer 150 is formed, annealing for oxidation is performed as it is. Oxygen released from the gate insulating layer 150 is supplied to the oxide semiconductor layer 140 by the annealing for oxidation, and the oxygen defect contained in the oxide semiconductor layer 140 is repaired. Since the role of the metal oxide layer 130 in this case is the same as that of the first embodiment, the description thereof will be omitted.

Third Modification

In the present modification, a semiconductor device manufactured by a method other than that of the first embodiment will be described. The present modification will be described by focusing on differences from the first embodiment.

Configuration of Semiconductor Device 10

The configuration of the semiconductor device 10 according to the present modification is similar to that of the semiconductor device 10 of the first embodiment, but is different from that of the semiconductor device 10 of the first embodiment in that a metal oxide layer 192 is arranged between the gate insulating layer 150 and the gate electrode 164GE (the oxide conductive layer 164). In the following description, the same configuration as in the first embodiment will be omitted, and differences from the first embodiment will be mainly described.

Figure 21:
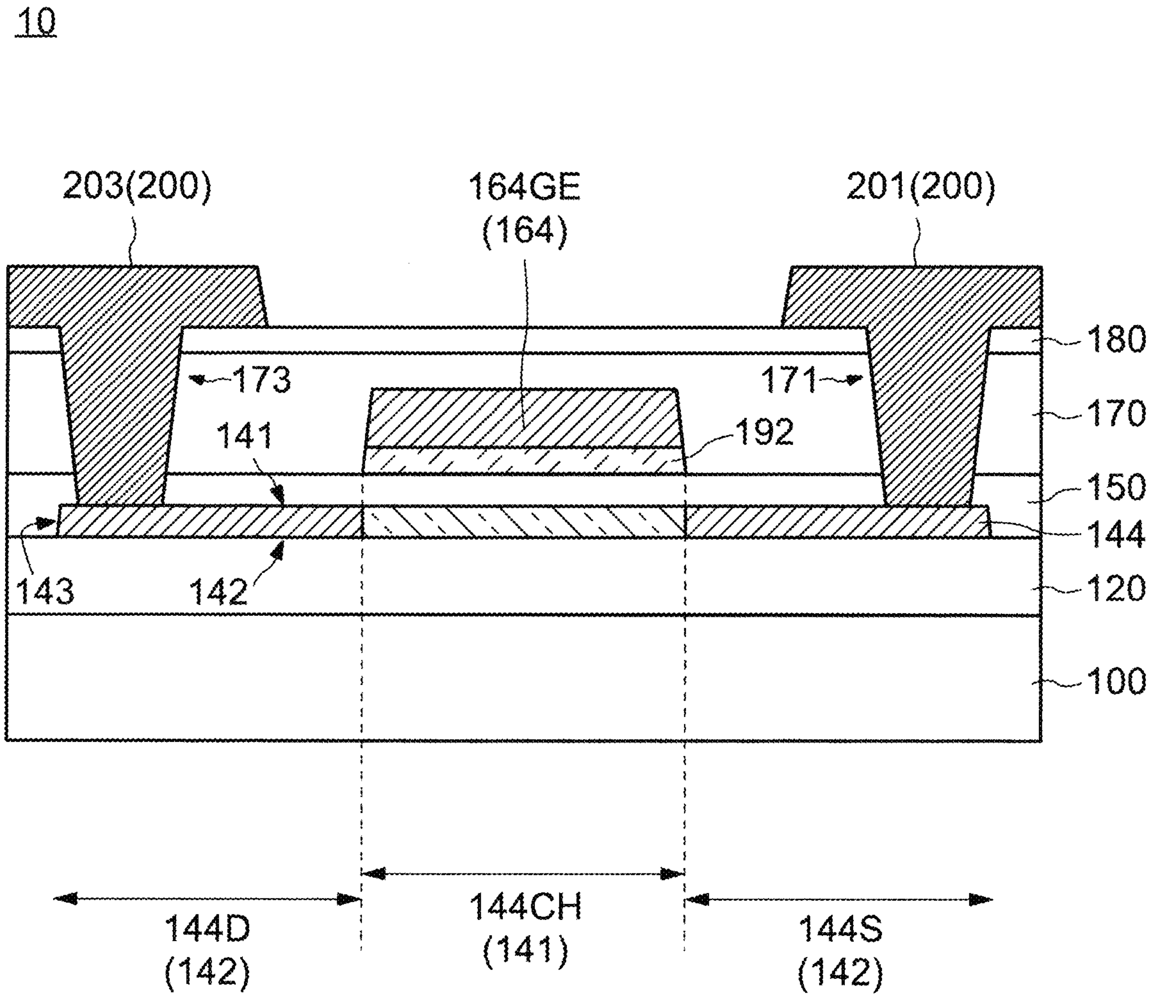
FIG. 21 is a cross-sectional view showing an outline of a semiconductor device according to an embodiment of the present invention.

FIG. 21 is a cross-sectional view showing an outline of a semiconductor device according to an embodiment of the present invention. As shown in FIG. 21, the semiconductor device 10 includes the base film 120, the oxide semiconductor layer 144, the gate insulating layer 150, the metal oxide layer 192, the gate electrode 164GE, the insulating layers 170 and 180, the source electrode 201, and the drain electrode 203.

The metal oxide layer 192 is arranged on the gate insulating layer 150. The metal oxide layer 192 is in contact with the gate insulating layer 150. The gate electrode 164GE is arranged on the metal oxide layer 192. The gate electrode 164GE is in contact with the metal oxide layer 192. A surface of a main surface of the metal oxide layer 192 that is in contact with the gate insulating layer 150 is referred to as a lower surface. An end portion of the gate electrode 164GE is substantially the same as an end portion of the metal oxide layer 192.

Since the planar configuration of the semiconductor device 10 is the same as that of FIG. 2, the illustration is omitted, and the planar pattern of the metal oxide layer 192 is substantially the same as the planar pattern of the gate electrode 164GE in a plan view. Referring to FIG. 21, the lower surface of the gate electrode 164GE is covered with the metal oxide layer 192. In particular, in the present modification, all of the lower surface of the gate electrode 164GE is covered with the metal oxide layer 192.

Manufacturing Method of Semiconductor Device 10

Figure 22:
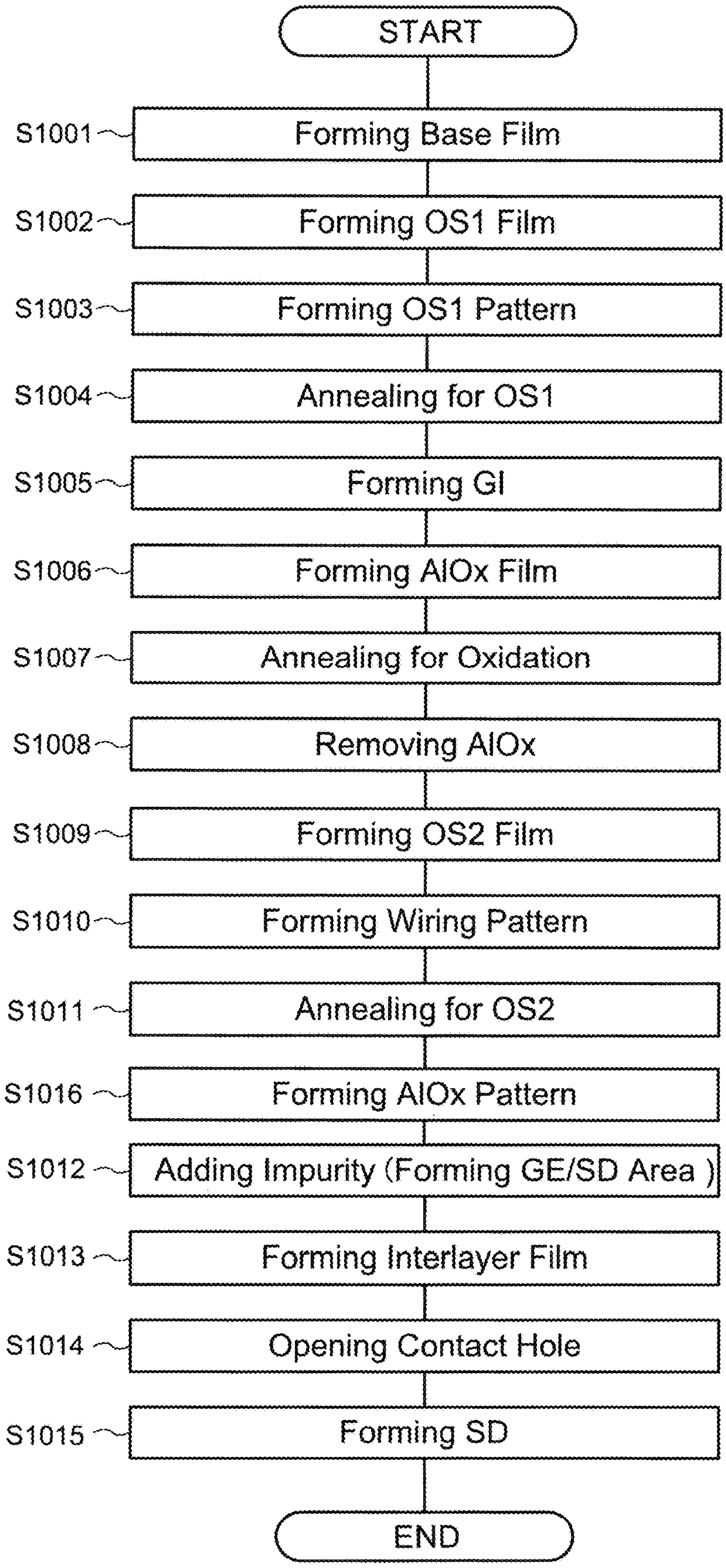
FIG. 22 is a sequence diagram showing a manufacturing method of a semiconductor device according to an embodiment of the present invention.

FIG. 22 is a sequence diagram showing a manufacturing method of a semiconductor device according to an embodiment of the present invention. As shown in FIG. 22, in the present modification, step S1016 is added between the two steps of step S1011 and step S1012 shown in FIG. 3. That is, in the present modification, the oxide semiconductor layer 160 is crystallized by performing OS annealing, the oxide conductive layer 164 having a polycrystalline structure is formed, and then the metal oxide layer 190 is patterned using the oxide conductive layer 164 as a mask. As a result, the metal oxide layer 192 can be formed.

Fourth Modification

In the present modification, a semiconductor device manufactured by a method other than that of the second embodiment will be described. The present modification will be described by focusing on differences from the second embodiment.

Configuration of Semiconductor Device 10

The configuration of the semiconductor device 10 according to the present modification is similar to that of the semiconductor device 10 of the second embodiment, but is different from that of the semiconductor device 10 of the second embodiment in that the metal oxide layer 192 is arranged between the gate insulating layer 150 and the oxide conductive layer 164.

Figure 23:
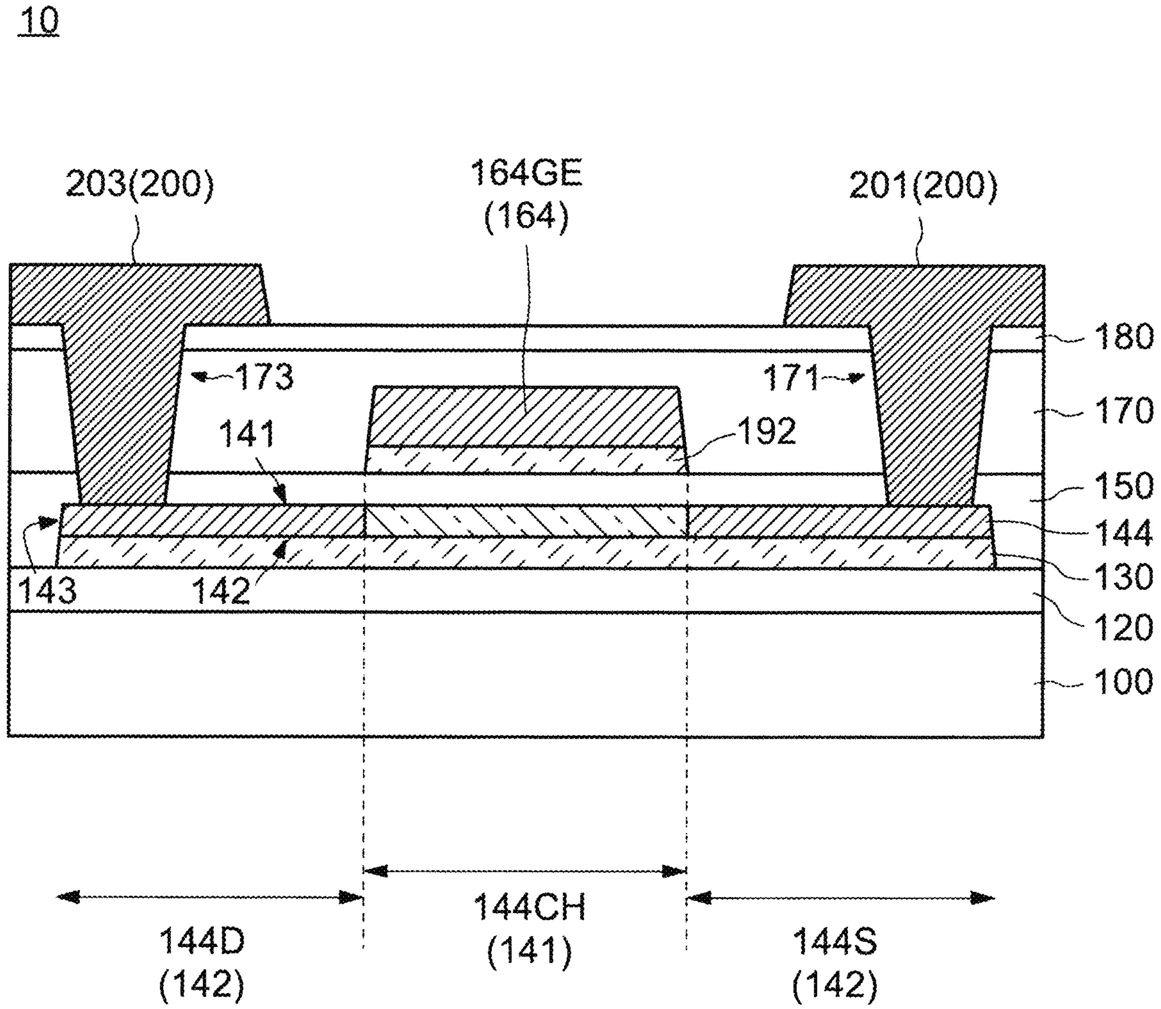
FIG. 23 is a cross-sectional view showing an outline of a semiconductor device according to an embodiment of the present invention.

FIG. 23 is a cross-sectional view showing an outline of a semiconductor device according to an embodiment of the present invention. As shown in FIG. 23, the semiconductor device 10 includes the base film 120, the metal oxide layer 130, the oxide semiconductor layer 144, the gate insulating layer 150, the metal oxide layer 192, the gate electrode 164GE, the insulating layers 170 and 180, the source electrode 201, and the drain electrode 203.

The metal oxide layer 192 is arranged on the gate insulating layer 150. The metal oxide layer 192 is in contact with the gate insulating layer 150. The gate electrode 164GE is arranged on the metal oxide layer 192. The gate electrode 164GE is in contact with the metal oxide layer 192. A surface of the main surface of the metal oxide layer 192 that is in contact with the gate insulating layer 150 is referred to as a lower surface. An end portion of the gate electrode 164GE is substantially the same as an end portion of the metal oxide layer 192.

Since the planar configuration of the semiconductor device 10 is the same as that of FIG. 2, the illustration is omitted, and the planar pattern of the metal oxide layer 192 is substantially the same as the planar pattern of the gate electrode 164GE in a plan view. Referring to FIG. 23, the lower surface of the gate electrode 164GE is covered with the metal oxide layer 192. In particular, in the present modification, all of the lower surface of the gate electrode 164GE is covered with the metal oxide layer 192.

Manufacturing Method of Semiconductor Device 10

Figure 24:
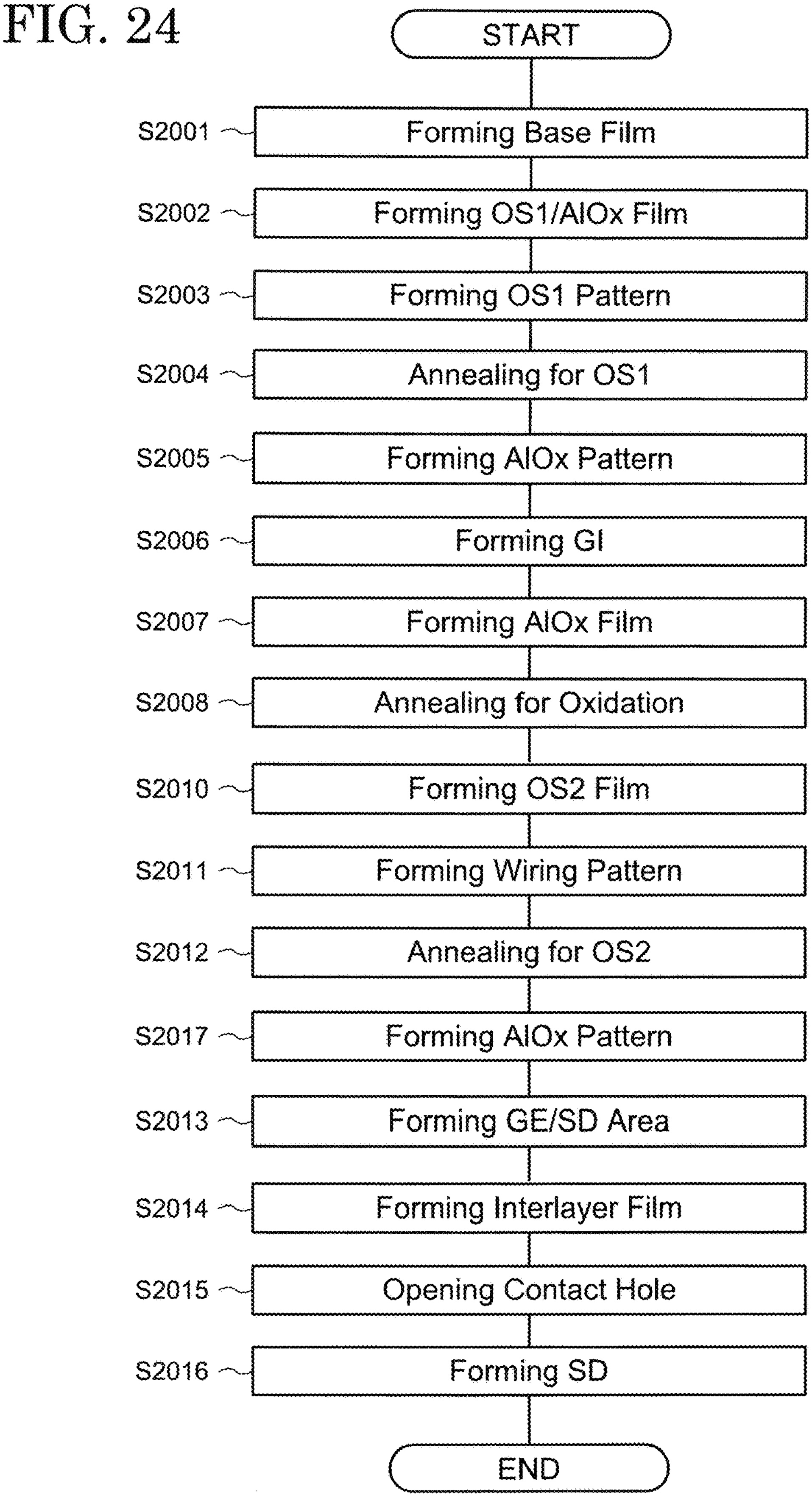
FIG. 24 is a sequence diagram showing a manufacturing method of a semiconductor device according to an embodiment of the present invention.

FIG. 24 is a sequence diagram showing a manufacturing method of semiconductor device according to an embodiment of the present invention. As shown in FIG. 24, in the present modification, step S2017 is added between the two steps of step S2012 and step S2013 shown in FIG. 15. That is, in the present modification, the oxide semiconductor layer 160 is crystallized by performing OS annealing, the oxide semiconductor layer 162 having a polycrystalline structure is formed, and then the metal oxide layer 190 is patterned using the oxide semiconductor layer 162 as a mask. As a result, the metal oxide layer 192 can be formed.

Fifth Modification

Although the case of using the oxide conductive layer 164 as the gate electrode 164GE and a gate wiring 164GL has been described in the first and second embodiment, the present invention is not limited to this. A conductive layer may be stacked in contact with the oxide conductive layer 164. For example, the materials described in the source electrode and the drain electrode 200 may be used as a conductive layer. It is preferable to arrange the conductive layer in contact with the oxide conductive layer 164 because wiring resistance can be further reduced. In the case where the conductive layer is stacked in contact with the oxide conductive layer 164, a width of the conductive layer is preferably smaller than a width of wiring of the oxide conductive layer 164. As a result, it is possible to suppress a decrease in the light transmittance of the semiconductor device.

Third Embodiment

A display device using a semiconductor device according to an embodiment of the present invention will be described with reference to FIG. 25 to FIG. 30. In the embodiment described below, a configuration in which the semiconductor device 10 described in the first embodiment is applied to a circuit of a liquid crystal display device will be described.

Outline of Display Device 20

Figure 25:
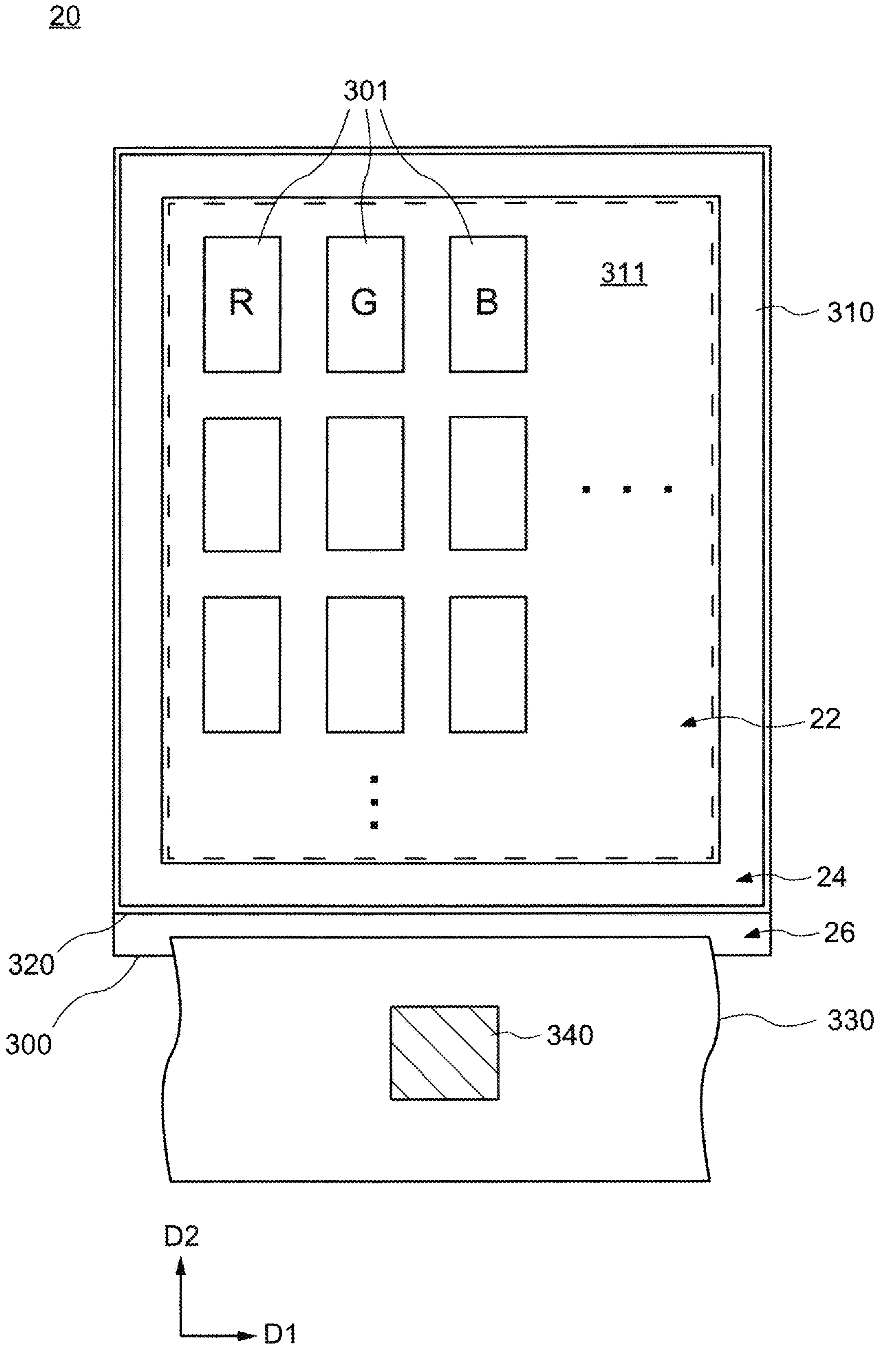
FIG. 25 is a plan view showing an outline of a display device according to an embodiment of the present invention.

FIG. 25 is a plan view showing an outline of a display device 20 according to an embodiment of the present invention. As shown in FIG. 25, the display device 20 includes an array substrate 300, a seal part 310, a counter substrate 320, and a flexible printed circuit board 330 (FPC 330), and an IC chip 340. The array substrate 300 and the counter substrate 320 are bonded together by the seal part 310. A plurality of pixel circuits 301 is arranged in a matrix in a liquid crystal area 22 surrounded by the seal part 310. The liquid crystal area 22 is an area overlapping a liquid crystal element 311 described later in a plan view.

A seal area 24 arranged with the seal part 310 is an area around the liquid crystal area 22. The FPC 330 is arranged in a terminal area 26. The terminal area 26 is an area where the array substrate 300 is exposed from the counter substrate 320 and is arranged on the outside of the seal area 24. The outside of the seal area 24 means the outer side of the area arranged with the seal part 310 and the area surrounded by the seal part 310. The IC chip 340 is arranged on the FPC 330. The IC chip 340 supplies a signal for driving the pixel circuit 301.

Circuit Configuration of Display Device 20

Figure 26:
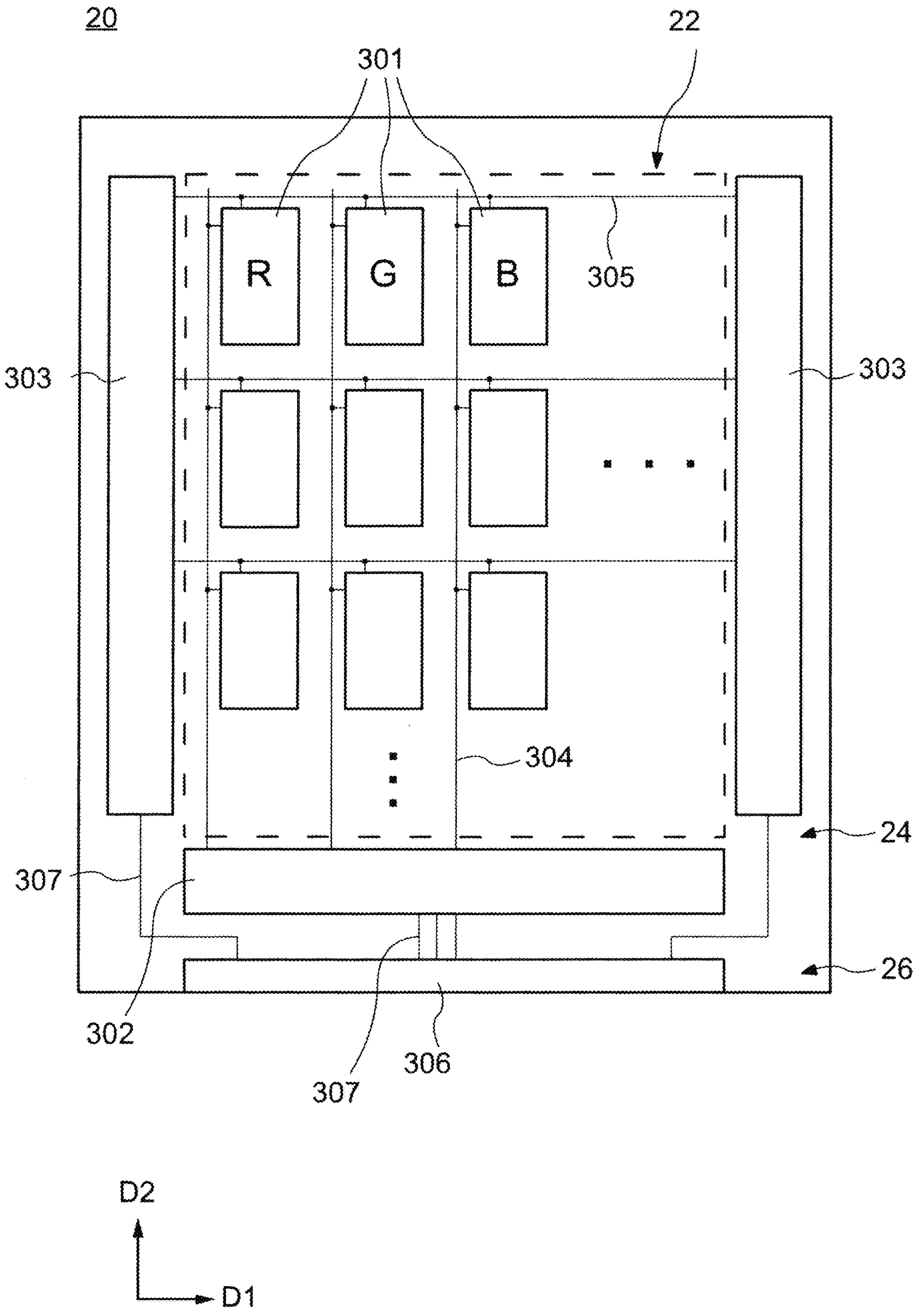
FIG. 26 is a block diagram showing a circuit configuration of a display device according to an embodiment of the present invention.

FIG. 26 is a block diagram showing a circuit configuration of a display device according to an embodiment of the present invention. As shown in FIG. 26, a gate driver circuit 303 is arranged at a position in contact with the liquid crystal area 22 on which the pixel circuit 301 is arranged in the second direction D2 (column direction), and a source driver circuit 302 is arranged at a position adjacent to the liquid crystal area 22 in the first direction D1 (row direction). The source driver circuit 302 and the gate driver circuit 303 are arranged in the seal area 24. However, the area where the source driver circuit 302 and the gate driver circuit 303 are arranged is not limited to the seal area 24, and any area may be used as long as it is outside the area where the pixel circuit 301 is arranged.

A source wiring 304 extends from the source driver circuit 302 in the second direction D2 and is connected to the plurality of pixel circuits 301 arranged in the second direction D2. The gate wiring 164GL extends from the gate driver circuit 303 in the first direction D1 and is connected to the plurality of pixel circuits 301 arranged in the first direction D1.

A terminal part 306 is arranged in the terminal area 26. The terminal part 306 and the source driver circuit 302 are connected by a connecting wiring 307. Similarly, the terminal part 306 and the gate driver circuit 303 are connected by the connecting wiring 307. Since the FPC 330 is connected to the terminal part 306, an external device to which the FPC 330 is connected is connected to the display device 20, and each pixel circuit 301 arranged in the display device 20 is driven by a signal from the external device.

The semiconductor device 10 according to the first embodiment and the second embodiment is used as a transistor included in the pixel circuit 301, the source driver circuit 302, and the gate driver circuit 303.

Pixel Circuit 301 of Display Device 20

Figure 27:
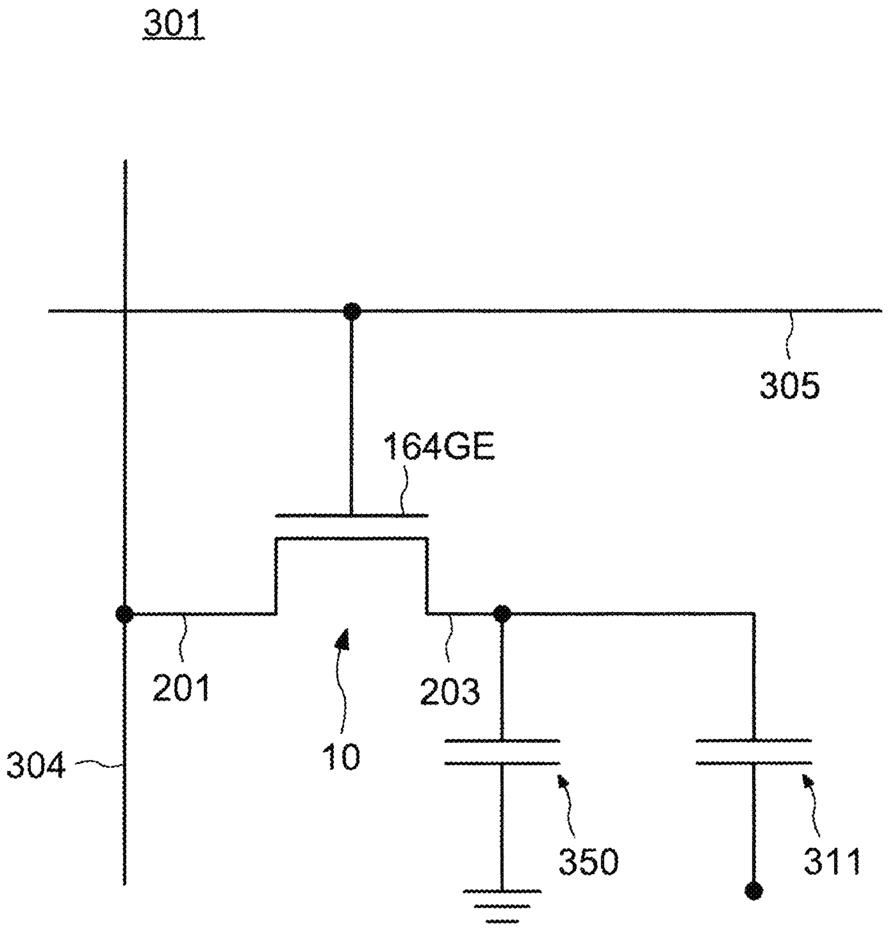
FIG. 27 is a circuit diagram showing a pixel circuit of a display device according to an embodiment of the present invention.

FIG. 27 is a circuit diagram showing a pixel circuit of the display device 20 according to an embodiment of the present invention. As shown in FIG. 27, the pixel circuit 301 includes elements such as the semiconductor device 10, a holding capacity 350, and the liquid crystal element 311. The semiconductor device 10 includes the gate electrode 164GE, the source electrode 201, and the drain electrode 203. The gate electrode 164GE is connected to a gate wiring 305. The source electrode 201 is connected to the source wiring 304. The drain electrode 203 is connected to the holding capacity 350 and the liquid crystal element 311. In the present embodiment, for convenience of explanation, an electrode indicated by a reference sign “201” may be referred to as a source electrode, an electrode indicated by a reference sign “203” may be referred to as a drain electrode, but the electrode indicated by the reference sign “201” may function as a drain electrode, and the electrode indicated by the reference sign “203” may function as a source electrode.

Configuration of Display Device 20

Figure 28:
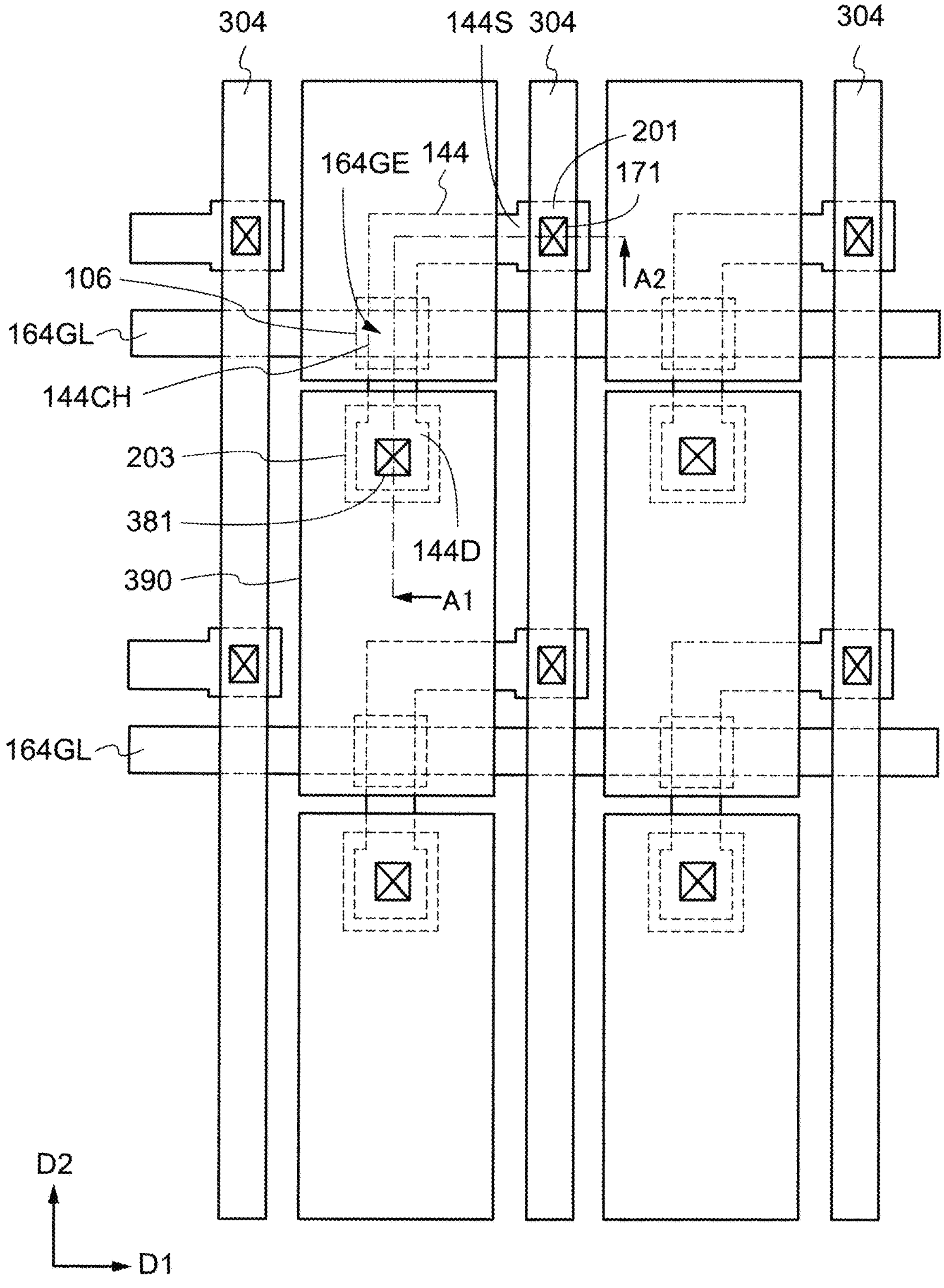
FIG. 28 is a cross-sectional view showing an outline of a display device according to an embodiment of the present invention.
Figure 29:
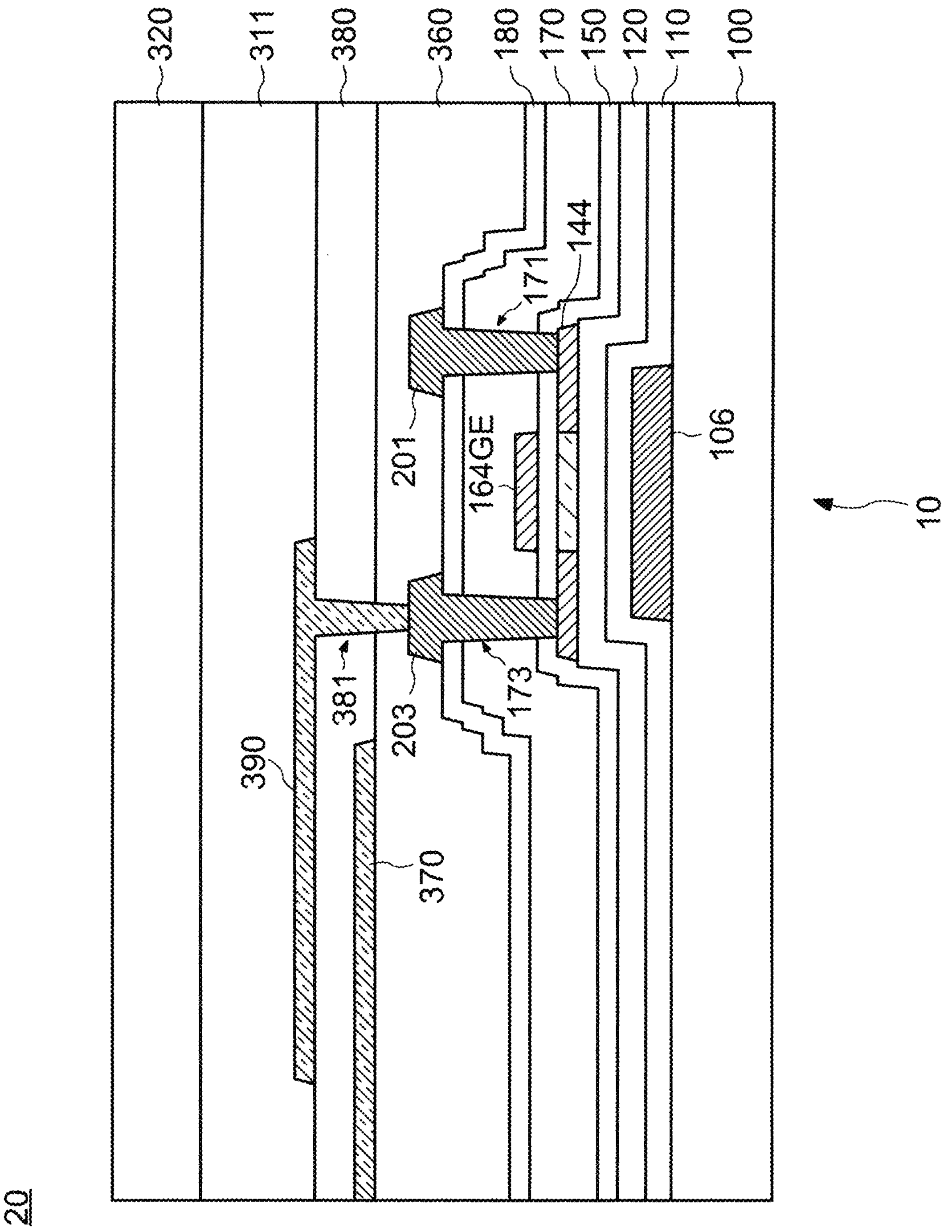
FIG. 29 is a plan view showing an outline of a display device according to an embodiment of the present invention.

FIG. 28 is a plan view of the display device 20 according to an embodiment of the present invention. FIG. 29 is a cross-sectional view of the display device 20 according to an embodiment of the present invention. As shown in FIG. 28 and FIG. 29, the display device 20 is the display device 20 to which the semiconductor device 10 is applied. In addition, in FIG. 28, an illustration of a common electrode is omitted.

As shown in FIG. 28 and FIG. 29, a light-shielding layer 106 is arranged on a substrate 100. The light shielding layer 106 is in a floating state. The explanation of the source electrode 201 and the drain electrode 203 may be referred to with regards to the materials of the light-shielding layer 106. In addition, the oxide semiconductor layer 144 is arranged on the light-shielding layer 106. The gate wiring 164GL extends along the first direction D1 on the oxide semiconductor layer 144. An area of the gate wiring 164 GL that overlaps the oxide semiconductor layer 144 functions as the gate electrode 164GE. The source wiring 304 and the drain electrode 203 are arranged on the gate wiring 164GL. The source wiring 304 is connected to the source area 144S via the opening 171. An area of the source wiring 304 connected to the oxide semiconductor layer 144 functions as the source electrode 201. In addition, the drain electrode 203 is connected to the drain area 144D via the opening 173. As shown in FIG. 29, since the opening 173 and an opening 381 overlap each other, the opening 173 is not illustrated in FIG. 28.

An insulating layer 360 is arranged on the source electrode 201 and the drain electrode 203. A common electrode 370 commonly arranged in a plurality of pixels is arranged on the insulating layer 360. An insulating layer 380 is arranged on the common electrode 370. The opening 381 is arranged in the insulating layers 360 and 380. A pixel electrode 390 is arranged on the insulating layer 380 and inside the opening 381. The pixel electrode 390 is connected to the drain electrode 203.

Figure 30:
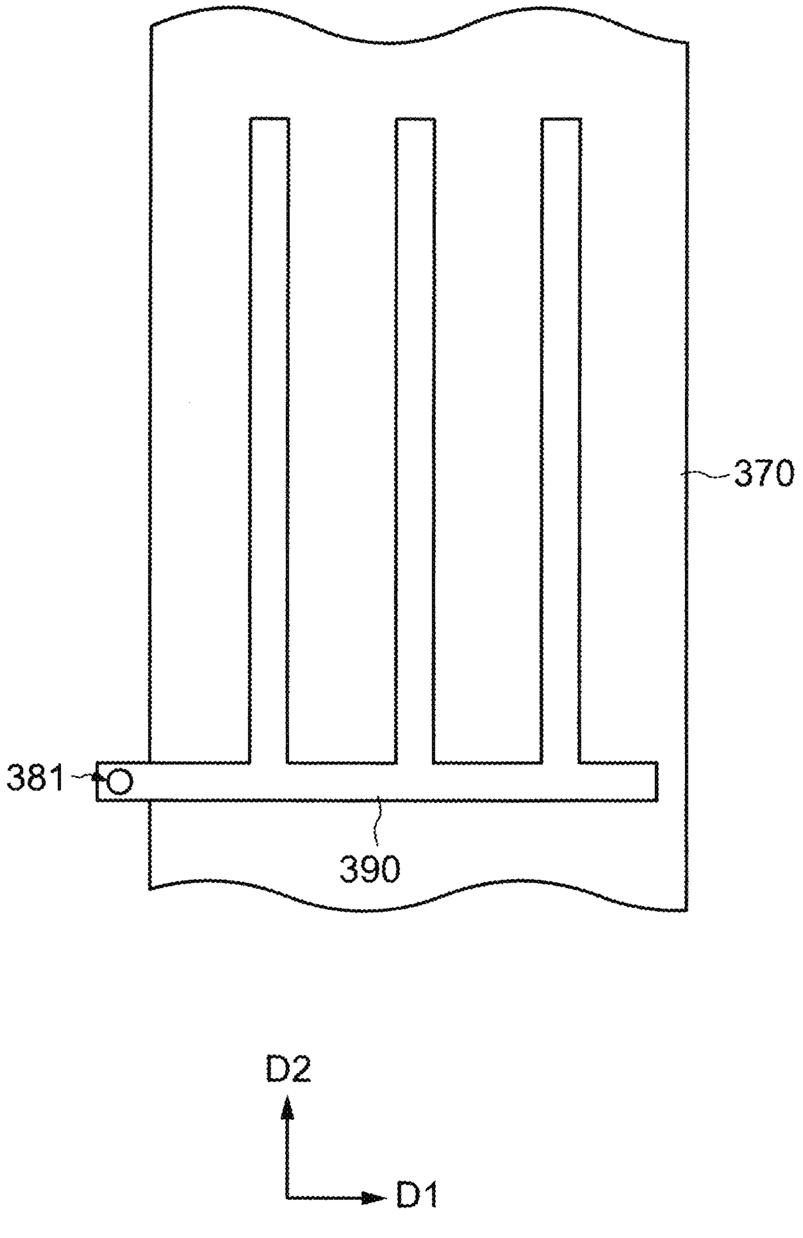
FIG. 30 is a plan view of a pixel electrode and a common electrode of a display device according to an embodiment of the present invention.

FIG. 30 is a plan view of a pixel electrode and a common electrode of a display device according to an embodiment of the present invention. As shown in FIG. 30, the common electrode 370 has an overlapping area that overlaps the pixel electrode 390 in a plan view and a non-overlapping area that does not overlap the pixel electrode 390. In the case where a voltage is applied between the pixel electrode 390 and the common electrode 370, a lateral electric field is formed from the pixel electrode 390 in the overlapping area toward the common electrode 370 in the non-overlapping area. The lateral electric field causes liquid crystal molecules included in the liquid crystal device 311 to operate, thereby determining the gradation of the pixel.

In the present embodiment, the oxide conductive layer 164 having light transmittance is used as the gate wiring 164GL and the gate electrode 164GE. Therefore, since the area in the gate wiring can transmit light, the aperture ratio of the pixel can be improved. As a result, the light transmittance of the display device can be improved. For example, the display device can be applied to a transparent display in which the background can be visually recognized. In addition, arranging the light-shielding layer 106 in the area overlapping the channel area 144CH makes it possible to suppress the back channel from being irradiated with light.

In the present embodiment, although a configuration in which the semiconductor device 10 is used for the pixel circuit 301 is exemplified, the semiconductor device 10 may be used for a peripheral circuit including the source driver circuit 302 and the gate driver circuit 303.

Fourth Embodiment

The display device 20 using the semiconductor device 10 according to an embodiment of the present invention will be described with reference to FIG. 31 and FIG. 32. In the present embodiment, a configuration in which the semiconductor device 10 described in the first embodiment is applied to a circuit of the organic EL display device will be described. Since the outline and the circuit configuration of the display device 20 are the same as those shown in FIG. 31 and FIG. 32, the description thereof will be omitted.

Pixel Circuit 301 of Display Device 20

Figure 31:
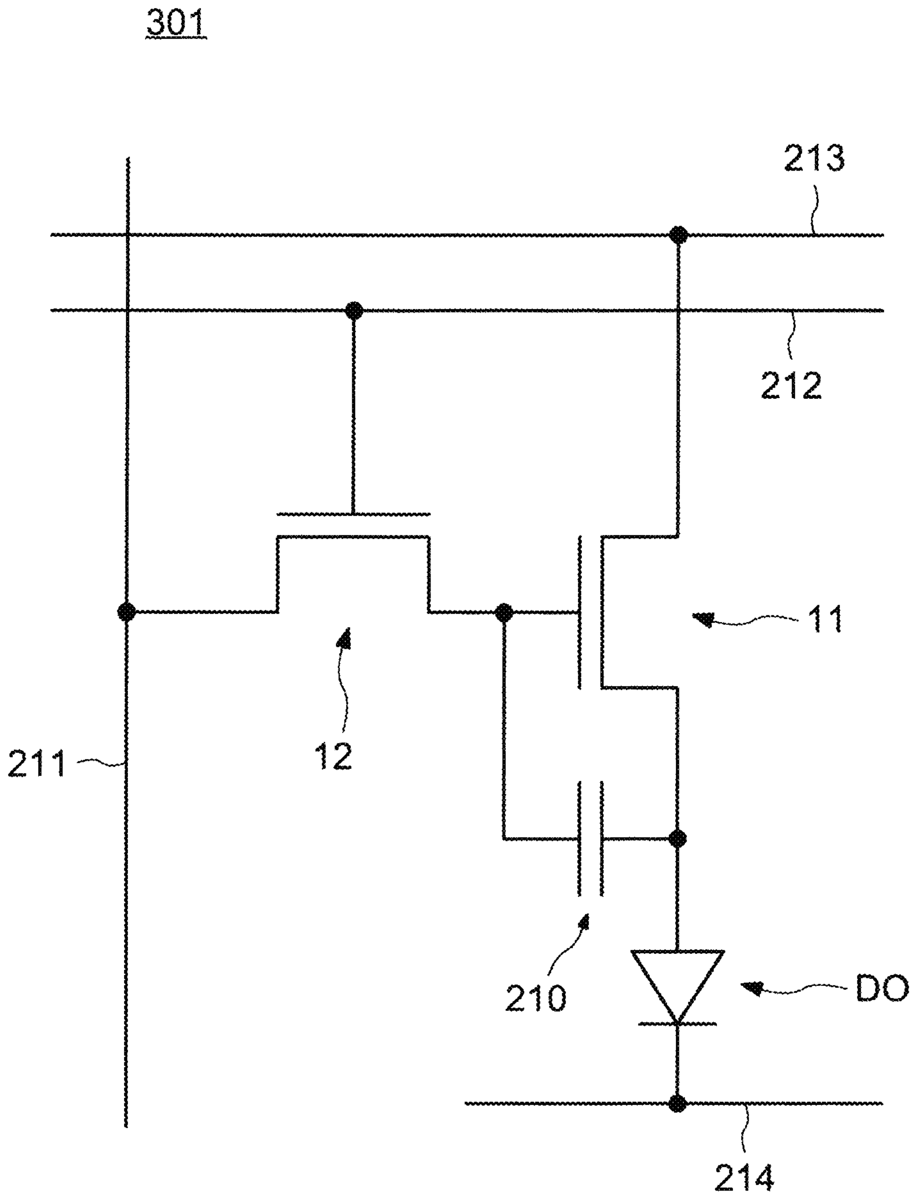
FIG. 31 is a circuit diagram showing a pixel circuit of a display device according to an embodiment of the present invention.

FIG. 31 is a circuit diagram showing a pixel circuit of a display device according to an embodiment of the present invention. As shown in FIG. 31, the pixel circuit 301 includes elements such as a drive transistor 11, a select transistor 12, a holding capacity 210, and a light-emitting element DO. The drive transistor 11 and the select transistor 12 have the same configuration as that of the semiconductor device 10. A source electrode of the select transistor 12 is connected to a signal line 211, and a gate electrode of the select transistor 12 is connected to a gate line 212. A source electrode of the drive transistor 11 is connected to an anode power line 213, and a drain electrode of the drive transistor 11 is connected to one end of the light-emitting element DO. The other end of the light-emitting element DO is connected to a cathode power line 214. A gate electrode of the drive transistor 11 is connected to a drain electrode of the select transistor 12. The holding capacity 210 is connected to the gate electrode and the drain electrode of the drive transistor 11. The signal line 211 is supplied with a gradation signal that determines the emission intensity of the light-emitting element DO. The gate line 212 is supplied with a signal for selecting a pixel row in which the gradation signal is written.

Cross-Sectional Structure of Display Device 20

Figure 32:
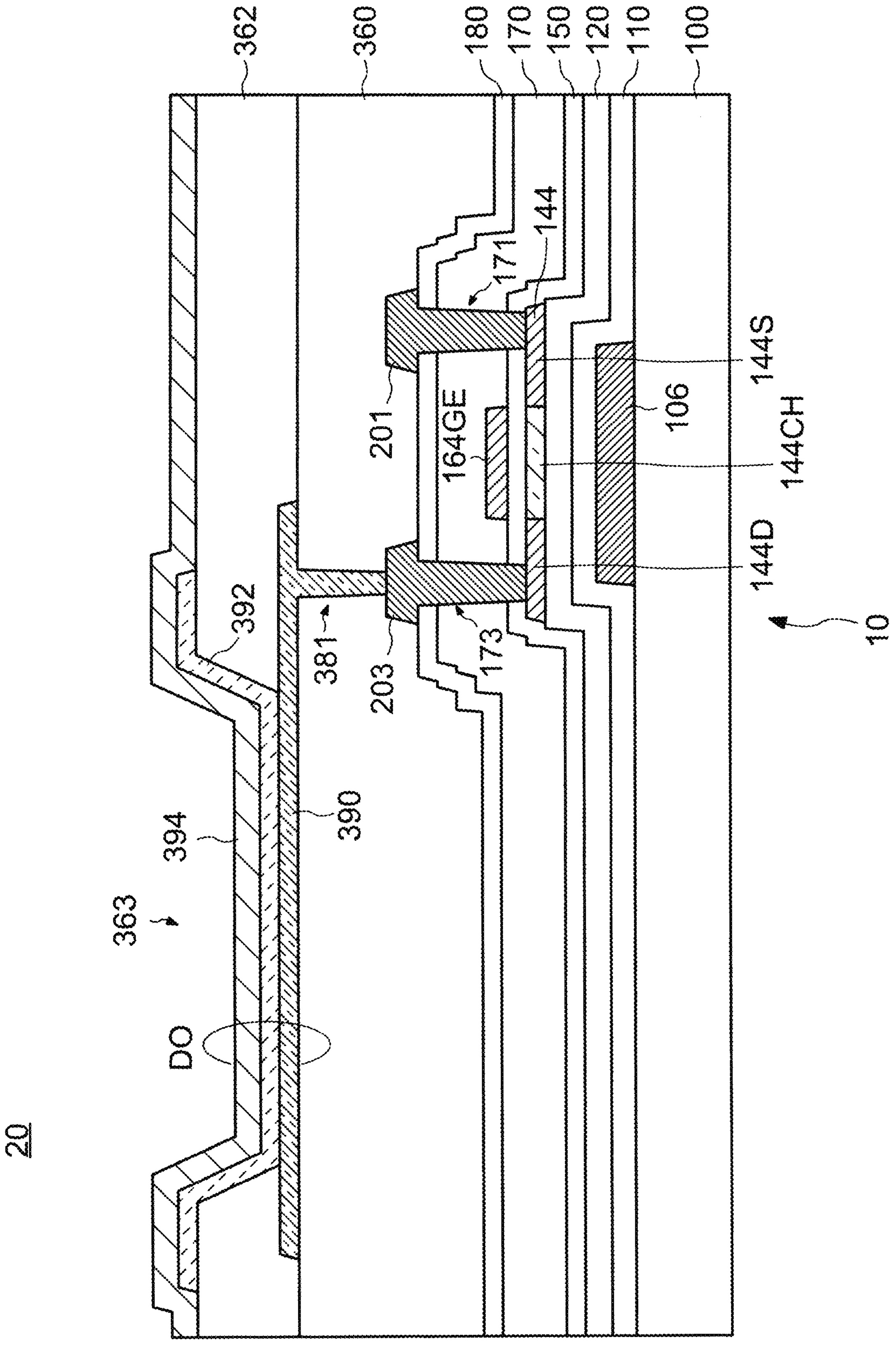
FIG. 32 is a cross-sectional view showing an outline of a display device according to an embodiment of the present invention.

FIG. 32 is a cross-sectional view of the display device 20 according to an embodiment of the present invention. Although the configuration of the display device 20 shown in FIG. 32 is similar to that of the display device 20 shown in FIG. 29, the structure above the insulating layer 360 of the display device 20 in FIG. 32 is different from the structure above the insulating layer 360 of the display device 20 in FIG. 29. Hereinafter, among the configurations of the display device 20 shown in FIG. 32, the same configurations as those of the display device 20 shown in FIG. 29 will be omitted, and differences between the two will be described.

As shown in FIG. 32, the display device 20 has the pixel electrode 390, a light-emitting layer 392, and a common electrode 394 (the light-emitting element DO) above the insulating layer 360. The pixel electrode 390 is arranged on the insulating layer 360 and inside the opening 381. An insulating layer 362 is arranged on the pixel electrode 390. The insulating layer 362 is arranged with an opening 363. The opening 363 corresponds to the light-emitting area. That is, the insulating layer 362 defines a pixel. The light-emitting layer 392 and the common electrode 394 are arranged on the pixel electrode 390 exposed by the opening 363. The pixel electrode 390 and the light-emitting layer 392 are individually arranged for each pixel. On the other hand, the common electrode 394 is commonly arranged for the plurality of pixels. Different materials are used for the light-emitting layer 392 depending on the display color of the pixel.

In the third embodiment and the fourth embodiment, although the configuration in which the semiconductor device described in the first embodiment is applied to the liquid crystal display device and the organic EL display device has been exemplified, the gate wiring and the gate electrode with light transmittance can be formed in any of the display devices 20. Therefore, in the electronic device including the display device an imaging element can be arranged under the display device 20. Since the light transmittance of the display device can be increased, an image can be captured by an imaging element via the display device 20. In addition, the semiconductor device described in the second embodiment may be applied to the liquid crystal display device and the organic EL display device.

In the third embodiment and the fourth embodiment, although the configuration in which the semiconductor device described in the first embodiment is applied to the liquid crystal display device and the organic EL display device has been exemplified, the semiconductor device may be applied to a display device (for example, a self-luminous display device or an electronic paper type display device other than the organic EL display device) other than these display devices. In addition, the semiconductor device 10 can be applied to any display device ranging from small and medium-sized to large-sized without any particular limitation. Furthermore, the semiconductor device described in the second embodiment may be applied to the liquid crystal display device and the organic EL display device.

EXAMPLES

In the present example, simulation results will be described in order to obtain an appropriate thickness of the gate electrode 164GE from the thickness of the gate insulating layer 150 and the acceleration energy of ion-implantation.

In an embodiment of the present invention, the impurity element is added to the oxide semiconductor layer 162, the source area 144S, and the drain area 144D to achieve low resistance. First, a result of verifying the relationship between the thickness of the gate insulating layer and the acceleration energy in the case where ions are implanted into the oxide semiconductor layer via the gate insulating layer will be described.

Simulation Model 1

First, a simulation result of the relationship between the thickness of the gate insulating layer and the acceleration energy in the case where ions are implanted into the oxide semiconductor layer via the gate insulating layer will be described.

Figure 33:
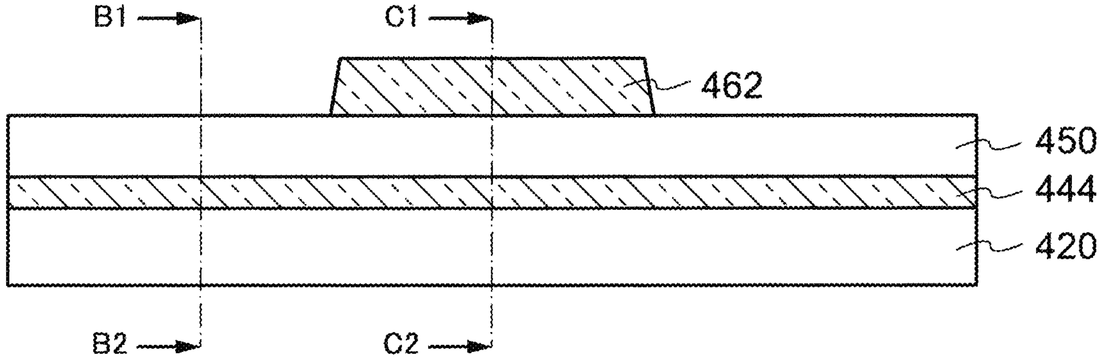
FIG. 33 is a simulation model diagram in an example.

FIG. 33 is a model diagram of a simulation. In FIG. 33, a stacked structure of a base film 420, an oxide semiconductor layer 444, and a gate insulating layer 450 in a line B1-B2 was used as a simulation model. In this simulation model, conditions were set as follows.

Base film: silicon oxide layer (100 nm)

Oxide semiconductor layer: IGZO (30 nm)

Gate insulating layer: silicon oxide layer (50 nm, 100 nm, 150 nm)

Ion Species: Boron (B)

Acceleration Energy: 20 keV, 30 keV, 40 keV

Dose amount of ion: $1\times10^{15}$ $cm^{-2}$

Based on the above simulation model, a simulation was performed in which the boron (B) was implanted into the oxide semiconductor layer via the gate insulating layer at each acceleration energy. Victory Process manufactured by SILVACO Corporation was used as on-software for the simulation.

Figure 34:
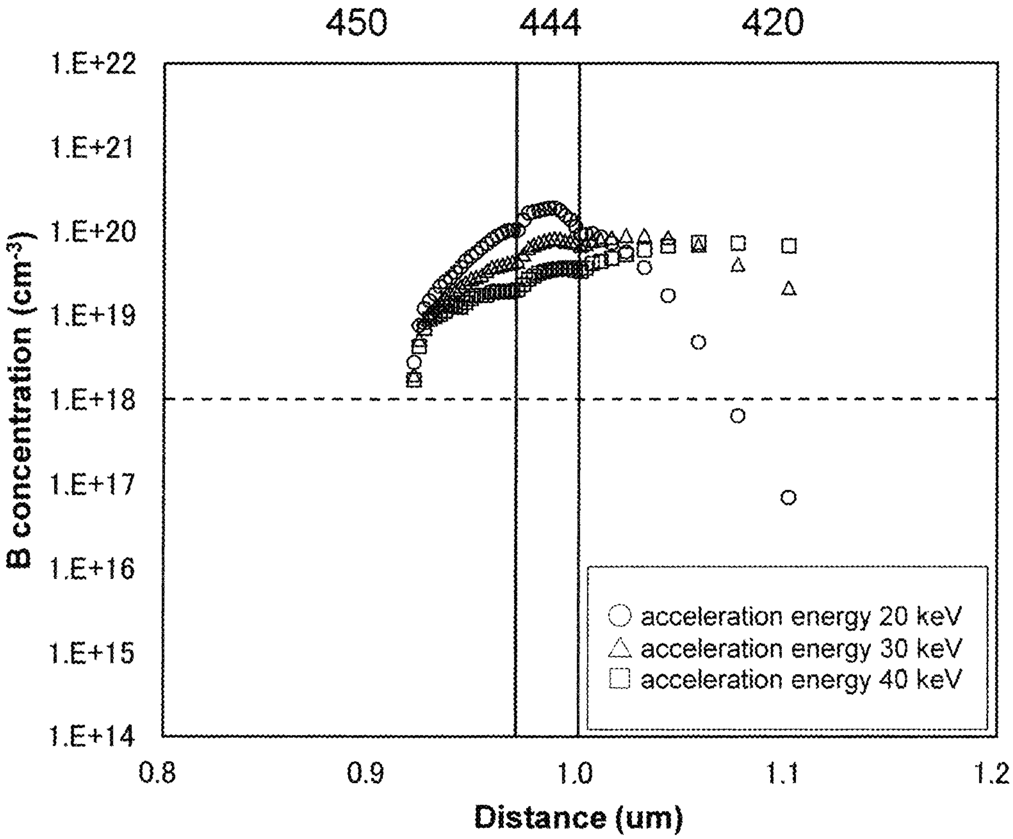
FIG. 34 shows a simulation result when boron is ion-implanted at an acceleration energy of 20 keV, 30 keV, and 40 keV with respect to 50 nm thicknesses of a gate insulating layer.
Figure 35:
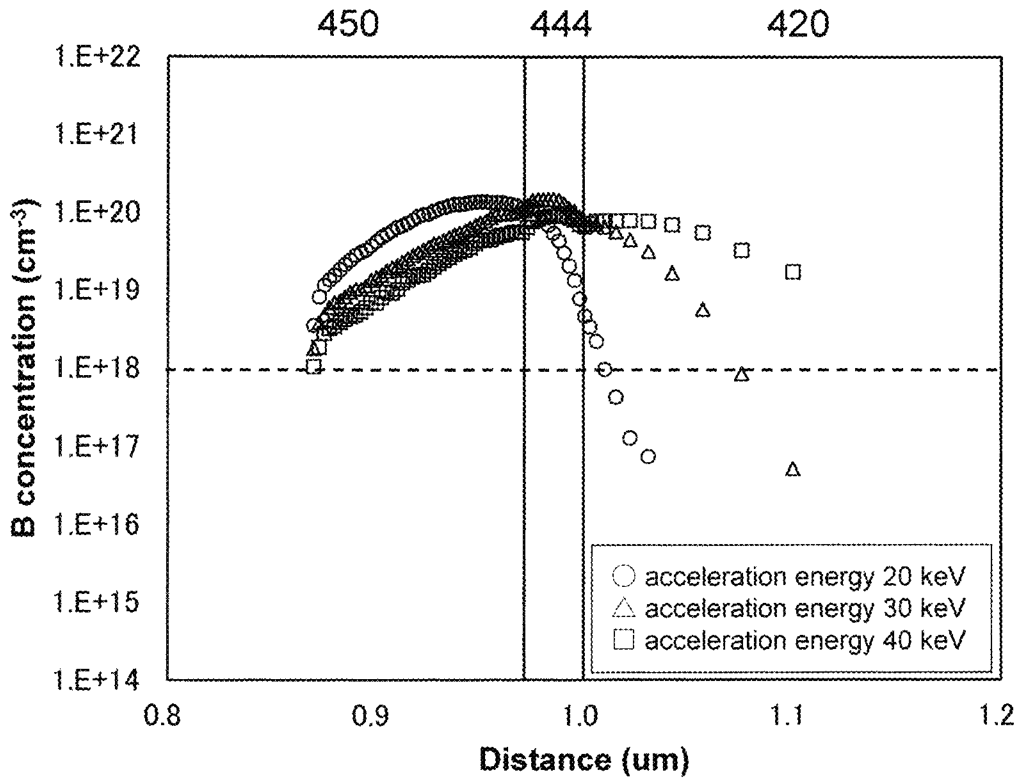
FIG. 35 shows a simulation result when boron is ion-implanted at an acceleration energy of 20 keV, 30 keV, and 40 keV with respect to 100 nm thicknesses of a gate insulating layer.
Figure 36:
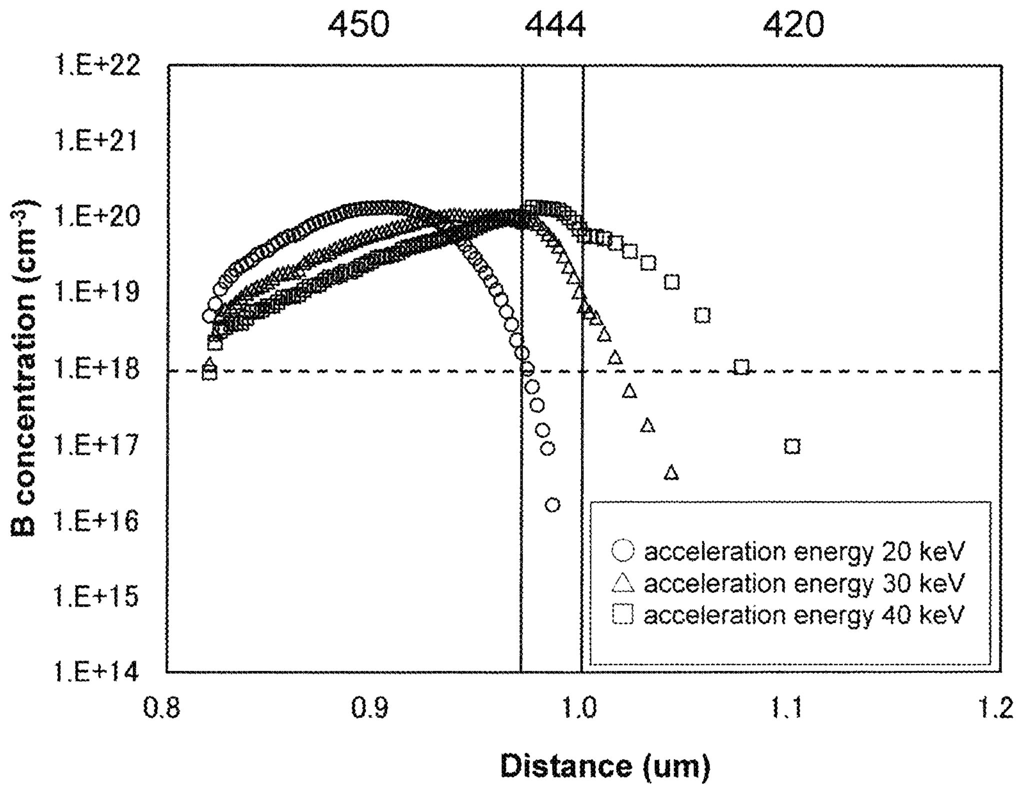
FIG. 36 shows a simulation result when boron is ion-implanted at an acceleration energy of 20 keV, 30 keV, and 40 keV with respect to 150 nm thicknesses of a gate insulating layer.

The simulation results are described below. FIG. 34 shows a simulation result when boron (B) is ion-implanted at an acceleration energy of 20 keV, 30 keV, and 40 keV with respect to 50 nm thicknesses of the gate insulating layer. FIG. 35 shows a simulation result when boron (B) is ion-implanted at an acceleration energy of 20 keV, 30 keV, and 40 keV with respect to 100 nm thicknesses of the gate insulating layer. FIG. 36 shows a simulation result when boron (B) is ion-implanted at an acceleration energy of 20 keV, 30 keV, and 40 keV with respect to 150 nm thicknesses of the gate insulating layer. In the simulation results of FIG. 34 to FIG. 36, the horizontal axis represents the distance (µm), and the vertical axis represents the B concentration ($cm^{-3}$). In this case, in FIG. 34 to FIG. 36, in the case where the concentration of boron (B) is $1\times10^{18}$ $cm^{-3}$ or more at an interface between the oxide semiconductor layer 444 and the base film 420, it is assumed that boron (B) is satisfactorily added to the oxide semiconductor layer 444.

As shown in FIG. 34, in the case where the thickness of the gate insulating layer 450 was 50 nm, the boron (B) concentration was $1\times10^{18}$ $cm^{-3}$ or more at the interface between the oxide semiconductor layer 444 and the base film 420 in any case where the acceleration energy was 20 keV, 30 keV, and 40 keV. In addition, as shown in FIG. 35, in the case where the thickness of the gate insulating layer 450 was 100 nm, the boron (B) concentration was $1\times10^{18}$ $cm^{-3}$ or more at the interface between the oxide semiconductor layer 444 and the base film 420 in any case where the acceleration energy was 20 keV, 30 keV, and 40 keV. As shown in FIG. 36, in the case where the thickness of the gate insulating layer 450 was 150 nm, the boron (B) concentration was less than $1\times10^{18}$ $cm^{-3}$ at the interface between the oxide semiconductor layer 444 and the base film 420 when the acceleration energy was 20 keV. The boron (B) concentration was $1\times10^{18}$ $cm^{-3}$ or more at the interface between the oxide semiconductor layer 444 and the base film 420 in the case where the acceleration energy was 30 keV and 40 keV.

Simulation Model 2

First, a simulation result of the relationship between the thickness of an oxide semiconductor layer 462 and the acceleration energy in the case where ions are implanted into the oxide semiconductor layer 462 will be described.

In FIG. 33, a stacked structure of the base film 420, the oxide semiconductor layer 444, the gate insulating layer 450, and the oxide semiconductor layer 462 in a line C1-C2 was used as a simulation model. In this simulation model, conditions were set as follows.

Figure 37:
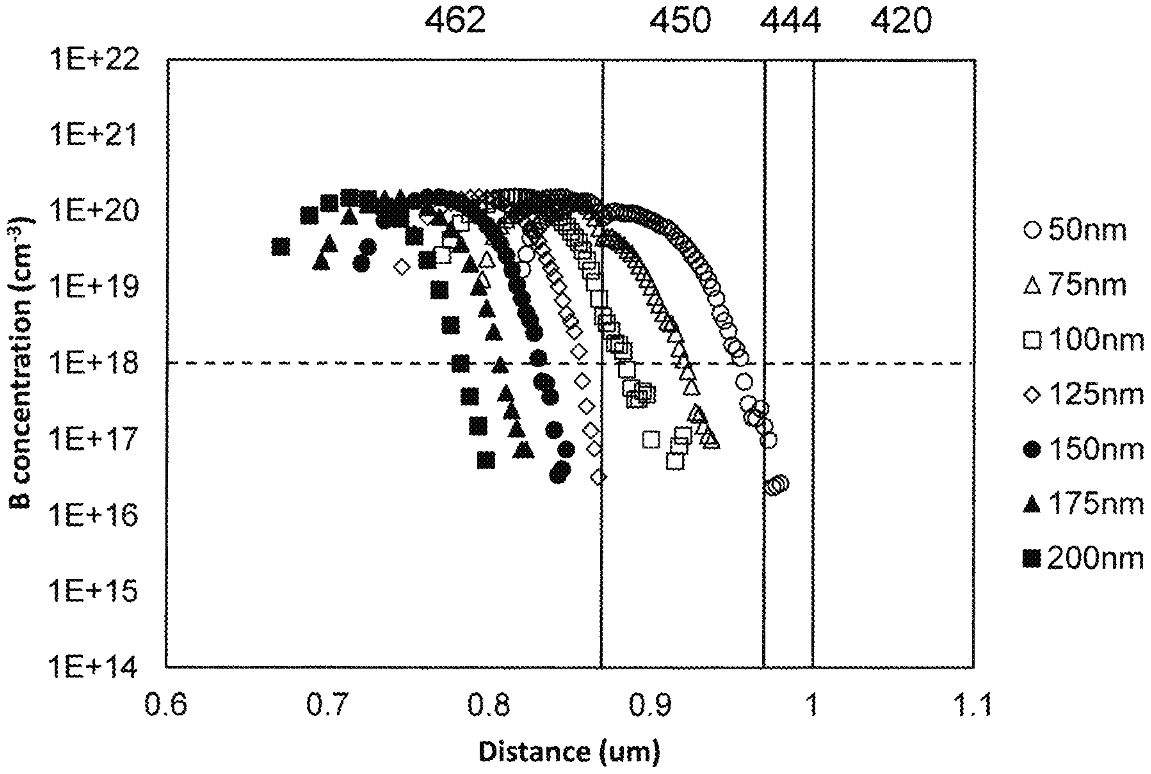
FIG. 37 shows a simulation result when boron is ion-implanted at an acceleration energy of 20 keV with respect to 100 nm thicknesses of a gate insulating layer.
Figure 38:
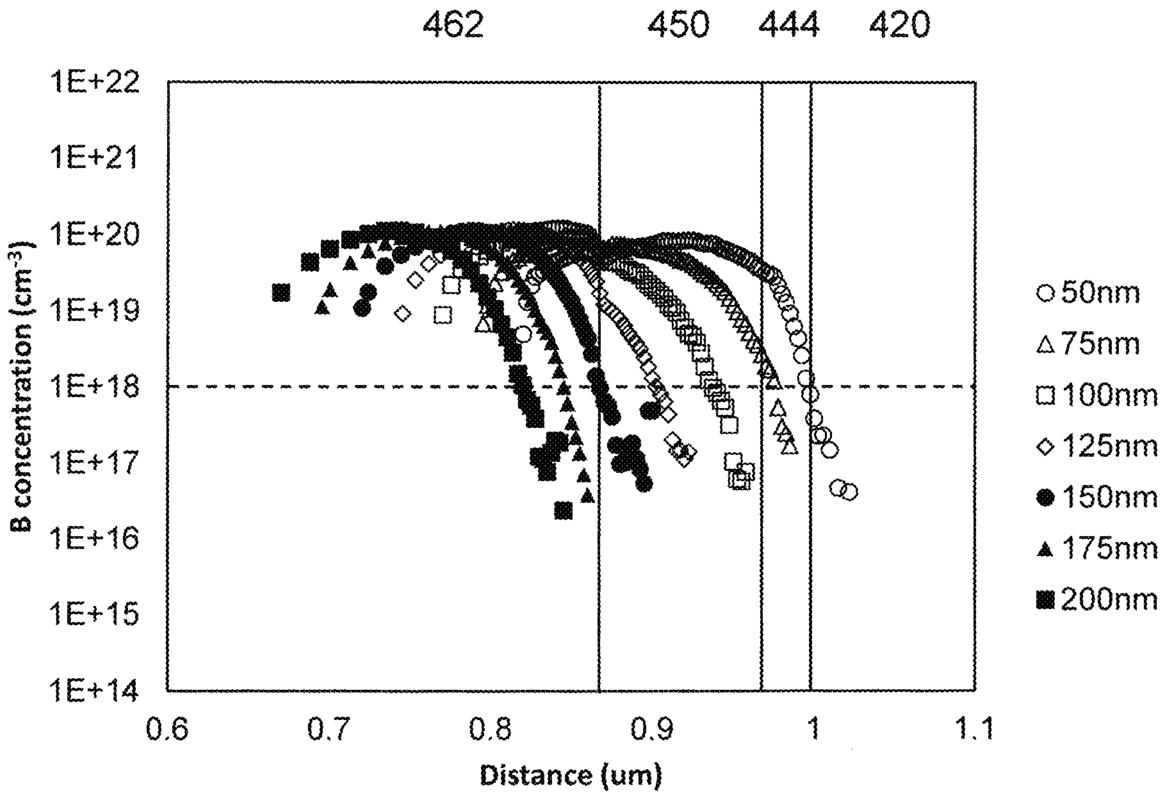
FIG. 38 shows a simulation result when boron is ion-implanted at an acceleration energy of 30 keV with respect to 100 nm thicknesses of a gate insulating layer.
Figure 39:
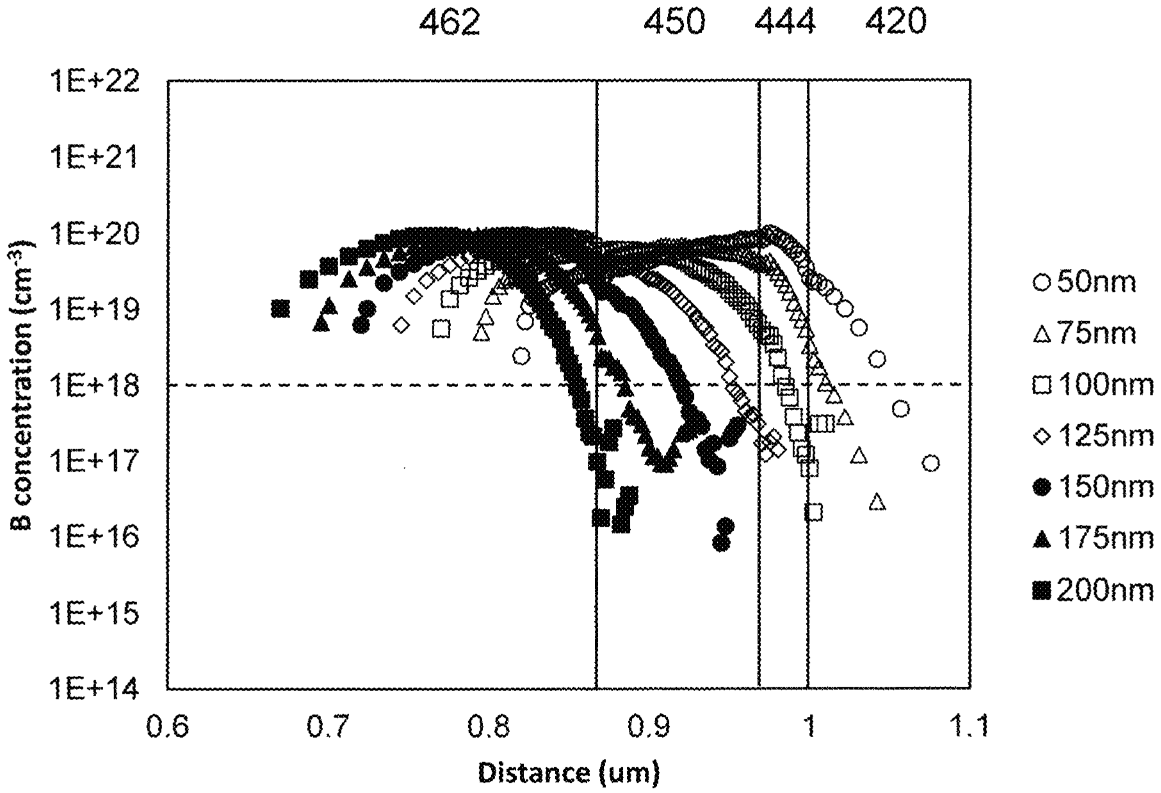
FIG. 39 shows a simulation result when boron is ion-implanted at an acceleration energy of 40 keV with respect to 100 nm thicknesses of a gate insulating layer.

Base film: silicon oxide layer (100 nm)
Oxide semiconductor layer: IGZO (30 nm)
Gate insulating layer: silicon oxide layer (100 nm)
Oxide conductive layer: IGZO (50 nm, 75 nm, 100 nm, 125 nm, 150 nm, 175 nm, 200 nm)
Ion species: Boron (B)
Acceleration energy: 20 keV, 30 keV, 40 keV
Dose amount of ion: $1\times10^{15}$ $cm^{-2}$ The simulation results are described below. FIG. 37 shows a simulation result when boron (B) is ion-implanted at an acceleration energy of 20 keV with respect to 100 nm thicknesses of the gate insulating layer 450. FIG. 38 shows a simulation result when boron (B) is ion-implanted at an acceleration energy of 30 keV with respect to 100 nm thicknesses of the gate insulating layer 450. FIG. 39 shows a simulation result when boron (B) is ion-implanted at an acceleration energy of 40 keV with respect to 100 nm thicknesses of the gate insulating layer 450.

In the simulation results of FIG. 37 to FIG. 39, the horizontal axis represents the distance (μm), and the vertical axis represents the B concentration ($cm^{-3}$). FIG. 37 to FIG. 39 show the results when boron (B) is ion-implanted at the acceleration energy of 20 keV, 30 keV, and 40 keV.

In the following simulation results, considering the characteristics of the transistor, it is preferable that the boron (B) concentration is $1\times10^{18}$ $cm^{-3}$ or more at an interface between the oxide semiconductor layer 462 and the gate insulating layer 450. In addition, it is preferable that the boron (B) concentration is less than $1\times10^{18}$ $cm^{-3}$ at an interface between the gate insulating layer 450 and the oxide semiconductor layer 444. The relationship between the thickness of the gate insulating layer satisfying such conditions, the thickness of the oxide semiconductor layer 462, and the acceleration energy was verified.

As shown in FIG. 37, in the case where the thickness of the gate insulating layer 450 is 100 nm and the acceleration energy is 20 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 is 50 nm, nm, and 100 nm, and the boron (B) concentration was less than $1\times10^{18}$ $cm^{-3}$ at the interface between the gate insulating layer 450 and the oxide semiconductor layer 444. That is, in the case where the thickness of the oxide semiconductor layer 462 is 125 nm or more, resistance of the oxide semiconductor layer 462 cannot be sufficiently reduced.

In addition, as shown in FIG. 38, in the case where the thickness of the gate insulating layer is 100 nm and the acceleration energy is 30 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 is 100 nm, 125 nm, and 150 nm, and the boron (B) concentration was less than $1\times10^{18}$ $cm^{-3}$ at the interface between the gate insulating layer 450 and the oxide semiconductor layer 444. That is, in the case where the thickness of the oxide semiconductor layer 462 is 175 nm or more, the resistance of the oxide semiconductor layer 462 cannot be sufficiently reduced. In addition, in the case where the thickness of the oxide semiconductor layer 462 is 75 nm or less, impurities may be added to the channel area.

In addition, as shown in FIG. 39, in the case where the thickness of the gate insulating layer is 100 nm and the acceleration energy is 40 keV, the boron (B) concentration is $1\times10^{18}$ $cm^{-3}$ or more at the interface between the oxide semiconductor layer 462 and the gate insulating layer 450 in the case where the thickness of the oxide semiconductor layer 462 is 125 nm, 150 nm, and 175 nm, and the concentration of boron (B) was $1\times10^{18}$ $cm^{-3}$ or less at the interface between the gate insulating layer 450 and the oxide semiconductor layer 444. That is, in the case where the thickness of the oxide semiconductor layer 462 is 200 nm or more, the resistance of the oxide semiconductor layer 462 cannot be sufficiently reduced. In addition, in the case where the thickness of the oxide semiconductor layer 462 is 100 nm or less, impurities may be added to the channel area.

Figure 40:
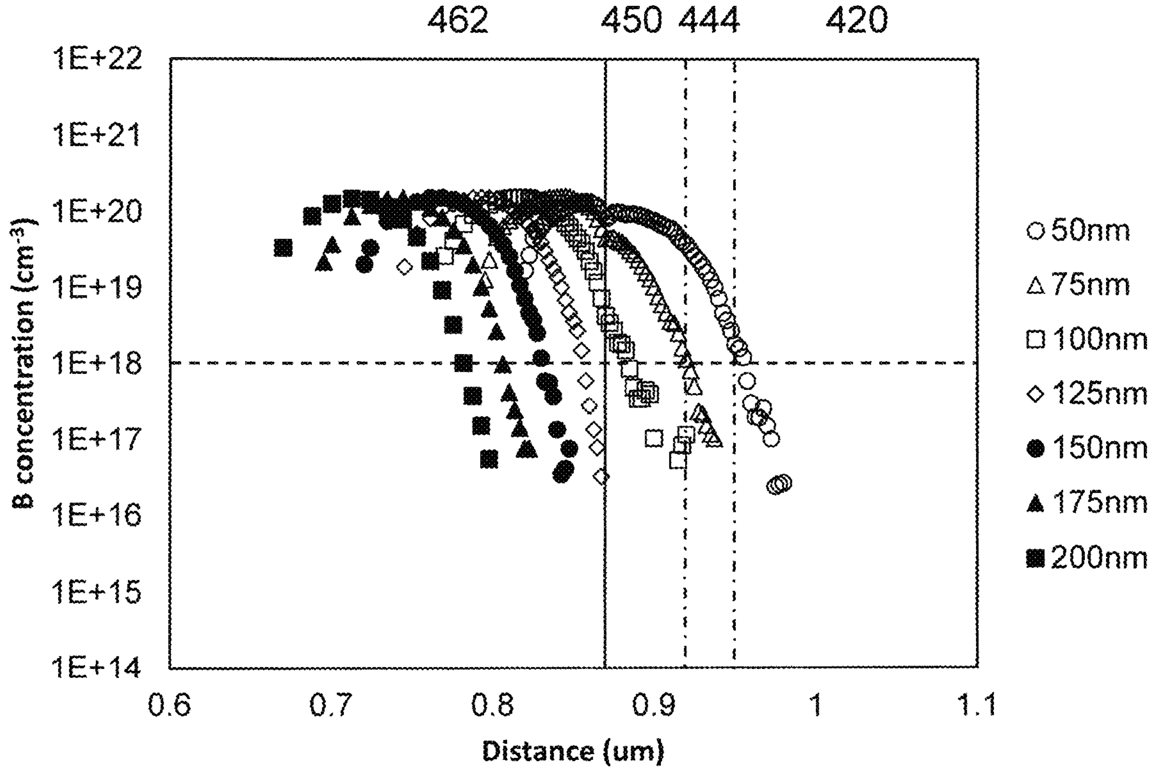
FIG. 40 shows a simulation result when boron is ion-implanted at an acceleration energy of 20 keV with respect to 50 nm thicknesses of a gate insulating layer.
Figure 41:
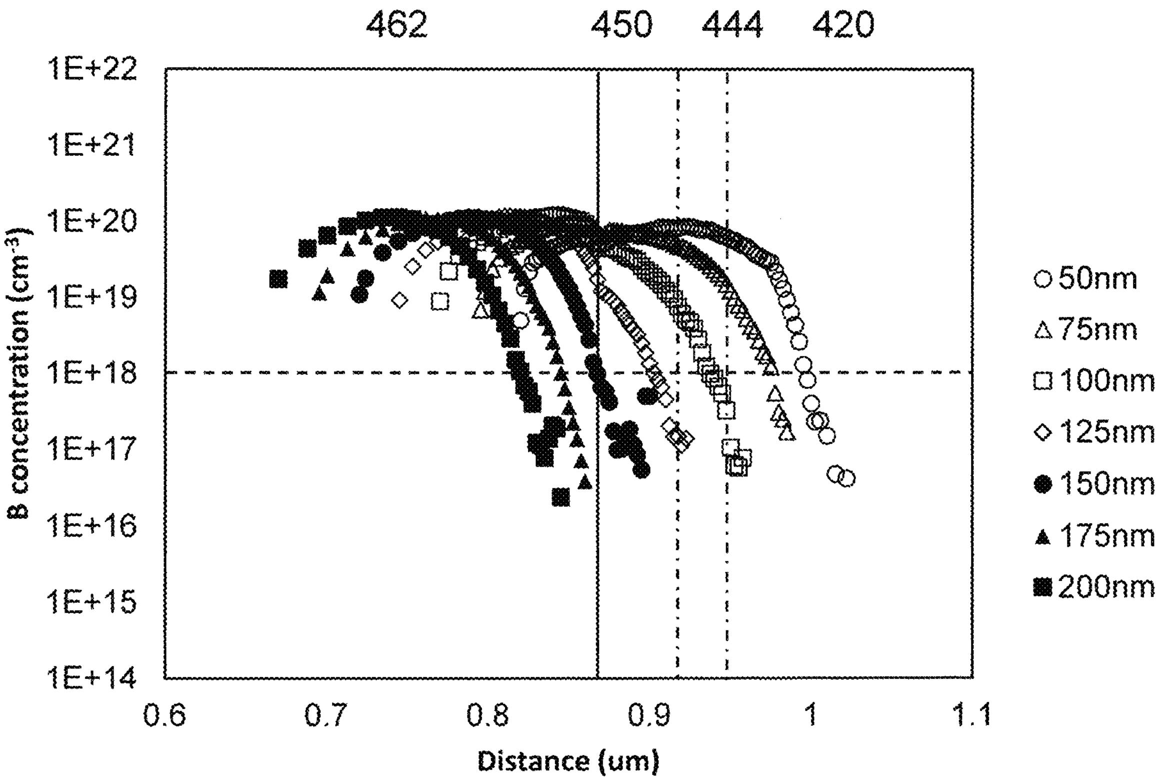
FIG. 41 shows a simulation result when boron is ion-implanted at an acceleration energy of 30 keV with respect to 50 nm thicknesses of a gate insulating layer.
Figure 42:
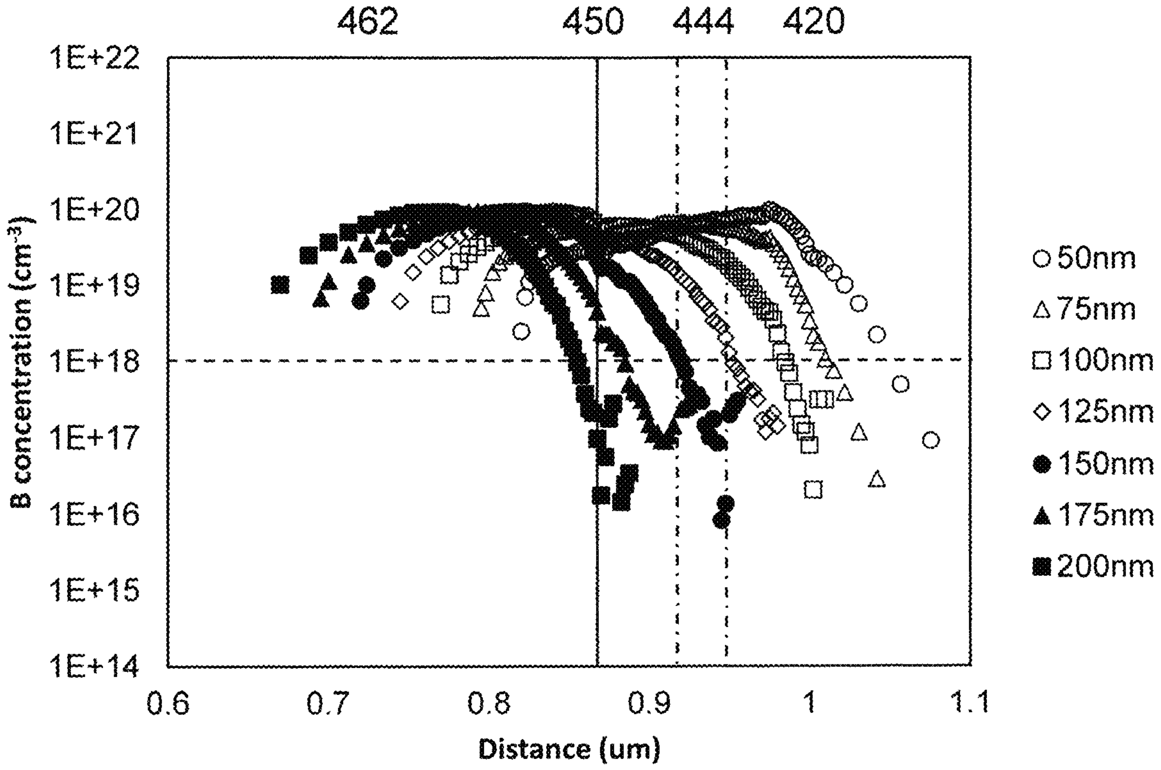
FIG. 42 shows a simulation result when boron is ion-implanted at an acceleration energy of 40 keV with respect to 50 nm thicknesses of a gate insulating layer.

In addition, the case where the thickness of the gate insulating layer is 50 nm or more can be predicted from the results of FIG. 37 to FIG. 39. The interface between the gate insulating layer 450 and the oxide semiconductor layer 444 and the interface between the oxide semiconductor layer 444 and the base film 420 were estimated based on the results of FIG. 37 to FIG. 39. In FIG. 40 to FIG. 42, the interface between the gate insulating layer 450 and the oxide semiconductor layer 444 and the interface between the oxide semiconductor layer 444 and the base film 420 are represented by dashed-dotted lines.

The simulation results are described below. FIG. 40 shows a simulation result when boron (B) is ion-implanted at an acceleration energy of 20 keV with respect to 50 nm thicknesses of the gate insulating layer 450. FIG. 41 shows a simulation result when boron (B) is ion-implanted at an acceleration energy of 30 keV with respect to 50 nm thicknesses of the gate insulating layer 450. FIG. 42 shows a simulation result when boron (B) is ion-implanted at an acceleration energy of 40 keV with respect to 50 nm thicknesses of the gate insulating layer 450.

In the simulations of FIG. 40 to FIG. 42, the horizontal axis represents the distance (μm), and the vertical axis represents the B concentration ($cm^{-3}$). FIG. 40 to FIG. 42 show results when boron (B) is ion-implanted at the acceleration energy of 20 keV, 30 keV, and 40 keV.

As shown in FIG. 40, in the case where the thickness of the gate insulating layer is 50 nm and the acceleration energy is 20 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 was 100 nm, and the boron (B) concentration was $1\times10^{18}$ $cm^{-3}$ or less at the interface between the gate insulating layer 450 and the oxide semiconductor layer 444. That is, in the case where the thickness of the oxide semiconductor layer 462 is 125 nm or more, the resistance of the oxide semiconductor layer 462 cannot be sufficiently reduced. In addition, in the case where the thickness of the oxide semiconductor layer 462 is 75 nm or less, impurities may be added to the channel area.

In addition, as shown in FIG. 41, in the case where the thickness of the gate insulating layer is 50 nm and the acceleration energy is 30 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 is 125 nm and 150 nm, and the boron (B) concentration was less than $1\times10^{18}$ $cm^{-3}$ at the interface between the gate insulating layer 450 and the oxide semiconductor layer 444. That is, in the case where the thickness of the oxide semiconductor layer 462 is 175 nm or more, the resistance of the oxide semiconductor layer 462 cannot be sufficiently reduced. In addition, in the case where the thickness of the oxide semiconductor layer 462 is 100 nm value or less, impurities may be added to the channel area.

In addition, as shown in FIG. 42, in the case where the thickness of the gate insulating layer is 50 nm and the acceleration energy is 40 keV, the boron (B) concentration was $1\times10^{18}$ $cm^{-3}$ or more at the interface between the oxide semiconductor layer 462 and the gate insulating layer 450, and the boron (B) concentration was less than $1\times10^{18}$ $cm^{-3}$ at the interface between the gate insulating layer 450 and the oxide semiconductor layer 444 in the case where the thickness of the oxide semiconductor layer 462 is 175 nm. That is, in the case where the thickness of the oxide semiconductor layer 462 is 200 nm or more, the resistance of the oxide semiconductor layer 462 cannot be sufficiently reduced. In addition, in the case where the thickness of the oxide semiconductor layer 462 is 150 nm or more, impurities may be added to the channel area.

Simulation Model 3

First, a simulation result of the relationship between the thickness of the oxide semiconductor layer 462 and the acceleration energy in the case where ions are implanted into the oxide semiconductor layer 462 will be described.

The model diagram of the simulation is similar to that of FIG. 37. In this simulation model, conditions were set as follows.

Figure 43:
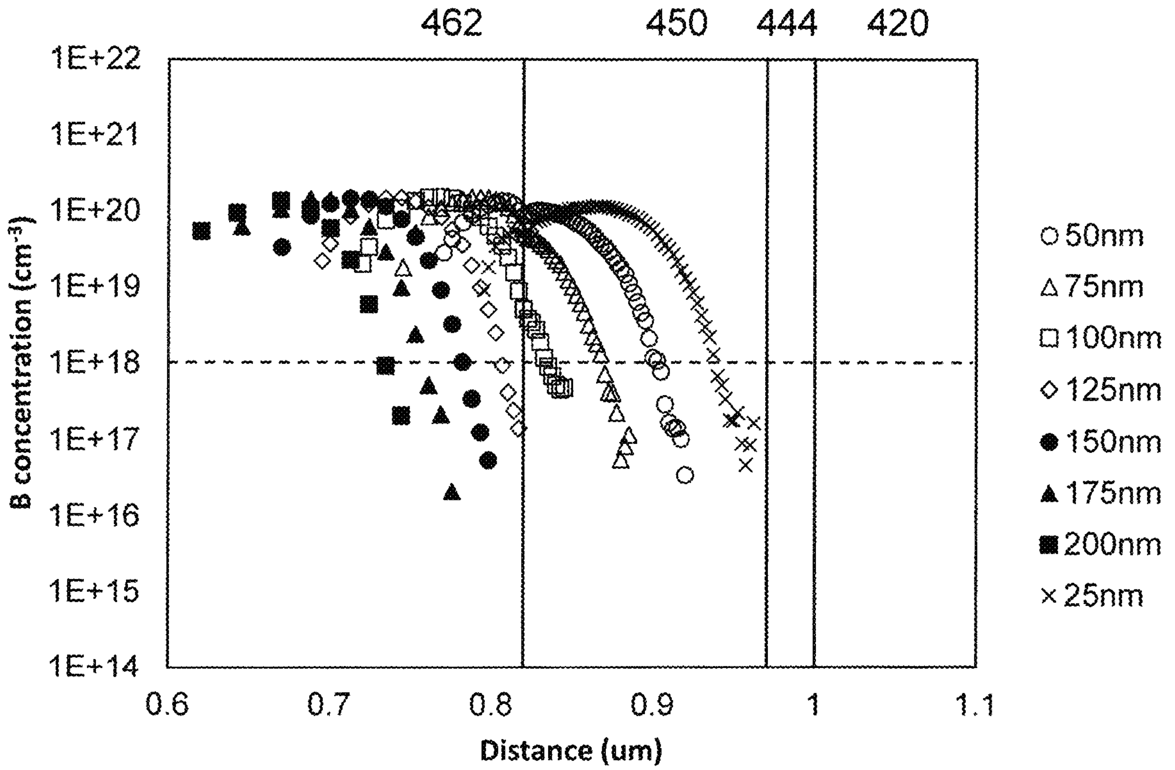
FIG. 43 shows a simulation result when boron is ion-implanted at an acceleration energy of 20 keV with respect to 150 nm thicknesses of a gate insulating layer.
Figure 44:
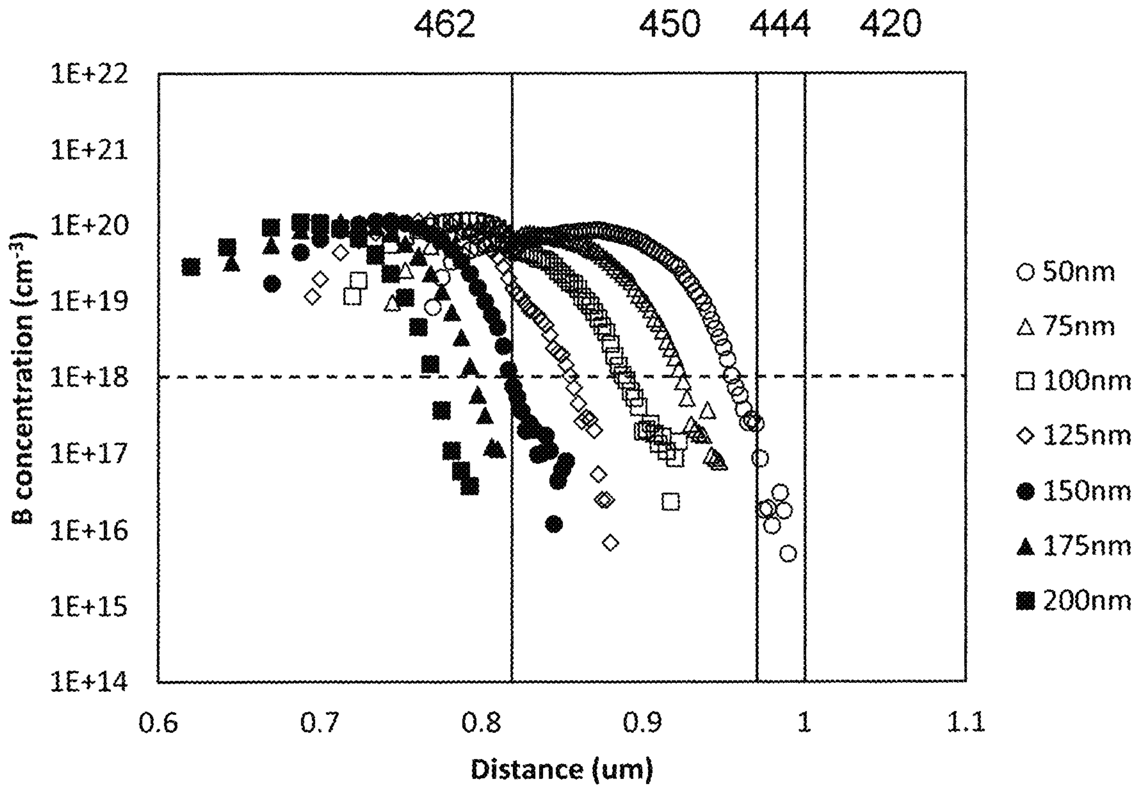
FIG. 44 shows a simulation result when boron is ion-implanted at an acceleration energy of 30 keV with respect to 150 nm thicknesses of a gate insulating layer.
Figure 45:
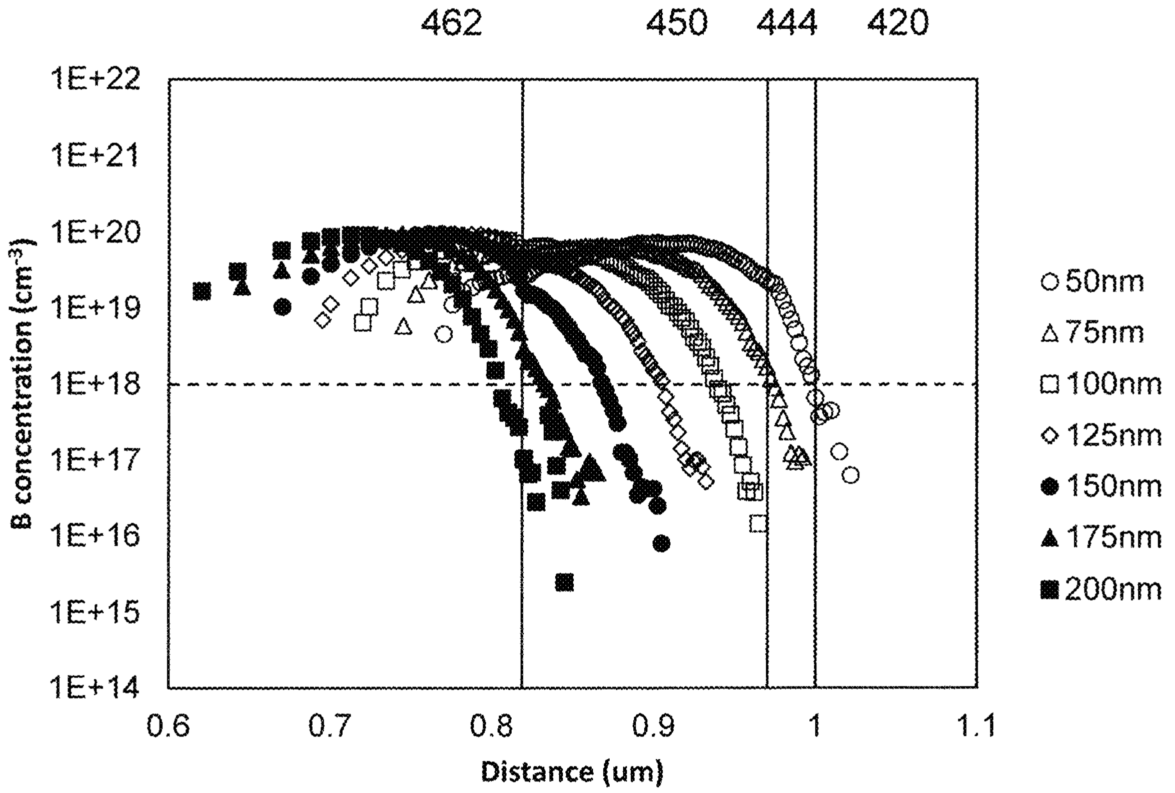
FIG. 45 shows a simulation result when boron is ion-implanted at an acceleration energy of 40 keV with respect to 150 nm thicknesses of a gate insulating layer.

Insulating layer: silicon oxide layer (100 nm)
Oxide semiconductor Layer: IGZO (30 nm)
Gate insulating layer: silicon oxide layer (150 nm)
The oxide semiconductor layer 462: IGZO (50 nm, 75 nm, 100 nm, 125 nm, 150 nm, 175 nm, 200 nm)
Ion species: Boron (B)
Acceleration energy: 20 keV, 30 keV, 40 keV
Dose amount of ions: $1\times10^{15}$ $cm^{-2}$ The simulation results are described below. FIG. 43 shows a simulation result when boron (B) is ion-implanted at an acceleration energy of 20 keV with respect to 150 nm thicknesses of the gate insulating layer 450. FIG. 44 shows a simulation result when boron (B) is ion-implanted at an acceleration energy of 30 keV with respect to 150 nm thicknesses of the gate insulating layer 450. FIG. 45 shows a simulation result when boron (B) is ion-implanted at an acceleration energy of 40 keV with respect to 150 nm thicknesses of the gate insulating layer 450.

In the simulation results of FIG. 43 to FIG. 45, the horizontal axis represents the distance (pm), and the vertical axis represents the B concentration ($cm^{-3}$). FIG. 43 to FIG. 45 show the results when boron (B) is ion-implanted at the acceleration energy of 20 keV, 30 keV, and 40 keV.

As shown in FIG. 43, in the case where the thickness of the gate insulating layer is 150 nm and the acceleration energy is 20 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 is 25 nm, 50 nm, 75 nm, and 100 nm, and the boron (B) concentration is less than $1\times10^{18}$ $cm^{-3}$ at the interface between the gate insulating layer 150 and the oxide semiconductor layer 444. That is, in the case where the thickness of the oxide semiconductor layer 462 is 125 nm or more, the resistance of the oxide semiconductor layer 462 cannot be sufficiently reduced.

In addition, as shown in FIG. 44, in the case where the thickness of the gate insulating layer is 150 nm and the acceleration energy is 30 keV, the boron (B) concentration was $1\times10^{18}$ $cm^{-3}$ or more the interface between the oxide semiconductor layer 462 and the gate insulating layer 450 in the case where the thickness of the oxide semiconductor layer 462 is 50 nm, 75 nm, 100 nm, 125 nm, and 150 nm, and the boron (B) concentration was less than $1\times10^{18}$ $cm^{-3}$ at the interface between the gate insulating layer 450 and the oxide semiconductor layer 444. That is, in the case where the thickness of the oxide semiconductor layer 462 is 175 nm or more, the resistance of the oxide semiconductor layer 462 cannot be sufficiently reduced.

In addition, as shown in FIG. 45, in the case where the thickness of the gate insulating layer is 150 nm and the acceleration energy is 40 keV, the boron (B) concentration was $1\times10^{18}$ $cm^{-3}$ or more at the interface between the oxide semiconductor layer 462 and the gate insulating layer 450 in the case where the thickness of the oxide semiconductor layer 462 is 100 nm, 125 nm, 150 nm, and 175 nm, and the boron (B) concentration was less than $1\times10^{18}$ $cm^{-3}$ at the interface between the gate insulating layer 450 and the oxide semiconductor layer 444. That is, in the case where the thickness of the oxide semiconductor layer 462 is 200 nm or more, the resistance of the oxide semiconductor layer 462 cannot be sufficiently reduced. In addition, in the case where the thickness of the oxide semiconductor layer 462 is 75 nm or less, impurities may be added to the channel area.

Table 1 shows the results of the above simulation results. The results are the thickness of the oxide semiconductor layer so that the concentration of the impurity element contained in the oxide conductive layer, the source area, and the drain area is $1\times10^{18}$ $cm^{-3}$ or more and the concentration of the impurity element contained in the channel area is less than $1\times10^{18}$ $cm^{-3}$. In addition, in the case where the gate insulating layer is 150 nm, even if ion-implantation is performed at the acceleration energy of 20 keV, the impurity element concentration of the oxide semiconductor layer 444 is less than $1\times10^{18}$ $cm^{-3}$, and therefore, the result is excluded from Table 1.

TABLE 1

| | | Acceleration energy | | |
|---|---|---|---|---|
| | | 20 keV | 30 keV | 40 keV |
| Thickness of gate insulating layer | 50 nm | 100 nm | 125-150 nm | 175 nm |
| | 100 nm | 50-100 nm | 100-150 nm | 125-175 nm |
| | 150 nm | — | 50-150 nm | 100-175 nm |

The thickness of the gate insulating layer, the thickness of the gate electrode, and the range of the acceleration energy set in the above-described simulations are not limited to only between the minimum value and the maximum value. For example, in the case where the thickness of the gate insulating layer is less than 50 nm, the control of the acceleration energy needs to be detailed, and in the case where the thickness of the gate insulating layer exceeds 150 nm, the control of the acceleration energy may be easy. In addition, in the case where the thickness of the gate electrode is less than 50 nm, the acceleration energy should naturally be low, and in the case where the thickness of the gate electrode exceeds 175 nm, the acceleration energy should conversely be high. That is, it is naturally included in the scope of the idea of the present invention to extrapolate the tendency outside the above-described condition range to give an optimum value as appropriate regardless of the range of the above-described simulation results.

Each of the embodiments and modifications described above as an embodiment and modifications of the present invention can be appropriately combined and implemented as long as no contradiction is caused. Furthermore, the addition, deletion, or design change of components, or the addition, deletion, or condition change of process as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A semiconductor device comprising:

an oxide semiconductor layer provided on an insulating surface and having a channel area, a source area and a drain area sandwiching the channel area;

a gate electrode opposite the channel area; and a gate insulating layer provided between the oxide semiconductor layer and the gate electrode, wherein a bottom surface of the gate electrode is in contact with the gate insulating layer, the gate electrode is an oxide conductive layer made of the same material and having the same composition as the oxide semiconductor layer, the oxide conductive layer, the source area, and the drain area include a same impurity element, and the oxide semiconductor layer and the oxide conductive layer have a polycrystalline structure.

2. The semiconductor device according to claim 1, wherein a concentration of the impurity element in the source area and drain area is $1\times10^{18}$ $cm^{-3}$ or more and $1\times10^{21}$ $cm^{-3}$ or less as measured by SIMS analysis (secondary ion mass spectrometry).

3. The semiconductor device according to claim 1, wherein the concentration of the impurity element in the oxide conductive layer is between $1\times10^{18}$ $cm^{-3}$ or more and $1\times10^{21}$ $cm^{-3}$ or less as measured by SIMS analysis (secondary ion mass spectrometry).

4. The semiconductor device according to claim 1, wherein the thickness of the oxide semiconductor layer is 50 nm or more and 150 nm or less.

5. The semiconductor device according to claim 1, wherein the thickness of the gate insulating layer is between 50 nm or more and 150 nm or less.

6. The semiconductor device according to claim 1, further comprising:

a metal oxide layer, wherein the metal oxide layer includes aluminum, and the metal oxide layer is provided above the insulating surface and in contact with the lower surface of the oxide semiconductor layer.

7. The semiconductor device according to claim 6, wherein the thickness of the metal oxide layer is between 1 nm or more and 20 nm or less.

8. The semiconductor device according to claim 6, wherein the metal oxide layer has barrier properties against oxygen and hydrogen.

* * * * *